United States Patent [19]

Kamegawa et al.

[11] Patent Number: 5,710,718
[45] Date of Patent: *Jan. 20, 1998

[54] METHOD OF DESIGNING A PNEUMATIC TIRE TO ACHIEVE A BEST MODE UNDER GIVEN CONDITIONS

[75] Inventors: Tatsuhiko Kamegawa, Kodaira; Yukio Nakajima, Akigawa; Akihiko Abe, Kodaira, all of Japan

[73] Assignee: Bridgestone Corporation, Tokyo, Japan

[*] Notice: The term of this patent shall not extend beyond the expiration date of Pat. No. 5,559,729.

[21] Appl. No.: 302,841

[22] PCT Filed: Jan. 27, 1994

[86] PCT No.: PCT/JP94/00110

§ 371 Date: Sep. 16, 1994

§ 102(e) Date: Sep. 16, 1994

[87] PCT Pub. No.: WO94/16877

PCT Pub. Date: Aug. 4, 1994

[30] Foreign Application Priority Data

Jan. 27, 1993 [JP] Japan .................. 5-011669

[51] Int. Cl.⁶ .................. G06F 15/00; B60C 3/04
[52] U.S. Cl. .................. 364/512; 364/578; 364/570; 152/450; 152/454
[58] Field of Search .................. 364/512, 578, 364/560, 562; 73/146; 152/454, 526, 532, 538–543, 548, 559, DIG. 19, 375, 209 R, 314, 316–322, 517, 209 A, 209 D, 546, 552, 554, 455, 456, 510, 556, 560; 244/130, 103 R

[56] References Cited

U.S. PATENT DOCUMENTS

| | | | |
|---|---|---|---|
| 4,282,918 | 8/1981 | Tomoda et al. | 152/353 |
| 4,341,249 | 7/1982 | Welter | 152/330 RF |
| 4,564,737 | 1/1986 | Burke et al. | 219/121.68 |
| 4,614,562 | 9/1986 | Jones | 156/420 |
| 4,667,722 | 5/1987 | Klepper et al. | 152/543 |
| 4,785,861 | 11/1988 | Fujiwara | 152/209 R |
| 4,813,467 | 3/1989 | Hinkel et al. | 152/454 |

(List continued on next page.)

FOREIGN PATENT DOCUMENTS

| | | |
|---|---|---|
| U-1-87003 | 6/1989 | Japan . |
| A-3-189205 | 8/1991 | Japan . |
| WO 94/16877 | 4/1994 | WIPO . |

OTHER PUBLICATIONS

"Die Querschnittsform von Kreuzlagen und Gurtelreifen", F. Frank, et al., *Kunststoff Technik International*, Jan. 1972, pp. 23–30.

"Analysis in handling studies, development and selection of vehicle tyres", Prof. RS Sharpe, *Automotive Engineer*, Feb. 1992, No. 17, pp. 42–43.

"Jetzt kommen die ersten R–COT Reifen in den Handel", *Gummibereifung*, Jun. 1986, No. 6, pp. 69–70.

*Primary Examiner*—Jacques Louis-Jacques
*Attorney, Agent, or Firm*—Oliff & Berridge

[57] ABSTRACT

A method of designing a pneumatic tire, wherein a basic model of a tire representing a cross-sectional shape of the tire including an internal structure, an objective function representing a physical amount for evaluating tire performance, a design variable for determining the cross-sectional shape of the tire, and a constraint for constraining the cross-sectional shape of the tire are determined. A corrected model of the tire with the design variable changed by a unit amount $\theta r_i$ is determined. The value of the objective function and the value of the constraint in the corrected model are calculated. A sensitivity is calculated for each design variable, and an estimated value of the amount of change of the design variable which maximizes the value of the objective function while taking the constraint is calculated by means of the sensitivities. The above process is repeated until the value of the objective function converges. The configuration of the tire is determined on the basis of the design variable when the value of the objective function has converged to the estimated value.

13 Claims, 45 Drawing Sheets

U.S. PATENT DOCUMENTS

| | | | |
|---|---|---|---|
| 4,840,210 | 6/1989 | Kukimoto | 152/209 A |
| 4,840,213 | 6/1989 | Koseki | 152/454 |
| 5,042,546 | 8/1991 | Forney et al. | 152/454 |
| 5,056,575 | 10/1991 | Yamaguchi et al. | 152/541 |
| 5,151,142 | 9/1992 | Imai et al. | 152/565 |
| 5,263,526 | 11/1993 | Oare et al. | 152/540 |
| 5,295,087 | 3/1994 | Yoshida et al. | 364/578 |
| 5,318,085 | 6/1994 | Vekselman | 152/209 R |
| 5,327,952 | 7/1994 | Glover et al. | 152/209 R |
| 5,392,830 | 2/1995 | Janello et al. | 152/543 |
| 5,427,176 | 6/1995 | Hayashi et al. | 152/517 |
| 5,433,257 | 7/1995 | Yamaguchi et al. | 152/454 |
| 5,435,365 | 7/1995 | Tanaka | 152/209 R |
| 5,464,051 | 11/1995 | Beard et al. | 152/454 |
| 5,485,406 | 1/1996 | Wada et al. | 364/560 |
| 5,559,729 | 9/1996 | Abe | 364/578 |

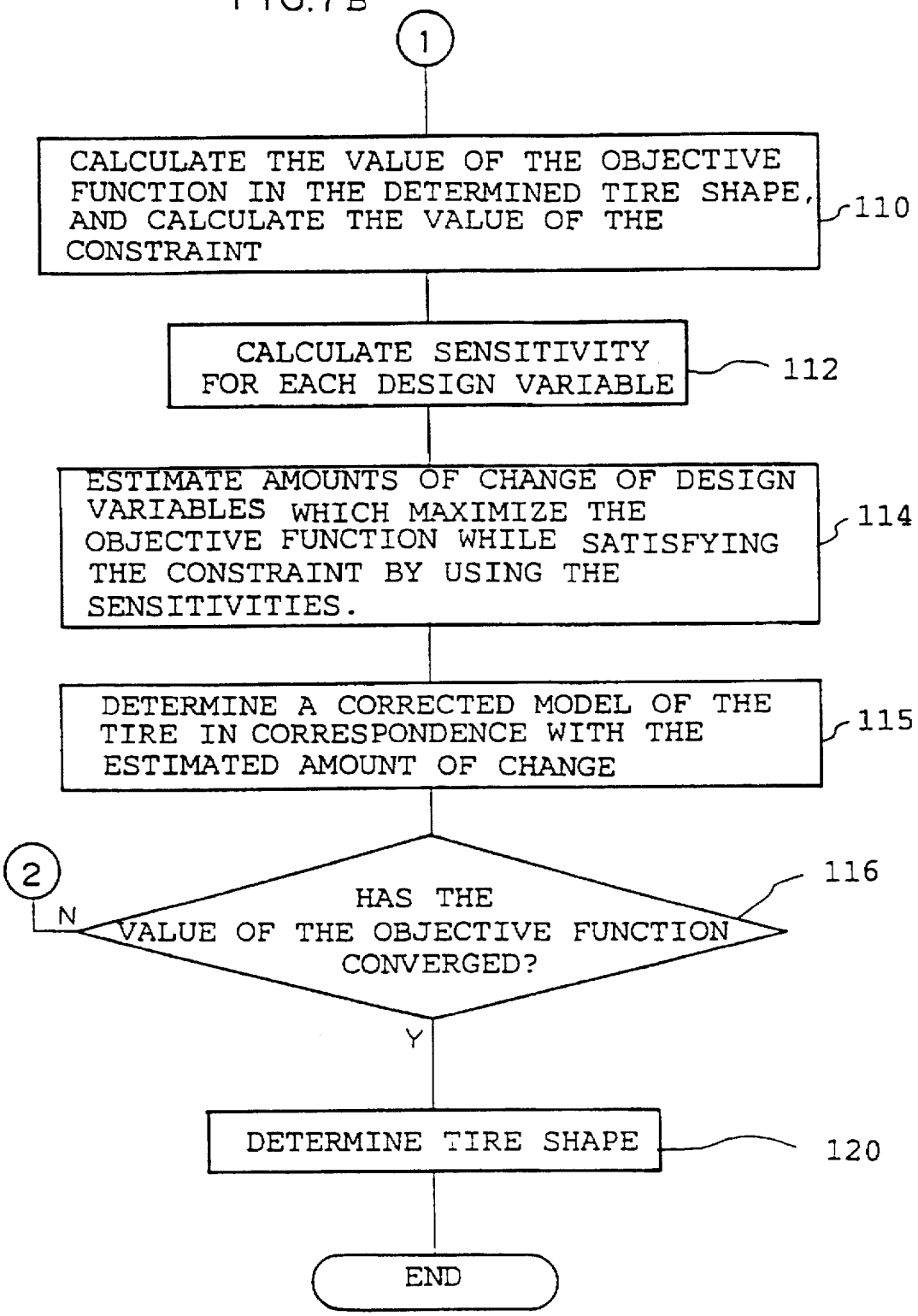

r-z COORDINATES $\xi_1$-$\eta_1$ COORDINATES $\xi_2 - \eta_2$ COORDINATES

32

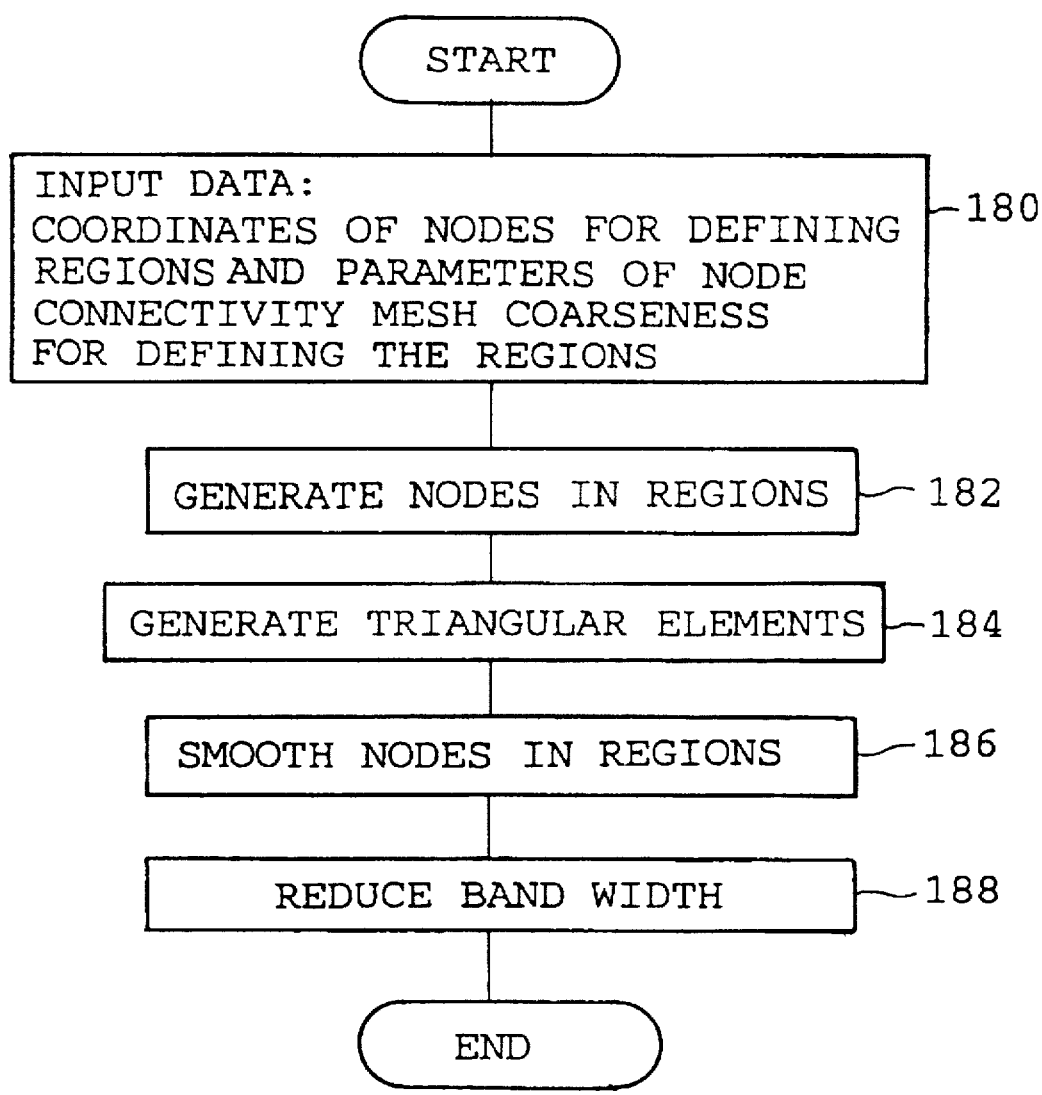

DEGREE OF LAGRANGE INTERPOLATION:
CUBIC IN x- and y- DIRECTIONS

VB = (1 0 1 1 0 0 1 1 0 0 1 1 1 1 1 1 1 0 0 1)

5,710,718

METHOD OF DESIGNING A PNEUMATIC TIRE TO ACHIEVE A BEST MODE UNDER GIVEN CONDITIONS

This application is a 371 of PCT/JP94/00110 filed Jan. 27, 1994.

TECHNICAL FIELD

The present invention relates to a method of designing a pneumatic tire, and more particularly to a method of designing a pneumatic tire which makes it possible to efficiently and easily design and develop the structure, shape and the like of a tire for attaining the single-purpose performance, mutually incompatible performances and the like of the tire, as well as to determine the best structure and shape of the tire and design a tire having high cost performance.

BACKGROUND ART

Conventional methods of designing a tire have been based on experiential rules obtained through repeated numerical experiments using experiments and computers. For this reason, the number of trial manufactures and tests required for development has been enormously large, resulting in increased development cost and making it impossible to readily reduce a development period.

(1) Background Art Concerning the Design of a Tire Carcass Configuration

In general, methods of designing a tire carcass configuration are broadly classified into the following two design methods. Presently most tires are designed, developed, and marketed in accordance with either one of the two methods.

One method of designing a tire carcass configuration is called a natural equilibrated configuration design method, in which the cross-sectional shape of a carcass (a cross-sectional shape of a tire cut in a plane including the rotational axis of the tire) is determined in such a manner that tension in tire carcass cords becomes constant particularly when the tire is fitted onto a rim and is inflated with air so as to bring the internal pressure of the tire to a standard level of internal pressure. Namely, the cross-sectional shape of the carcass at a time when the tire is vulcanized and cured in a mold is made substantially identical to the cross-sectional shape of the carcass which is under the standard internal pressure, so as to prevent the occurrence of a failure due to internal strains or the like occurring locally between laminates or in laminated layers of various reinforcing layers of the tire when the tire is inflated with air.

The other method is called a non-natural equilibrated configuration design method. As a typical method of designing a non-natural equilibrated configuration, a designing method is known which has already been marketed under a trade mark called "R COT" proposed earlier by the present applicant and has been commercially successful. Unlike the above-mentioned method of designing a natural equilibrated configuration, this method of designing a non-natural equilibrated configuration is a designing method which, conversely, controls the tension of the carcass. By making use of the force which tends to shift to a balanced shape owing to inflation with air, the tension is locally controlled so as to obtain a predetermined performance.

(2) Background Art Concerning the Design of the Configuration of a Tire Crown Portion The configuration of the tire crown portion is designed by a number of circular arcs in a cross section including the rotational axis of the tire. Conventional methods of determining values of the circular arcs include, among others, (1) a method of determining the same on the basis of the values of the circular arcs and a data base on tire performance; (2) a method wherein a number of molds are fabricated, and the determination is made from data on the trial manufacture and evaluation of a tire fabricated by the molds; and (3) a method wherein the determination is made by conducting numerical experiments a large number of times.

(3) Background Art Concerning the Design of a Belt Structure

The belt structure is determined by the belt width, the belt angle, the type of cord, the placement density, and the gauge distribution of the inter-belt rubber. Methods of designing a belt structure include, among others, (1) a method wherein the strain at a belt end is measured through experiments and numerical experiments; (2) a method wherein the rigidity of the overall belt is measured; and (3) a method wherein the belt structure is altered, and indoor evaluations and actual-vehicle evaluations are carried out, so as to extract a draft design. For this reason, there has been the problem that the period of evaluation is long.

(4) Background Art Concerning the Design of a Pattern

Since the pattern design permits a large degree of freedom, in conventional practice, after tires are grooved in accordance with a drafted basic pattern or after a mold is actually fabricated and the tires are trial-manufactured, an actual-vehicle evaluation is made. Problems encountered with the actual vehicle are overcome by fine-correcting the drafted basic pattern before the drafted basic pattern is finished as a final pattern. For this reason, the pattern design has been a field requiring manhour most as compared to the design of the tire configuration and structure.

(5) Background Art Concerning Other Designs

Problems similar to those of the above-described design methods have also been experienced with the gauge distribution of a tire rubber member (a gauge distribution of a bead filler, a gauge distribution of a rubber chafer, a gauge distribution of side rubber, a gauge distribution of tread rubber, a gauge distribution of tread base rubber, a gauge distribution of inner-surface reinforcing rubber, a gauge distribution of belt-end rubber, and a gauge distribution of belt end rubber).

SUMMARY OF THE INVENTION

It has been conventional practice to undertake design and development by trial-manufacturing and testing the tire in accordance with these designing methods and repeating trial manufacture and testing until targeted performance is obtained.

With the design and development of tires using conventional designing methods, a targeted value is set with respect to a certain performance. Design and development are considered to be completed for the present if this targeted value is cleared. In other words, the conventional design and development are not based on a viewpoint of obtaining the best performance with the given resources. In addition, conventional design and development are aimed neither at designing mutually incompatible performances, nor at determining the best shape and structure. Moreover, according to either designing method, development is carried out by repeating trial manufacture and testing on a trial-and-error basis, so that there have been problems in that development is very inefficient and cost performance is high.

Accordingly, it is an object of the present invention to provide a method of designing a pneumatic tire which, when an attempt is made to obtain a certain single performance or mutually incompatible performances, makes it possible to design a best mode for the tire under given conditions, increase efficiency in the design and development of the tire, and remarkably lower the cost performance of the tire.

To attain the above object, the present inventors took note of the fact that an "optimization design technique" which is being used in different fields is possibly applicable to the special field of tires, and conducted studies from various angles, and established that technique specifically as a method of designing a pneumatic tire. Specifically, the method of designing a pneumatic tire in accordance with a first aspect of the present invention comprises the steps of: (a) determining a basic model of a tire representing a cross-sectional shape of the tire including an internal structure, an objective function representing a physical amount for evaluating tire performance, a design variable for determining the cross-sectional shape of the tire or a tire structure, and a constraint for constraining at least one of the cross-sectional shape of the tire, the tire structure, a physical amount for evaluating performance, and a tire size; (b) determining a value of the design variable which gives an optimum value of the objective function while taking the constraint into consideration; and (c) designing the tire on the basis of the design variable which gives the optimum value of the objective function.

The aforementioned step (b) may comprise: estimating an amount of change of the design variable which gives the optimum value of the objective function while taking the constraint into consideration on the basis of a sensitivity of the objective function, which is a ratio of an amount of change of the objective function to an amount of unit change of the design variable, and a sensitivity of the constraint, which is a ratio of an amount of change of the constraint to an amount of unit change of the design variable; calculating a value of the objective function when the design variable is changed by an amount corresponding to the estimated amount and a value of the constraint when the design variable is changed by the amount corresponding to the estimated amount; and determining the value of the design variable which gives the optimum value of the objective function on the basis of the estimated value and the calculated values while taking the constraint into consideration.

In addition, as a result of conducting various studies, the present inventors took note of the fact that the "technique of genetic algorithms" which is being utilized in different fields can be applied to the special field of tires, and the present inventors attempted various studies, and specifically established it as a method of designing a tire. Specifically, step (a) comprises: determining a group subject to selection, consisting of a plurality of basic models of the tire each representing a cross-sectional shape of the tire including an internal structure thereof; and determining, with respect to the basic models of the tire of the group subject to selection, the objective function representing the physical amount for evaluating tire performance, the design variable for determining the cross-sectional shape of the tire or the tire structure, the constraint for constraining at least one of the cross-sectional shape of the tire, the tire structure, the physical amount for evaluating performance, and the tire size, and an fitness function which can be evaluated from the objective function and the constraint; and step (b) comprises: selecting two basic models of the tire from the group subject to selection on the basis of the fitness function; effecting at least one of generating a new basic model of the tire by allowing design variables of the basic models of the tire to cross over each other at a predetermined probability and of generating a new basic model of the tire by changing (mutating) a portion of the design variable of at least one of the basic models of the tire; determining the objective function, the constraint, and the fitness function of the basic model of the tire with the design variable changed, preserving the basic model of the tire and the basic model of the tire with the design variable not changed, the aforementioned process of step (b) being repeated until the basic models of the tire preserved reaches a predetermined number; determining whether a new group consisting of the predetermined number of the preserved basic models of the tire satisfies a predetermined convergence criterion; if the convergence criterion is not satisfied, repeating the foregoing process of step (b) until the group subject to selection satisfies a predetermined convergence criterion by setting the new group as the group subject to selection; and if the predetermined convergence criterion is satisfied, determining the value of the design variable which gives the optimum value of the objective function among the predetermined number of the preserved basic models of the tire while taking the constraint into consideration.

In this step (b), with respect to the basic model of the tire with the design variable changed, the amount of change of the design variable which gives the optimum value of the objective function may be estimated while taking the constraint into consideration on the basis of the sensitivity of the objective function, which is the ratio of the amount of change of the objective function to the amount of unit change of the design variable, and on the basis of the sensitivity of the constraint, which is the ratio of the amount of change of the constraint to the amount of unit change of the design variable, the value of the objective function when the design variable is changed by the amount corresponding to the estimated amount and the value of the constraint when the design variable is changed by the amount corresponding to the estimated amount may be calculated, the fitness function may be determined from the value of the objective function and the value of the constraint, the basic model of the tire and the basic model of the tire with the design variable not changed may be preserved, and the aforementioned process of step (b) may be repeated until the preserved basic models of the tire reaches the predetermined number.

The design variable may include at least one of: a function representing the shape of at least one line selected from a carcass line, a turn-up ply line, a line representing an outer configuration of the tire, a line representing a tire crown portion, and a reinforcing-material line; a variable representing at least one gauge distribution of a tire rubber member selected from a gauge distribution of a bead filler, a gauge distribution of a rubber chafer, a gauge distribution of side rubber, a gauge distribution of tread rubber, a gauge distribution of tread base rubber, a gauge distribution of inner-surface reinforcing rubber, a gauge distribution of inter-belt rubber, and a gauge distribution of belt end rubber; a variable representing at least one structure of a belt portion selected from an angle of each belt layer, a width thereof, a cord type thereof, and a placing density thereof; and a variable representing at least one configuration of a pattern selected from a configuration of a block, a position of a sipe, a number of sipes, and a length of the sipe.

A plurality of lines may be set as the design variable by means of a function representing the shape of at least one line selected from a carcass line, a turn-up ply line, a line representing an outer configuration of the tire, a line representing a tire crown portion, and a reinforcing-material line, and, in order to prevent the plurality of lines from intersecting with each other when the design variable is varied in step (b), a mapping function of a function representing shapes of the lines and a constraint for preventing the lines from intersecting with each other may be determined, and the value of the design variable which gives the optimum value of the objective function while satisfying the constraint may be determined by executing step (b) in a space mapped by the mapping function.

In step (a) of the present invention, a basic model of a tire representing a cross-sectional shape of the tire including an internal structure, an objective function representing a physical amount for evaluating tire performance, a design variable for determining the cross-sectional shape of the tire or a tire structure, and a constraint for constraining the cross-sectional shape of the tire or the tire structure are determined. In addition to a line representing the outer configuration of the tire, this basic model of the tire may include a line representing the configuration of a tire crown, a belt line representing a belt in the interior of the tire, a carcass line representing the carcass of the tire, a turn-up ply line representing a turn-up line of the carcass ply in the interior of the tire, and a reinforcing-material line representing a line of each of various reinforcing materials, the gauge distribution of a tire rubber member, the angle, width, cord type, and placement density of each belt layer representing the structure of the belt portion, as well as the configuration of a block, the position of a sipe, the number of sipes, and the length of the sipe which represent the configuration of the pattern. In addition, a technique called the finite element method or an analytical technique may be used for the basic model of the tire for dividing the basic model of the tire into a plurality of elements. As the objective function representing a physical amount for evaluating tire performance, it is possible to use a physical amount for governing the relative excellence of the tire performance, including the lateral spring constant, belt tension in the circumferential direction of the tire when inflated with tire to improve steering stability, or the like. As the design variable for determining the cross-sectional shape of the tire, it is possible to use, among others, a function representing at least one line selected from the carcass line, the turn-up ply line, the outer configuration of the tire, the line representing the configuration of the tire crown, and the reinforcing-material line representing the line of each reinforcing material. As the design variable for determining the tire structure, it is possible to use a variable representing at least one gauge distribution of a tire rubber member selected from a gauge distribution of a bead filler, a gauge distribution of a rubber chafer, a gauge distribution of side rubber, a gauge distribution of tread rubber, a gauge distribution of tread base rubber, a gauge distribution of inner-surface reinforcing rubber, a gauge distribution of inter-belt rubber, and a gauge distribution of belt end rubber, as well as a variable representing the structure of the belt portion, the bead and side portions, including an angle of a belt layer, the width of the belt layer, the height of the ply, an amount of the ply turned up, and the angle, width, position, material and the like of a bead-portion reinforcing material. In addition, as the design variable for determining the pattern, it is possible to use a variable representing the configuration of the pattern, including the configuration of a block, the block groove-wall angle, the position of a sipe, the number of sipes, and the length of the sipe. As the constraint for constraining the cross-sectional configuration of the tire and the tire structure, it is possible to cite, for example, a constraint in a periphery value of the carcass line, a constraint in the vertical primary eigenfrequency, a constraint in the angle of the belt layer, a constraint in the width of the belt layer, and constraints such as the tire size, spring constants, the amount of deformation of the tire, tire weight, stress, strain, strain energy, and rolling resistance. It should be noted that the objective function, the design variable, and the constraint are not confined to the aforementioned examples, and various items may be set as such depending on the objective of tire design.

In the ensuing step (b), a value of the design variable which gives an optimum value of the objective function while taking the constraint into consideration is determined. In this case, it is effective if an amount of change of the design variable which gives the optimum value of the objective function while taking the constraint into consideration is estimated on the basis of a sensitivity of the objective function, which is a ratio of an amount of change of the objective function to an amount of unit change of the design variable, and a sensitivity of the constraint, which is a ratio of an amount of change of the constraint to an amount of unit change of the design variable, a value of the objective function when the design variable is changed by an amount corresponding to the estimated amount and a value of the constraint when the design variable is changed by the amount corresponding to the estimated amount are calculated, and the value of the design variable which gives the optimum value of the objective function while taking the constraint into consideration is determined on the basis of the estimated value and the calculated values. By so doing, the value of the design variable which gives an optimum value of the objective function while taking the constraint into consideration can be obtained.

In addition, in step (a), it is effective to determine a group subject to selection, consisting of a plurality of basic models of the tire each representing a cross-sectional shape of the tire including an internal structure thereof, and determine, with respect to the basic models of the tire of the group subject to selection, the objective function representing the physical amount for evaluating tire performance, the design variable for determining the cross-sectional shape of the tire or the tire structure, the constraint for constraining at least one of the cross-sectional shape of the tire, the tire structure, the physical amount for evaluating performance, and the tire size, and an fitness function which can be evaluated from the objective function and the constraint. In step (b), it is effective to carry out the following: selecting two basic models of the tire from the group subject to selection on the basis of the fitness function; effecting at least one of generating a new basic model of the tire by allowing design variables of the basic models of the tire to cross over each other at a predetermined probability and of generating a new basic model of the tire by changing a portion of the design variable of at least one of the basic models of the tire; determining the objective function, the constraint, and the fitness function of the basic model of the tire with the design variable changed; preserving the basic model of the tire and the basic model of the tire with the design variable not changed, the aforementioned process of step (b) being repeated until the basic models of the tire preserved reaches a predetermined number; determining whether or not a new group consisting of the predetermined number of the preserved basic models of the tire satisfies a predetermined convergence criterion; if the convergence criterion is not satisfied, repeating the foregoing process of step (b) until the group subject to selection satisfies a predetermined convergence criterion by setting the new group as the group subject to selection; and if the predetermined convergence criterion is satisfied, determining the value of the design variable which gives the optimum value of the objective function among the predetermined number of the preserved basic models of the tire while taking the constraint into consideration. In this case, in step (b), with respect to the basic model of the tire with the design variable changed, it is further effective to carry out as follows: The amount of change of the design variable which gives the optimum value of the objective function is estimated while taking the constraint into consideration on the basis of the sensitivity of the objective function, which is the ratio of the amount of change of the objective function to the amount of unit change of the design variable, and on the basis of the sensitivity of the constraint, which is the ratio of the amount of change of the constraint to the amount of unit change of the design variable, the value of the objective function when the design variable is changed by the amount corresponding to the estimated amount and the value of the constraint when the design variable is changed by the amount corresponding to the estimated amount are calculated, the fitness function is determined from the value of the objective function and the value of the constraint, the basic model of the tire and the basic model of the tire with the design variable not changed are preserved, and the aforementioned process of step (b) is repeated until the preserved basic models of the tire reaches the predetermined number. Through this measure as well, it is possible to obtain the value of the design variable for optimizing the value of the objective function by taking the constraint into account. It should be noted that, as the fitness function which can be evaluated from the objective function and the constraint, it is possible to use a function for determining adaptability with respect to the tire model from the objective function and the constraint. In addition, the objective function, the design variable, the constraint, and the fitness function are not confined to the above examples, and various ones may be set in accordance with the object of the tire design. Furthermore, in the crossover of the design variables of the basic models of the tire, there is a method wherein a part of the design variable or design variables at or subsequent to a predetermined position are exchanged with respect to the design variables of two tire models selected. Furthermore, in the change of a part of the design variable of the tire model, there is a method wherein the design variable at a position determined at a predetermined probability is changed (mutated).

In a case where a plurality of lines are set as the design variable by means of a function representing the shape of at least one line selected from a carcass line, a turn-up ply line, a line representing an outer configuration of the tire, a line representing a tire crown portion, and a reinforcing-material line, if a mapping function of a function representing shapes of the lines and a constraint for preventing the lines from intersecting with each other are determined in order to prevent the plurality of lines from intersecting with each other when the design variable is varied, and if the value of the design variable which gives the optimum value of the objective function while satisfying the constraint is determined by executing step (b) in a space mapped by the mapping function, then the plurality of lines cease to intersect each other.

Then in step (c), the tire is designed by changing the basic model of the tire and the like on the basis of the design variable which gives the optimum value of the objective function. In addition, in a case where mapping functions are used, the tire is designed on the basis of the design variable mapped on the original function.

As described above, in step (a), in a case where a group subject to selection, consisting of a plurality of basic models of the tire each representing a cross-sectional shape of the tire including an internal structure thereof is determined, and in a case where the objective function representing the physical amount for evaluating tire performance, the design variable for determining the cross-sectional shape of the tire or the tire structure, the constraint for constraining at least one of the cross-sectional shape of the tire, the tire structure, the physical amount for evaluating performance, and the tire size, and an fitness function which can be evaluated from the objective function and the constraint are determined with respect to the basic models of the tire of the group subject to selection, step (b) can be comprised of the following steps (1) to (4): (1) the step of selecting two basic models of the tire from the group subject to selection on the basis of the fitness function; (2) the step of effecting at least one of generating a new basic model of the tire by allowing design variables of the tire models to cross over each other at a predetermined probability and of generating a new basic model of the tire by changing a portion of the design variable of at least one of the basic models of the tire; (3) the step of determining the objective function, the constraint, and the fitness function of the basic model of the tire with the design variable changed by crossover or change, preserving the basic model of the tire and the basic model of the tire with the design variable not changed, and repeating the steps (1) to (3) until the basic models of the tire preserved reaches a predetermined number; and (4) the step of determining whether or not a new group consisting of the predetermined number of the preserved basic models of the tire satisfies a predetermined constraint; if the constraint is not satisfied, repeating the steps (1) to (4) until the group subject to selection satisfies a predetermined constraint by setting the new group as the group subject to selection; and, if the predetermined constraint is satisfied, determining the value of the design variable which gives the optimum value of the objective function among the predetermined number of the preserved basic models of the tire while taking the constraint into consideration.

In this step (3), it is effective to carry out the following with respect to the basic model of the tire with the design variable changed: The amount of change of the design variable which gives the optimum value of the objective function is estimated while taking the constraint into consideration on the basis of the sensitivity of the objective function, which is the ratio of the amount of change of the objective function to the amount of unit change of the design variable, and on the basis of the sensitivity of the constraint, which is the ratio of the amount of change of the constraint to the amount of unit change of the design variable. Then, the value of the objective function when the design variable is changed by the amount corresponding to the estimated amount and the value of the constraint when the design variable is changed by the amount corresponding to the estimated amount are calculated. Furthermore, the fitness function is calculated from the value of the objective function and the value of the constraint, and the new basic model of the tire with the design variable changed and the basic model of the tire with the design variable not changed are preserved. The steps (1) to (3) are repeatedly executed until the preserved basic models of the tire reaches the predetermined number. By virtue of this measure as well, it is possible to determine the value of the design variable which optimizes the value of the objective function by taking into the constraint into consideration.

If design and development are effected in accordance with the designing method of the present invention, unlike the conventional design and development based on trial and error, the process ranging from the design of a best mode to the performance evaluation of the designed tire becomes possible to a certain extent based principally on computer calculation. Hence, it is possible to increase the efficiency remarkably, thereby permitting a reduction in the cost required in development.

As described above, in accordance with the present invention, since the design variable which gives an optimum value of the objective function while satisfying the constraint is determined, and the tire is designed on the basis of this design variable, it is possible to obtain an advantage in that a best mode for the tire can be designed.

The above and other objects, features and advantages of the present invention will become more apparent from the following detailed description of the invention when read in conjunction with the accompanying drawings.

BRIEF DESCRIPTION OF THE DRAWINGS

FIGS. 7A and 7B are flow charts illustrating a processing routine in accordance with a first embodiment of the present invention;

FIG. 19 is a flowchart illustrating a routine for processing division into elements;

FIGS. 20A to 20D are diagrams illustrating the processing of division into elements, wherein FIG. 20A is a diagram illustrating a model at the time of defining regions, FIG. 20B is a diagram illustrating the nodes generated in the respective regions, FIG. 20C is a diagram illustrating the generation of triangular elements, and FIG. 20D is a diagram illustrating that the smoothing of the nodes has been carried out;

FIGS. 31A and 31B are diagrams illustrating chevron-shaped mapping functions, wherein FIG. 31A is a diagram illustrating a continuous chevron-shaped mapping function, and FIG. 31B is a diagram illustrating a linear chevron-shaped mapping function;

FIGS. 32A and 32B are diagrams illustrating trough-shaped mapping functions, wherein FIG. 32A is a diagram illustrating a continuous trough-shaped mapping function, and FIG. 32B is a diagram illustrating a linear trough-shaped mapping function;

FIGS. 34A and 34B are diagrams illustrating a basic model of a tire in accordance with an 11th embodiment, wherein FIG. 34A is a diagram illustrating a basic model of the tire during fabrication, and FIG. 34B is an image diagram explaining the presence of the belts;

FIGS. 38A and 38B are diagrams illustrating the modeling of a block, wherein FIG. 38A is a diagram illustrating the configuration of the block for modeling, and FIG. 38B is a diagram illustrating a modeling example of a finite element model;

DETAILED DESCRIPTION OF THE PREFERRED EMBODIMENT

Figure 1:
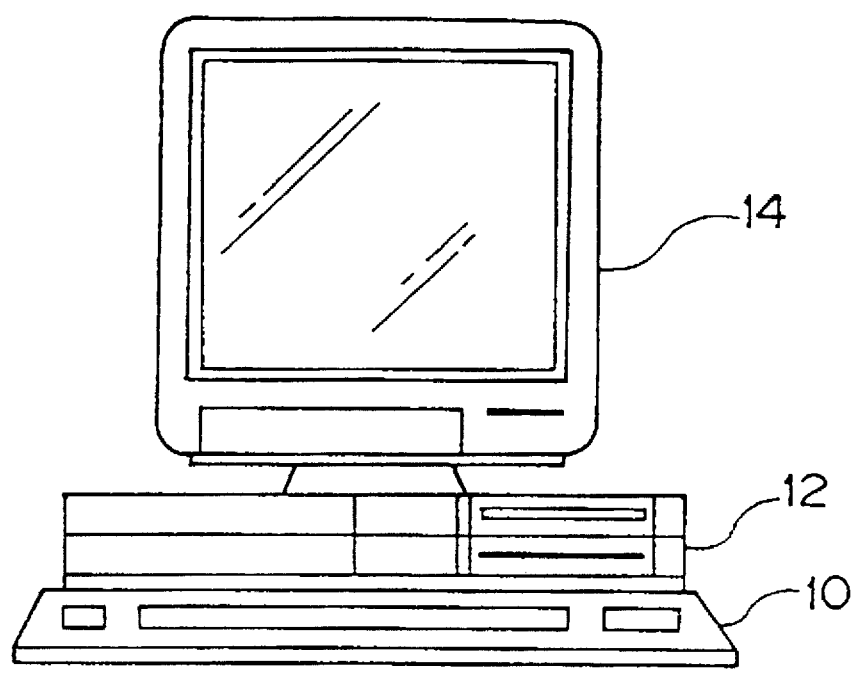
FIG. 1 is a schematic diagram of a personal computer used in the embodiments of the present invention.

FIG. 1 shows an outline of a personal computer for carrying out the method of designing a pneumatic tire in accordance with the present invention.

This personal computer comprises a keyboard 10 for entering data and the like; a main unit 12 for calculating design variables for satisfying a constraint in accordance with a program stored in advance, and for optimizing, e.g., maximizing or minimizing, an objective function; and a CRT 14 for displaying such as the results of calculation by the main unit 12 of the computer.

Next, a description will be given of a first embodiment for designing the configuration of a carcass line for setting the belt tension in the circumferential direction of the tire when inflated with air to a maximum value, i.e., an optimum value, so as to improve steering stability.

Figure 2:
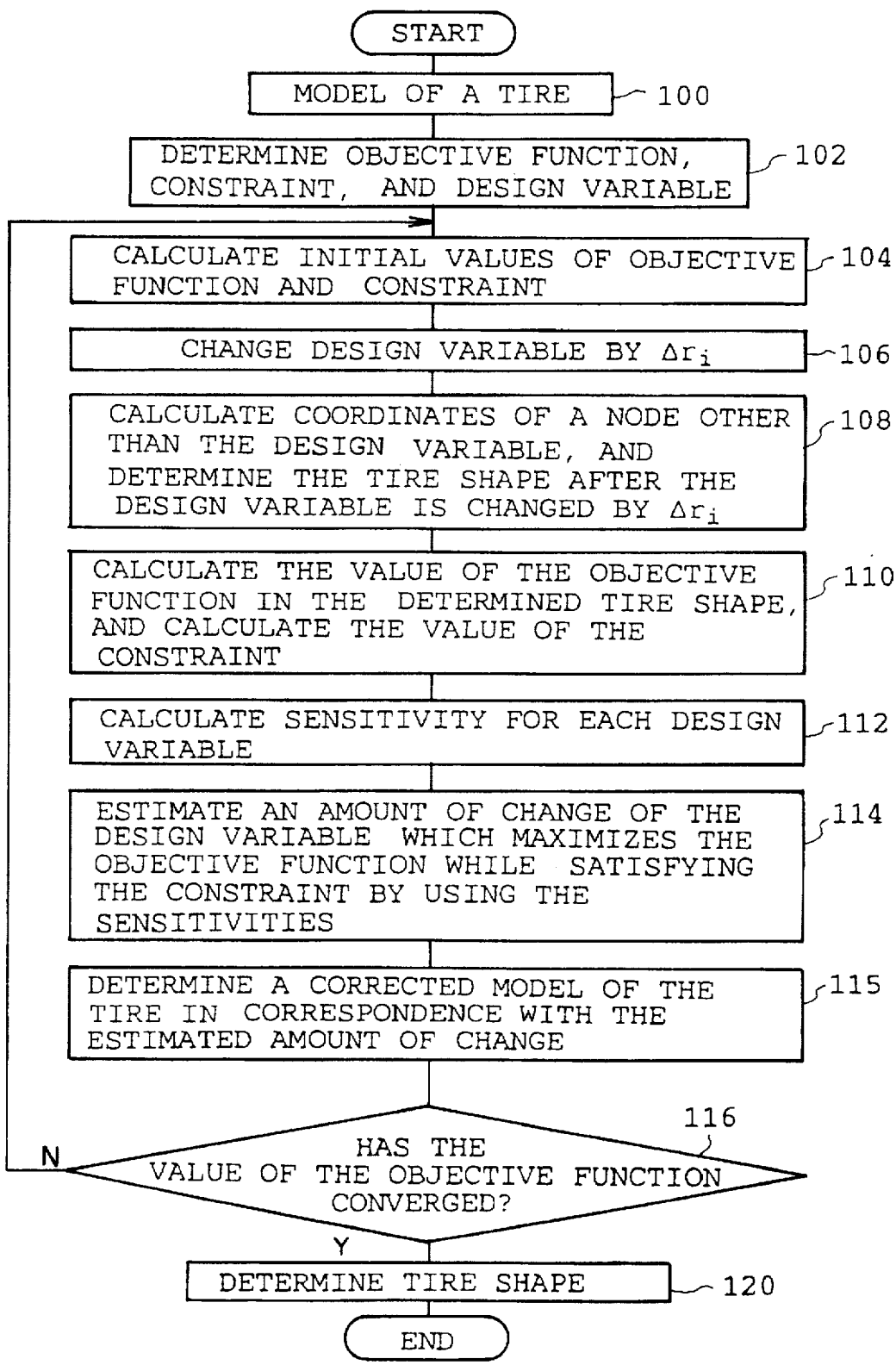
FIG. 2 is a flowchart illustrating a processing routine in accordance with a first embodiment of the present invention.
Figure 4:
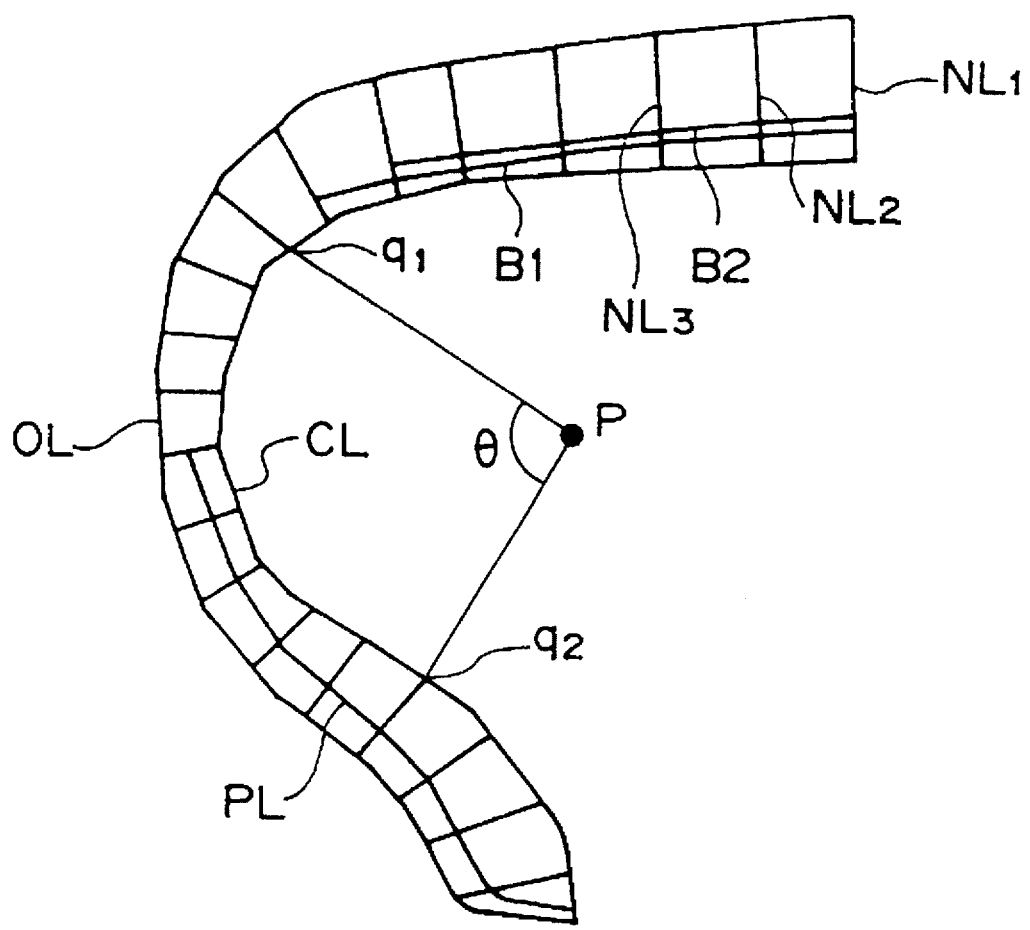
FIG. 4 is a diagram illustrating a basic model of the tire.

FIG. 2 shows a processing routine of a program in accordance with this first embodiment. In Step 100, the cross-sectional shape of the tire in a state of natural equilibrium is set as a reference shape. This reference shape is subjected to modeling by a technique, such as a finite element method, which makes it possible to numerically or analytically determine the belt tension in the circumferential direction of the tire when inflated with air, so as to determine a basic model of the tire which represents a cross-sectional shape of the tire including its internal structure, and in which the cross-sectional shape is divided into a plurality of elements by meshing. It should be noted that the basic shape is not confined to the cross-sectional shape of the tire in a state of natural equilibrium, but may be an arbitrary shape. The term modeling referred to herein means the numerical representation of the shape, structure, materials, and pattern of the tire into a format of input data for a computer program prepared according to a numerical and analytical technique. FIG. 4 shows a basic model of the tire, in which CL denotes a carcass line; OL, a line representing an outer configuration of the tire; PL, a turn-up ply line; and B1 and B2 denote lines indicating belts. In addition, this basic model of the tire is divided into a plurality of elements by a plurality of lines $NL_1, NL_2, NL_3, \ldots$ normal to the carcass line CL. It should be noted that although, in the above, a description has been given of an example in which the basic model of the tire is divided into a plurality of elements by a plurality of lines normal to the carcass line, the basic model of the tire may be divided into a plurality of elements by a plurality of lines normal to a line representing an outer configuration of the tire or by a plurality of lines normal to a turn-up ply line, or may be divided into arbitrary shapes such as triangles depending on a design objective.

In an ensuing Step 102, an objective function representing a physical amount for evaluating tire performance, a constraint for constraining the cross-sectional shape of the tire, and a design variable determining the cross-sectional shape of the tire are determined. In this embodiment, the objective function OBJ and the constraint G are defined as follows in order to design the configuration of the carcass line for maximizing the belt tension in the circumferential direction of the tire when inflated with air:

Objective function OBJ: the sum total, in the widthwise direction of the tire, of components of the belt tension acting in the circumferential direction of the tire Constraint G: A periphery value of the carcass line is within ±5% of the periphery value of the carcass line of the basic model of the tire.

It should be noted that the aforementioned periphery value of the carcass line can be calculated as the sum total of distances between nodes (points of intersection between the carcass line and the respective normal line) in the carcass line which are located in a domain that changes the tire shape.

Figure 3:
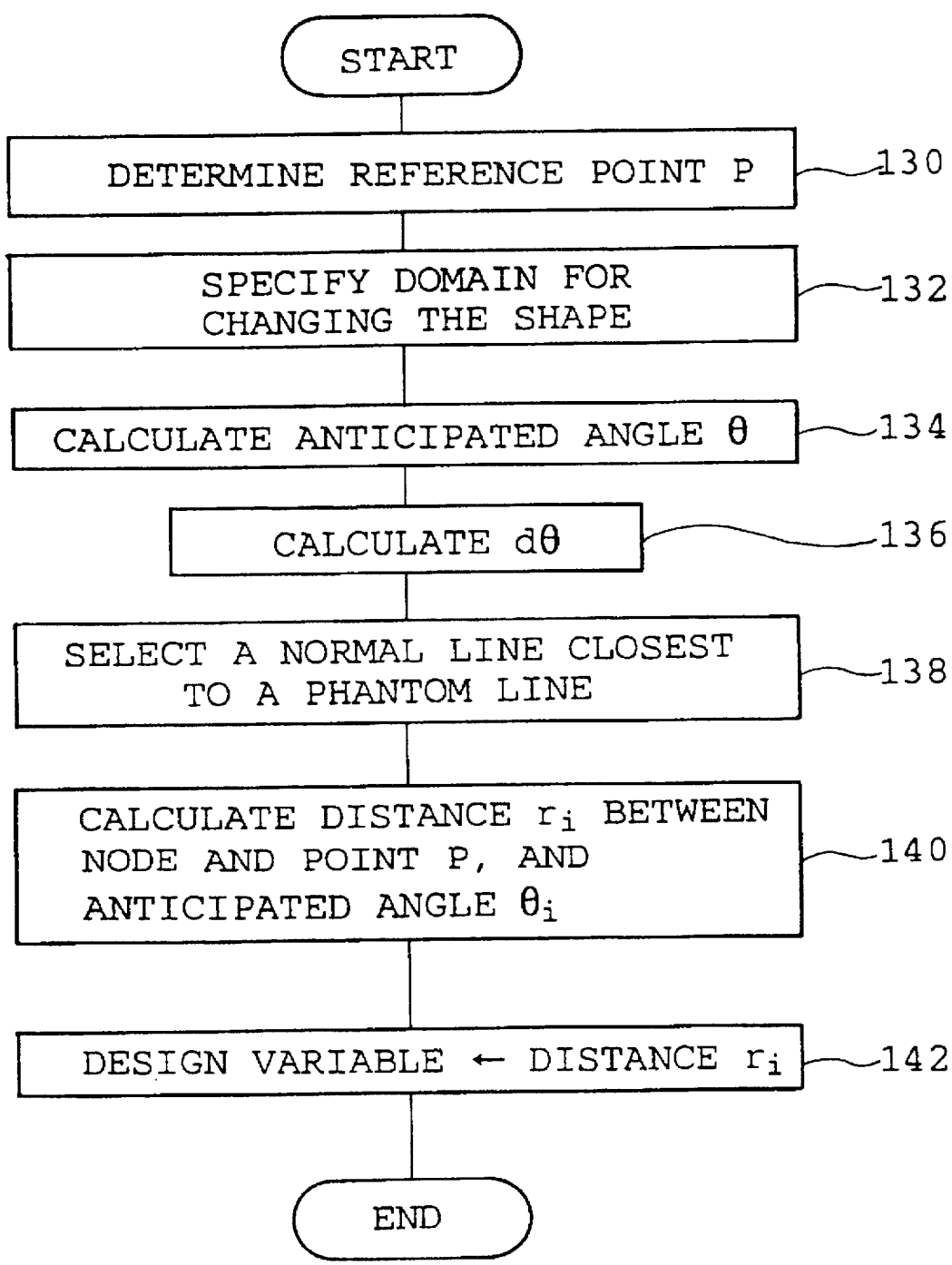
FIG. 3 is a flowchart illustrating a routine for determining a design variable shown in FIG. 1.

In addition, the configuration of the carcass line, which is a design variable, is determined by a Lagrange interpolation routine, shown in FIG. 3, for approximating a curve. In Step 130 for this Lagrange interpolation routine, a reference point P is set in the interior of the tire, as shown in FIG. 4. In an ensuing Step 132, the domain from a node $q_1$ in the vicinity of a belt end to a node $q_2$ in a vicinity constrained by the rim is specified as the domain for changing the shape of the tire. In Step 134, by using as a reference line a straight line connecting the node $q_1$ and the reference point P, an ascending angle θ, which is an angle formed by this reference line and the straight line connecting the node $q_2$ and the reference point P, is calculated. In Step 136, an angular increment dθ is calculated in accordance with the following formula:

$$d\theta = \theta/\text{the order of Lagrange interpolation} \qquad (1)$$

It should be noted that the order of Lagrange interpolation is inputted in advance by the user.

Figure 5:
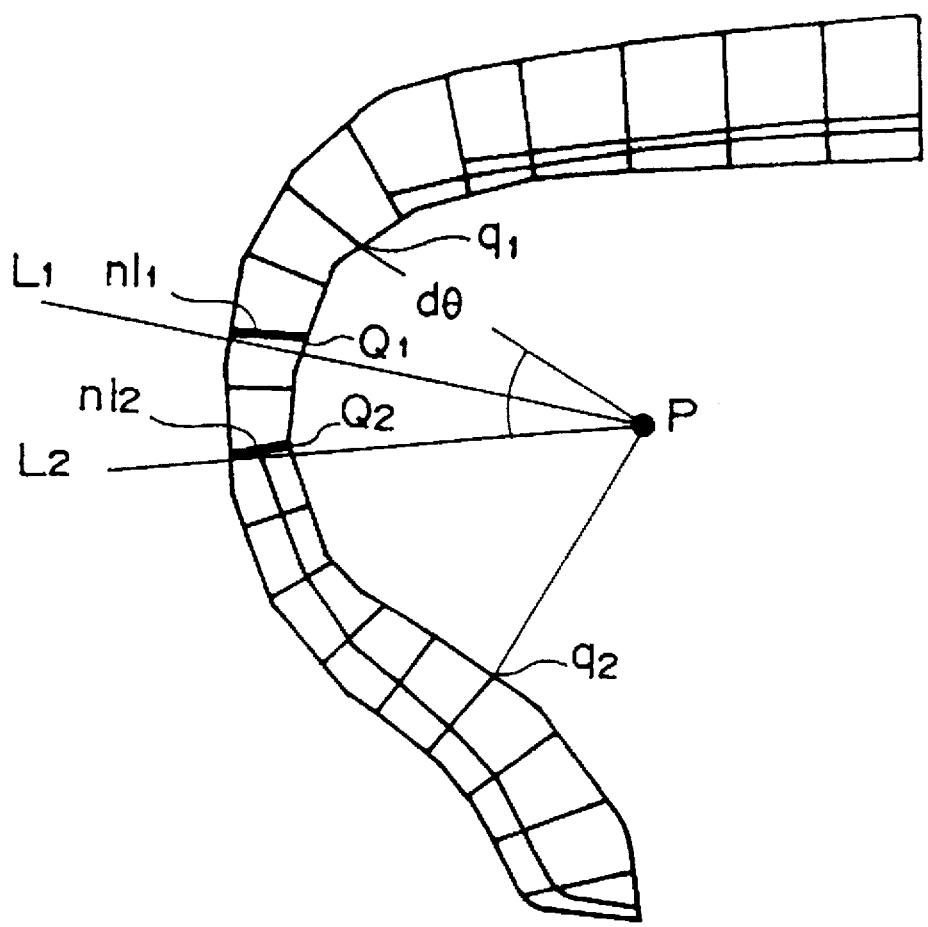
FIG. 5 is a diagram illustrating a state in which phantom lines passing through a reference point P are drawn for each $d\theta$ on the basic model of the tire shown in FIG. 4.
Figure 6:
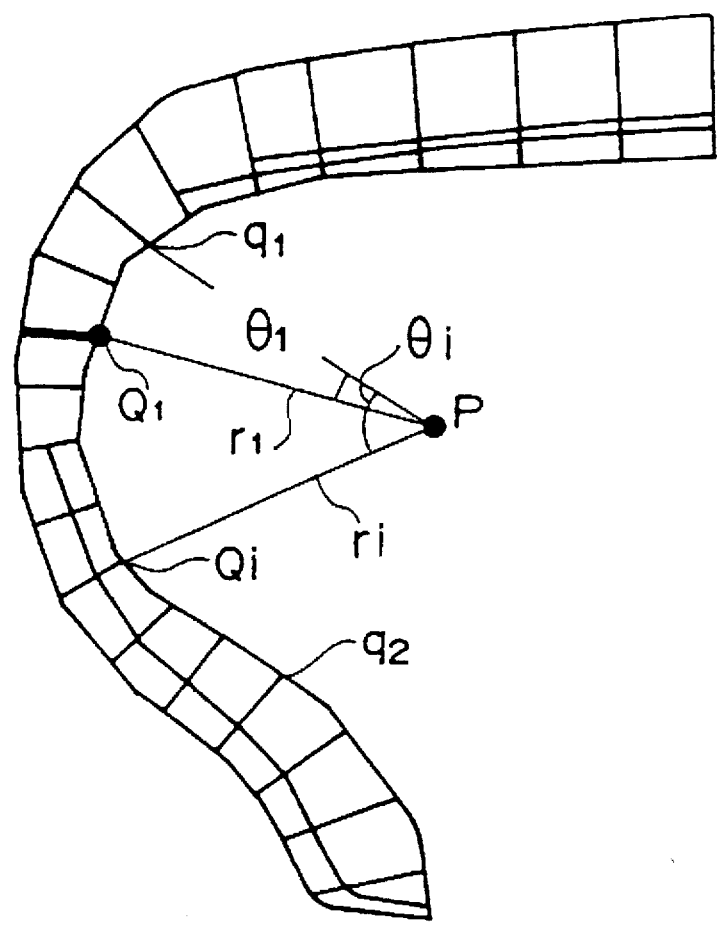
FIG. 6 is a diagram illustrating relationships among selected nodes, a distance $r_i$ to each of these nodes, and an ascending angle $\theta_i$.

In Step 138, as shown in FIG. 5, phantom lines $L_1, L_2, L_3, \ldots$ are assumed for respective angular increments dθ with the reference line set as a reference, and normal lines $nl_1, nl_2, nl_3 \ldots$ which are closest to the respective phantom lines are selected. In an ensuing Step 140, as shown in FIG. 6, distances $r_1, r_2, r_3 \ldots$ (hereafter expressed as $r_i$ in a general formula, where $i=1, 2, 3, \ldots$; the order of Lagrange interpolation-1) between the reference point P and innermost nodes $Q_1, Q_2, Q_3, \ldots$ on the selected normal lines $nl_1, nl_2, nl_3$, as well as ascending angles $\theta_1, \theta_2, \theta_3, \ldots$ (hereafter expressed as $\theta_i$ in a general formula, where $i=1, 2, 3, \ldots$; the order of Lagrange interpolation-1) at the nodes $Q_1, Q_2, Q_3, \ldots$ are calculated. Then, in Step 142, the distance $r_i$ is set as a design variable.

After the objective function OBJ, the constraint G, and the design variable $r_i$ are thus determined, in Step 104 in FIG. 2, an initial value OBJo of the objective function OBJ and an initial value Go of the constraint G when the design variable $r_i$ is at an initial value ro are calculated.

In an ensuing Step 106, the design variable $r_i$ is changed by $\Delta r_i$ each so as to change the basic model of the tire. In Step 108, a distance $r_m$ between the reference point P and an innermost node other than an innermost node $Q_i$ corresponding to the design variable is calculated in accordance with the following formulae:

$$r_m = \sum_{i=1}^{n} N_i \cdot r_i \qquad (2)$$

$$N_i = \prod_{\substack{j=1 \\ j \neq i}}^{n} (\theta_m - \theta_j) / \prod_{\substack{j=1 \\ j \neq i}}^{n} (\theta_i - \theta_j)$$

where $\theta_m$ is an ascending angle formed between the reference line and a straight line connecting that node and the reference point P.

In addition, in Step 108, a distance between the innermost node $Q_i$ and an node on the normal line other than the innermost node (a node on the carcass line), i.e., each node on the line OL representing the outer configuration of the tire, on the turn-up ply line PL, and on the lines B1, B2 representing the belts, is determined. The distance thus determined is added to the coordinates at the innermost node $Q_i$ so as to determine the coordinates of the node other than the innermost node on the normal line. Thus, the cross-sectional shape of the tire after the design variable is changed by $\Delta r_i$, i.e., a corrected model of the tire, is determined.

In Step 110, a value $OBJ_i$ of the objective function and a value $G_i$ of the constraint after the design variable is changed by $\Delta r_i$ are calculated with respect to the corrected model of the tire determined in Step 108. In Step 112, a sensitivity $dOBJ/dr_i$ of the objective function, which is a ratio of an amount of change of the objective function to an amount of unit change of the design variable, as well as a sensitivity $dG/dr_i$ of the constraint, which is a ratio of an amount of change of the constraint to an amount of unit change of the design variable, are calculated for each design variable in accordance with the following formulae:

$$\frac{dOBJ}{dr_i} = \frac{OBJ_i - OBJ_o}{\Delta r_i} \qquad (3)$$

$$\frac{dG}{dr_i} = \frac{G_i - G_o}{\Delta r_i}$$

By means of these sensitivities, it is possible to estimate to what extent the value of the objective function and the value of the constraint change when the design variable is changed by $\Delta r_i$. It should be noted that these sensitivities are sometimes determined analytically depending on the technique used in modeling the tire and the nature of the design variable, in which case the calculation of Step 110 becomes unnecessary.

In an ensuing Step 114, an amount of change of the design variable which maximizes the objective function while satisfying the constraint is estimated by means of mathematical programming by using the initial value OBJo of the objective function, the initial value Go of the constraint, the initial value ro of the design variable, and the sensitivities. In Step 115, by using this estimated value of the design variable, a corrected model of the tire is determined in a method similar to that of Step 108, and a value of the objective function is calculated. In Step 116, a determination is made as to whether or not the value of the objective function has converged by comparing a threshold value inputted in advance with the difference between the value OBJ of the objective function calculated in Step 115 and the initial value OBJo of the objective function calculated in Step 104. If the value of the objective function has not converged, Steps 104 through 116 are executed repeatedly by setting as the initial value the value of the design variable determined in Step 114. If it is determined that the value of the objective function has converged, the value of the design variable at this juncture is set as the value of the design variable which maximizes the objective function while satisfying the constraint, and the shape of the tire is determined in Step 120 by using this value of the design variable.

Figure 7A:
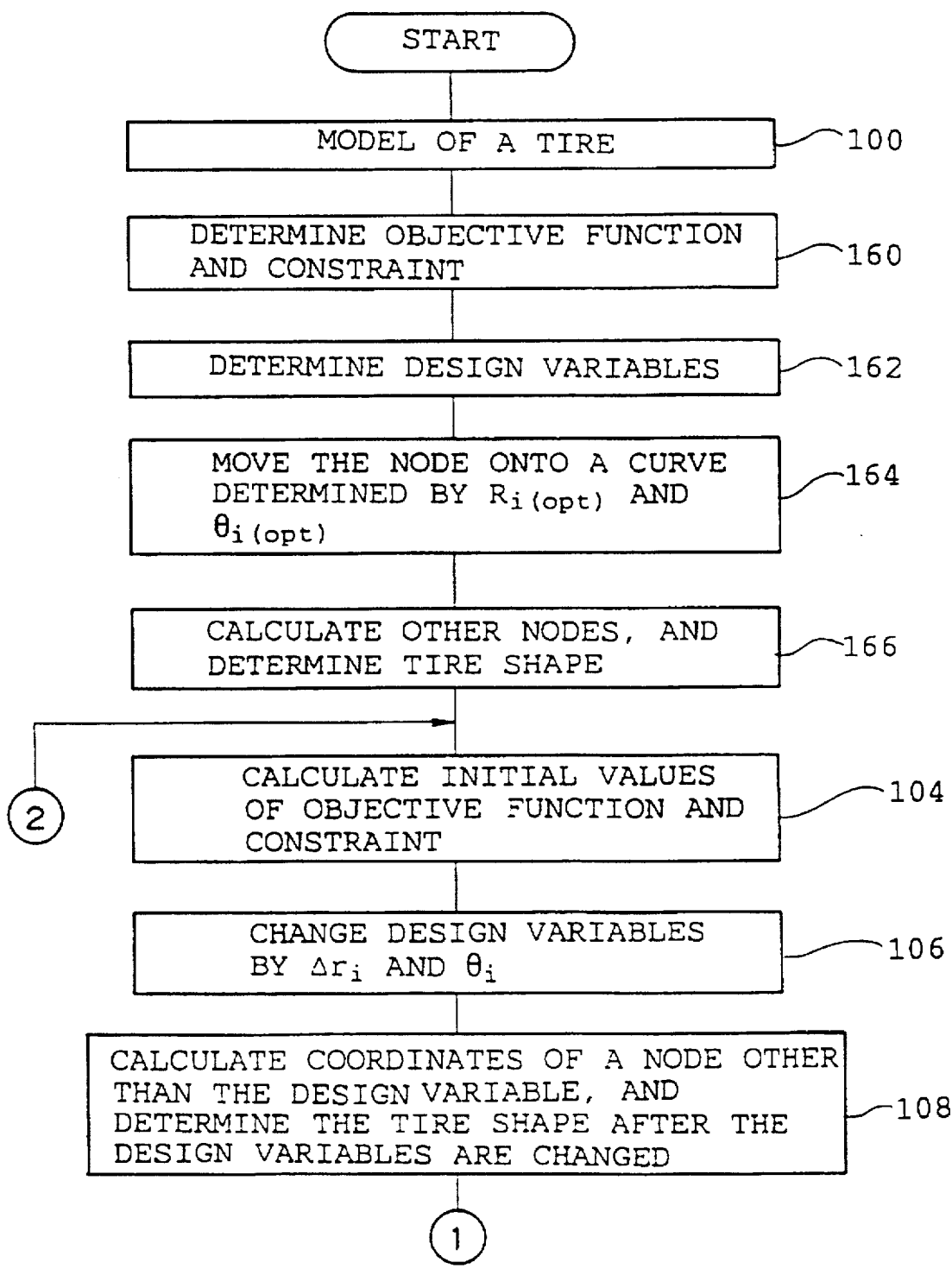

Next, a description will be given of a second embodiment of the present invention. In this embodiment, design variables different from the design variable of the first embodiment are used. FIGS. 7A and 7B show a processing routine of a program in accordance with the second embodiment, in which steps corresponding to those of FIG. 2 will be denoted by the same numerals.

Figure 8:
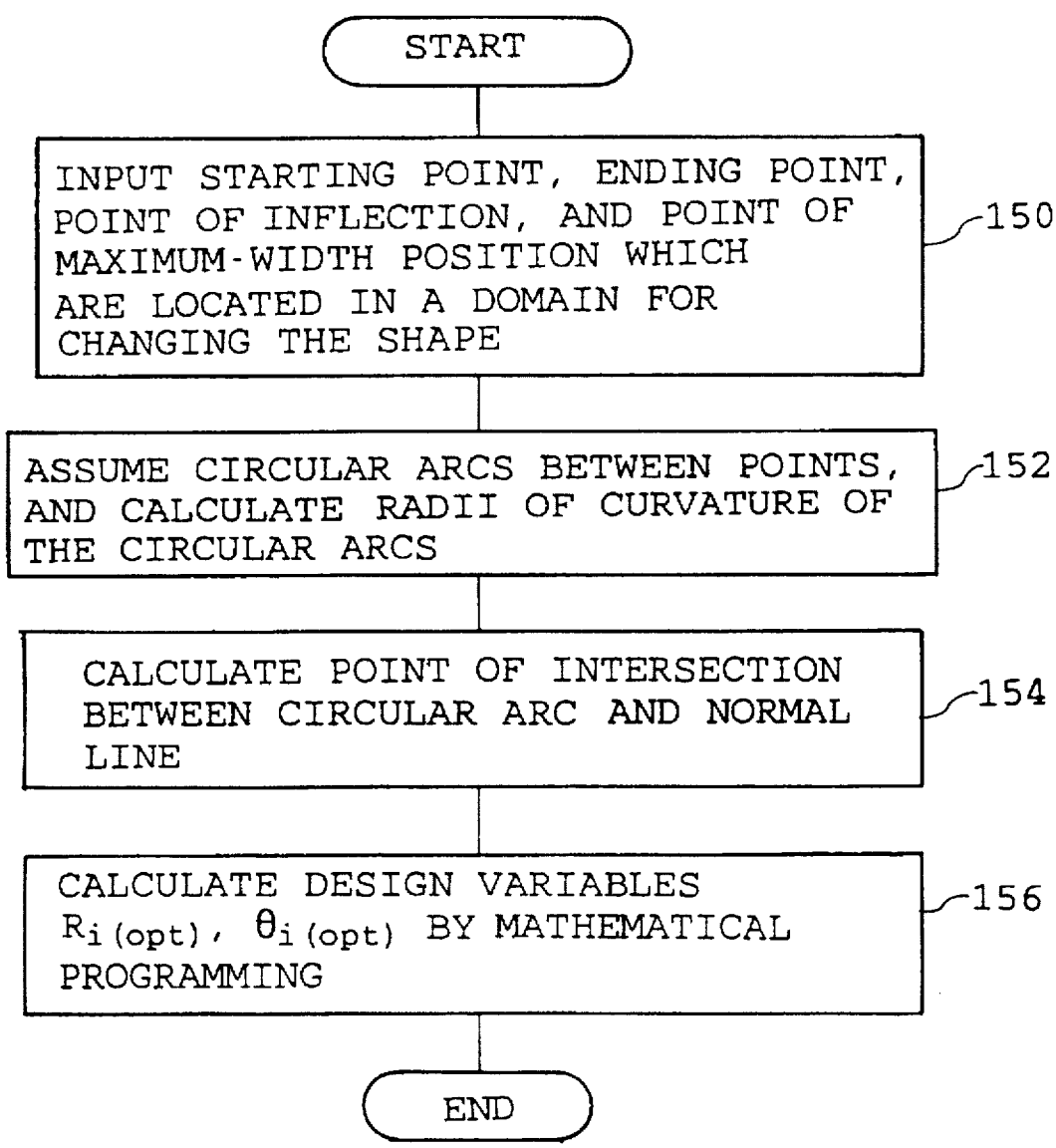
FIG. 8 is a flowchart illustrating a routine for determining the design variable shown in FIG. 7.
Figure 9:
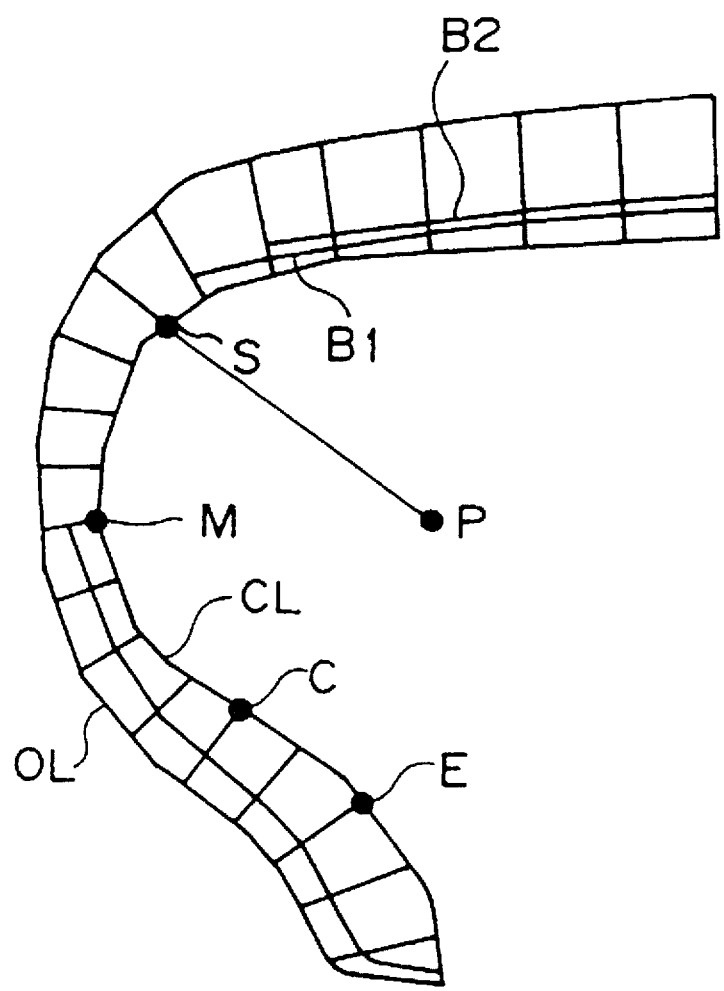
FIG. 9 is a diagram in which a starting point S, an ending point E, a point of inflection C, and a point of a maximum-width position M are shown in the basic model of the tire.
Figure 10:
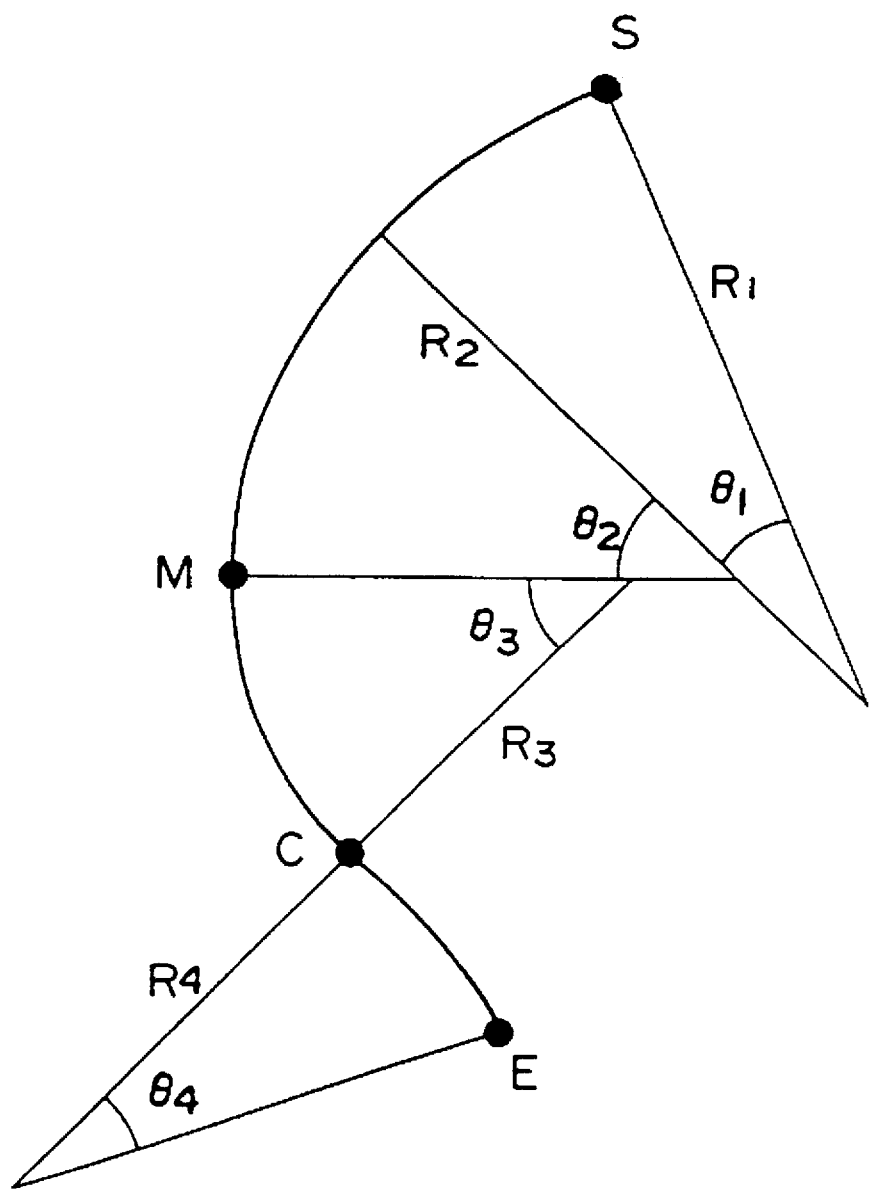
FIG. 10 is a diagram illustrating radii of curvature of circular arcs assumed between respective points, i.e., the starting point S, the ending point E, the point of inflection C, and the point of a maximum-width position M.

In Step 160, the objective function and the constraint are determined in the same manner as described above, and the design variables are determined in Step 162. FIG. 8 shows the details of Step 162, wherein in Step 150, a starting point S, an ending point E, a point of inflection C, and a point of a maximum-width position M are selected from nodes on the carcass line in the domain for changing the shape of the basic model of the tire, and data on these points are inputted, as shown in FIG. 9. In an ensuing Step 152, as shown in FIG. 10, one or a plurality of circular arcs are assumed between the respective points, i.e., the starting point S, the ending point E, the point of inflection C, and the point of a maximum-width position M, and radii of curvature $R_1$, $R_2$, $R_3$, and $R_4$ of these circular arcs and ascending angles $\theta_1$, $\theta_2$, $\theta_3$, $\theta_4$ are calculated. It should be noted that if it is desired to increase the number of the design variables, it suffices if the number of the circular arcs is increased.

Figure 11:
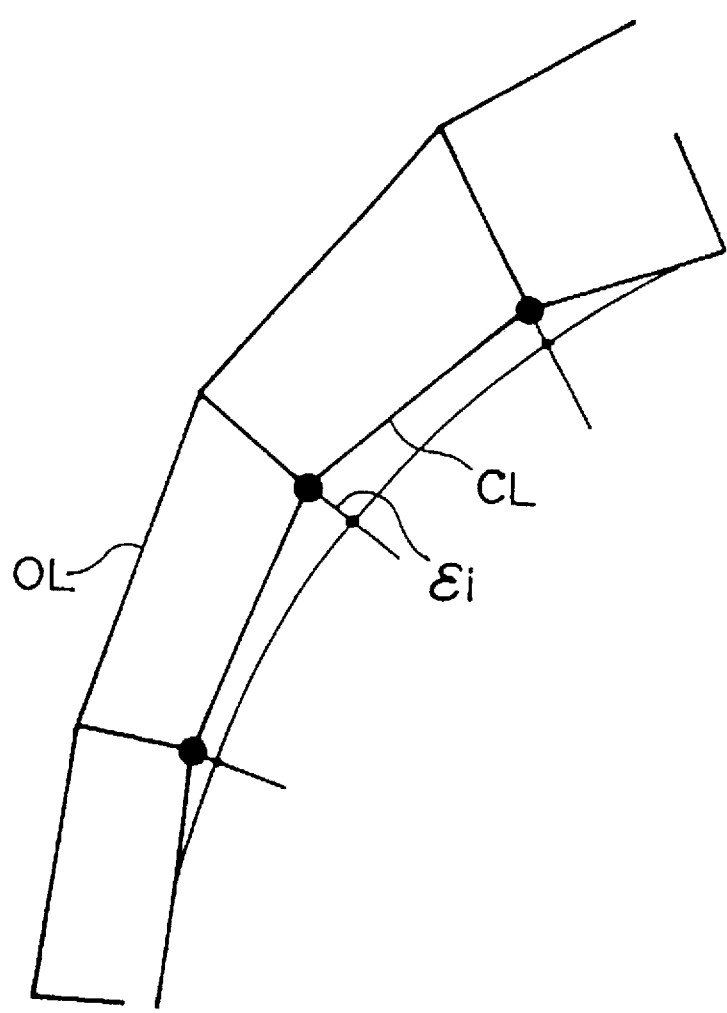
FIG. 11 is a diagram illustrating an amount of offset between an original node in the basic model of the tire and an optimal point determined by a method of least squares.

In an ensuing Step 154, the coordinates of a point of intersection between the circular arc and the normal line are calculated, and, as shown in FIG. 11, an amount of offset s (expressed as $\epsilon_i$ in a general formula) between the node on the carcass line and the point of intersection between the circular arc and the normal line is calculated. In Step 156, a radii of curvature $R_{i(opt)}$ of the circular arc and an ascending angle $\theta_{i(opt)}$ in which $\Sigma \epsilon_i^2$ becomes minimum are calculated by mathematical programming, and these values $R_{i(opt)}$ and $\theta_{i(opt)}$ are set as design variables $R_i$ and $\theta_i$. It should be noted that, although not shown in the drawing, after the objective function, the constraint, and the design variables are determined, their initial values are calculated in the same manner as described above.

In Step 164 in FIG. 7A, the node on the carcass line is moved to an optimal point which is defined by $R_{i(opt)}$ and $\theta_{i(opt)}$ determined in Step 156. In addition, in an ensuing Step 166, a distance between the node on the carcass line and a node other than the node on the carcass line, i.e., each node on the line OL representing the outer configuration of the tire, on the turn-up ply line PL, and on the lines B1, B2 representing the belts, is determined. The distance thus determined is added to the coordinates at the node on the carcass line so as to determine the coordinates of the node other than the node on the carcass line. Thus, the cross-sectional shape of the tire when each node on the carcass line is moved to the optimal point is set as a basic model of the tire. Thereafter, in the same manner as in Steps 104 through 106, the following processing is carried out: The initial value OBJo of the objective function and the initial value Go of the constraint when the design variables are at initial values Ro and $\theta$o are calculated. The sensitivity is calculated for each design variable by using the corrected model of the tire after the design variables are changed by $\Delta R_i$ and $\Delta \theta_i$. An amount of change of the design variable which maximizes the objective function while satisfying the constraint is estimated by means of mathematical programming. A corrected model of the tire is determined at the estimated value of each of the design variables, and the objective function OBJ is calculated. A determination is made as to whether or not the value of the objective function has converged by comparing a threshold value with the difference with the initial value OBJo. If the value of the objective function has not converged, Steps 104 through 106 are executed repeatedly by setting as initial values the values of the design variables determined in Step 114. If it is determined that the value of the objective function has converged, the shape of the tire is determined in the same manner as described above.

It should be noted that although in the above-described embodiment the shape of the carcass line is adopted as the design variable, the shape of the turn-up ply line, the line representing the outer configuration of the tire, the lines of reinforcing members, and the like may be determined as the design variables.

Next, a description will be given of a third embodiment of the present invention. In this embodiment, the present invention is used in the determination of the shapes of a plurality of lines, and is designed to optimize mutually incompatible performances. In this embodiment, the shape of the carcass line, the shape of the turn-up ply line, and the outer configuration of the tire are determined for improving steering stability without impairing the riding comfort of the occupant in the vehicle. If the riding comfort is made satisfactory, the steering stability deteriorates, so that the riding comfort of the occupant in the vehicle and the steering stability are incompatible.

The procedure of this embodiment is substantially similar to the above-described embodiments, but the selection of the objective function, the constraint, and the design variables differs. In this embodiment, lateral stiffness, i.e., a physical amount for improving the steering stability, are used as the objective function. As the constraint, a condition that a vertical 1st order natural frequency, i.e., a physical amount for governing the riding comfort, is fixed is used so as to determine the shape of the carcass line, the shape of the turn-up ply line, and the outer configuration of the tire which maximize the lateral stiffness under the condition of the vertical 1st order natural frequency being fixed.

As for the design variables, if the methods of the above-described embodiments are applied as they are to three kinds of lines including the carcass line, the turn-up ply line, and the line representing the outer configuration of the tire, there arises the problem that the lines intersect with each other in the process of optimization. Therefore, the design variables are determined as follows:

With respect to the carcass line, the design variable $r_i$ is determined by using the Lagrange interpolation method explained in the first embodiment.

Figure 12:
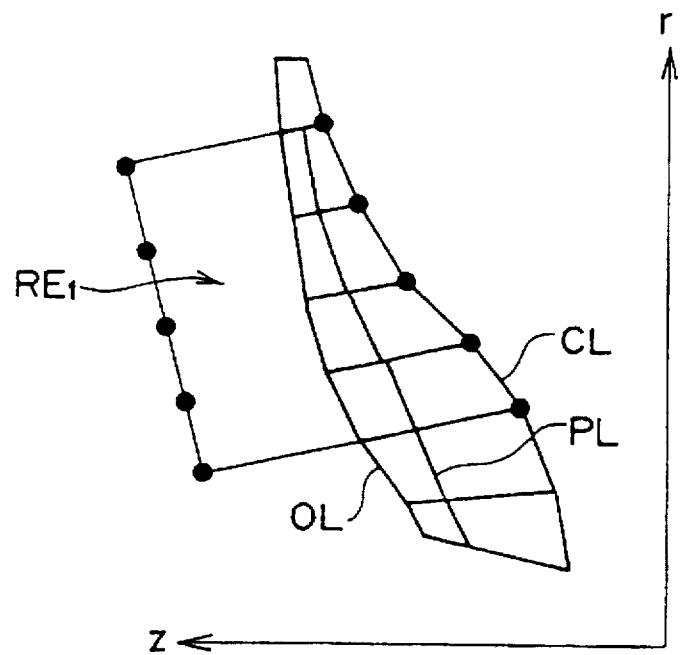
FIG. 12 is a diagram illustrating r–z coordinates.
Figure 13:
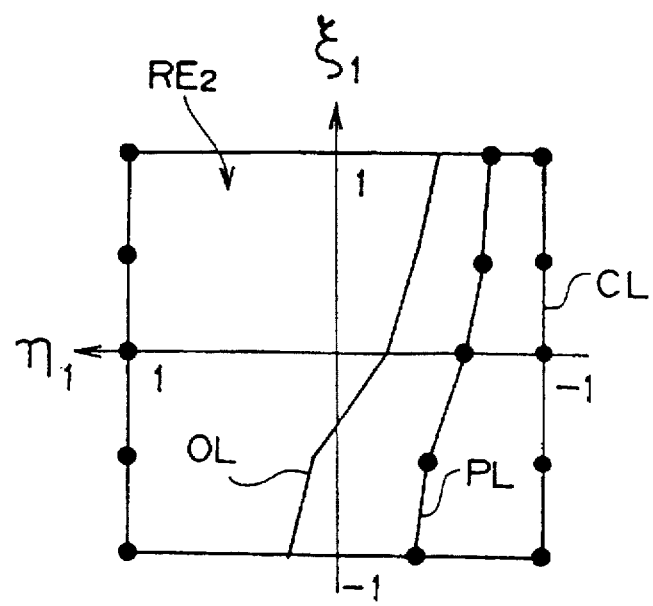
FIG. 13 is a diagram illustrating $\xi_1$-$\eta_1$ coordinates.
Figure 14:
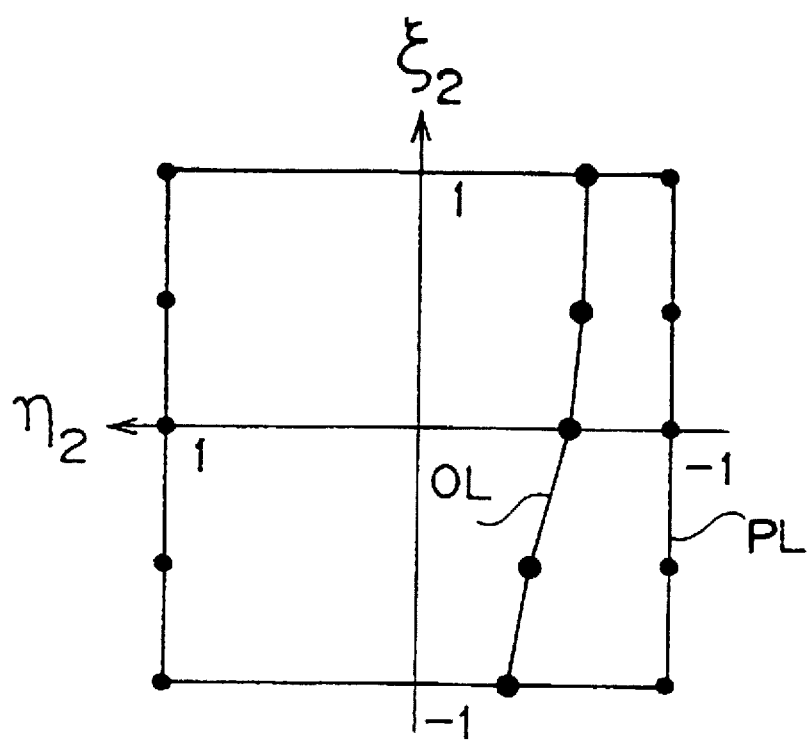
FIG. 14 is a diagram illustrating $\xi_2$-$\eta_2$ coordinates.

With respect to the turn-up ply line and the line representing the outer configuration of the tire, the design variables are determined as follows: First, as shown in FIG. 12, a region $RE_1$ having the carcass line as one side is assumed in the original r–z coordinates. Then, a mapping function in which this region $RE_1$ is formed into a square having the carcass line as one side is prepared in $\xi_1$–$\eta_1$ coordinates which are different from the r–z coordinates. Further, lines representing the turn-up ply line and the outer configuration of the tire are mapped. Also, a region $RE_2$ having the turn-up ply line as one side is similarly assumed in the $\xi_1$–$\eta_1$ coordinates. A mapping function in which a square having the turn-up ply line as one side is then prepared in $\xi_2$–$\eta_2$ coordinates which are different from the $\xi_1$–$\eta_1$ coordinates. Further, a line representing the outer configuration of the tire is mapped.

Here, the mapping functions are expressed as follows:

$$r = \sum_i N_i^p (\xi_1, \eta_1) r_i$$

$$z = \sum_i N_i^p (\xi_1, \eta_1) z_i$$

$$\xi_1 = \sum_i N_i^p (\xi_2, \eta_2) \xi_{1i}$$

$$\eta_1 = \sum_i N_i^p (\xi_2, \eta_2) \eta_{1i}$$

Then, the turn-up ply line in the $\xi_1$–$\eta_1$ coordinates is determined as a design variable, and the line representing the outer configuration of the tire in the $\xi_2$–$\eta_2$ coordinates is determined as another design variable. In addition, a constraint that $\xi_1, \xi_2 > -1$ is added. This prevents the lines from intersecting with each other.

The results of tests conducted by actually trial-manufacturing the tires obtained in the first and third embodiments are shown in Table 1 below.

Although in the above example the three lines are adopted as design variables, two lines or four or more lines may be adopted as the design variables.

TABLE 1

|  |  | Conventional Tire | 1st Embodiment | 3rd Embodiment |
|---|---|---|---|---|
| Time required for design and development |  | 100 | 50 | 60 |
| Performance | Steering stability | 100 | 106 | 104 |
|  | Riding comfort | 100 | 98 | 100 |

Tire size: 205/60HR15
Internal pressure: 2.0 kg/cm$^2$
Testing method: feeling evaluation by an actual-vehicle running test Next, a description will be given of a fourth embodiment of the present invention. In this embodiment, the determination of the shapes of a plurality of lines illustrated in the third embodiment is applied to the determination of the shapes of a tire bead filler and its peripheral members. In this embodiment, the shape of the bead filler and the shape of a rubber chafer are determined for alleviating the rolling resistance without impairing the durability of a bead portion. Although the procedure of this embodiment is substantially similar to that of the third embodiment, the selection of the objective function, the constraint, and the design variables differs. First, the objective function and the constraint are determined as follows:

Objective function: rolling resistance value
Constraint: A principal strain occurring at a turn-up
  ply end under a load is within +3% of the initial structure.

Figure 15:
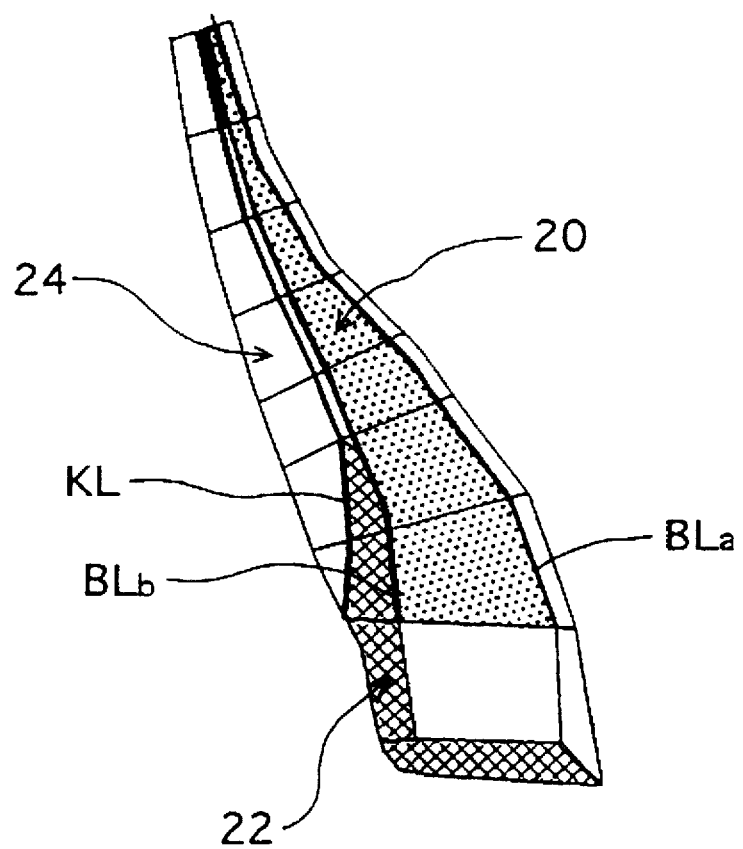
FIG. 15 is a diagram illustrating configurations of a bead filler of the tire and its peripheral components.

In addition, as shown in FIG. 15, design variables are lines BLa, BLb defining an outer configuration (gauge distribution) of a bead filler 20 and a boundary line KL between a rubber chafer 22 and side rubber 24.

It should be noted that, if the aforementioned lines are applied as they are with respect to the design variables in the same way as in the third embodiment, there arises the problem that the lines intersect with each other in the process of optimization. Therefore, the design variables may be determined by using such as the Lagrange interpolation method and the circular interpolation method described in the foregoing embodiments. In addition, a mapping function may be prepared in which a region assumed in predetermined coordinates is formed into a square or the like in different coordinates, so as to map the line.

Then, a description will be given of a fifth embodiment of the present invention. In this embodiment, the determination of the shapes of a plurality of lines illustrated in the third embodiment is applied to the determination of the thickness of belt layers in a belt portion. In this embodiment, the gauge distribution of the belt layers are determined for alleviating the rolling resistance without impairing the durability of the belt portion. Although the procedure of this embodiment is substantially similar to that of the third embodiment, the selection of the objective function, the constraint, and the design variables differs. First, the objective function and the constraint are determined as follows:

Objective function: rolling resistance value
Constraint: Main strains occurring at a ply end and a belt
  end under a load are within +3% of the initial structure.

Figure 16:
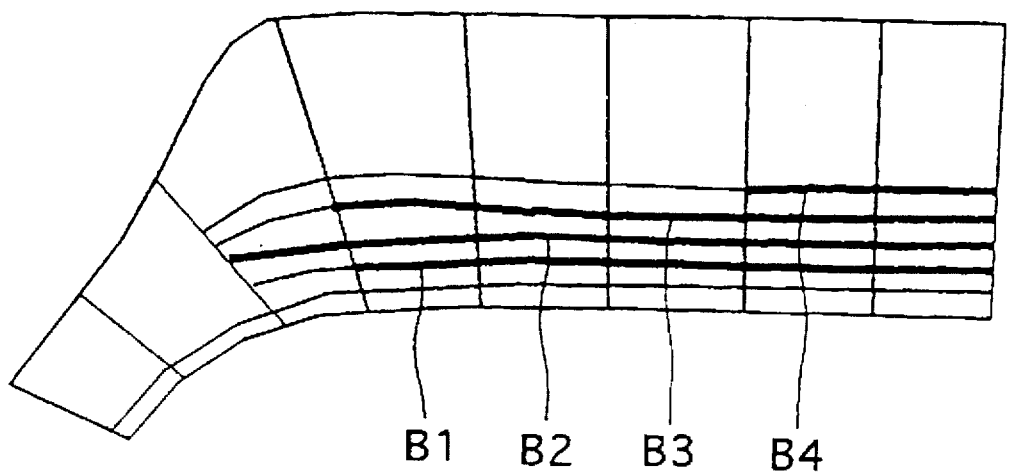
FIG. 16 is a diagram illustrating lines of belt layers.

In addition, as shown in FIG. 16, the design variables are the lines B1, B2, B3, and B4 representing the respective belt layers. As these lines B1 to B4 are changed, the gauge distribution of the belt layers for optimizing the objective function is determined.

In the foregoing embodiments, the Lagrange interpolation method and the circular interpolation method are used as methods of representing the shapes of lines. In addition to these methods, interpolation may be effected by using spline curves, B-spline curves, Bezier curves, NURBS (non-uniform rational B-splines), or the like which are shown in Mathematical Elements for Computer Graphics (by David F. Rogers and J. Alan Adams).

Tires were actually trial-manufactured by combining the above-described fourth and fifth embodiments and were tested, and the results of the test are shown in Table 2 below.

TABLE 2

|  | Conventional Tire | 1st Embodiment |
|---|---|---|
| Time required for design and development | 100 | 55 |
| Rolling resistance value | 100 | 93 |
| Main strain at a ply end | 100 | 102 |
| Main strain at a belt end | 100 | 97 |

Tire size: 165SR13
Internal pressure: 1.9 kg/cm$^2$
Load: 425 kgf
Method of testing the rolling resistance value:
measurement of a resistance value at a speed of 50 km/h during a drum running test under an inertia Next, a description will be given of a sixth embodiment of the present invention. In this embodiment, the present invention is applied to a belt structure, and the durability is improved by minimizing a strain concentration occurring in the belt portion without increasing the weight of the belt portion. Although the procedure of this embodiment is substantially similar to that of the first embodiment shown in FIG. 2, only the portion of the selection of the objective function, the constraint, and the design variables in Step 102 differs. First, the objective function and the constraint are determined as follows:

Objective function: a maximum value of a main strain occurring between the respective belt layers under a load Constraint: The total weight of the belt is within +1% of the total weight of the initial structure.

In addition, the design variables are the angle, placement (e.g., the number of placements and placing strength), and width of each belt layer. Of these design variables, as for the angle and placement, it suffices if their values are directly set as the design variables, and, as for the width, the design variable is determined as follows.

Figure 17:
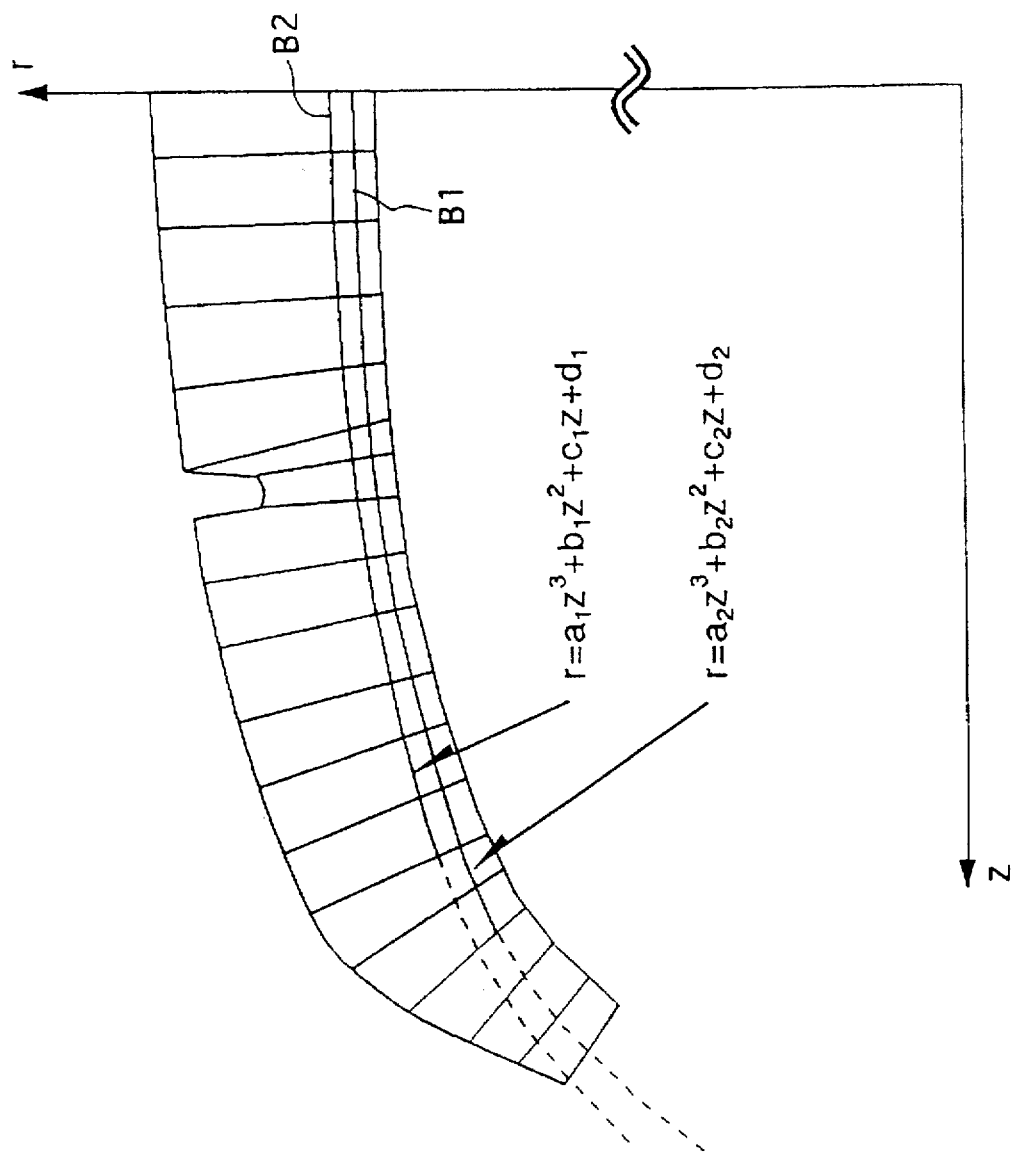
FIG. 17 is a diagram illustrating the approximation of the lines of the belt layers by means of curves.

First, when a basic model of the tire such as the one shown in FIG. 4 is prepared, the line of each belt is approximated by means of, for instance, polynomials by using coordinates of nodes constituting each belt layer. For instance, the lines B1 and B2 are approximated by polynomials, as shown in FIG. 17. In this case, the line B2 is approximated by $$r = a_1 z^3 + b_1 z^2 + c_1 z^1 + d_1$$

while the line B1 is approximated by $$r = a_2 z^3 + b_2 z^2 + c_2 z^1 + d_2$$

In the step of determining the design variables that give an optimum value of the objective function, the nodes constituting the belt layers are moved to points having as z-coordinates values in which z-coordinates in the basic model at the nodes constituting the layer are multiplied by the value of a scale factor set for each belt layer, and having as r-coordinates values obtained by substituting these values into a function approximating that layer. The value of the scale factor for each belt layer is set as the design variable.

Figure 18:
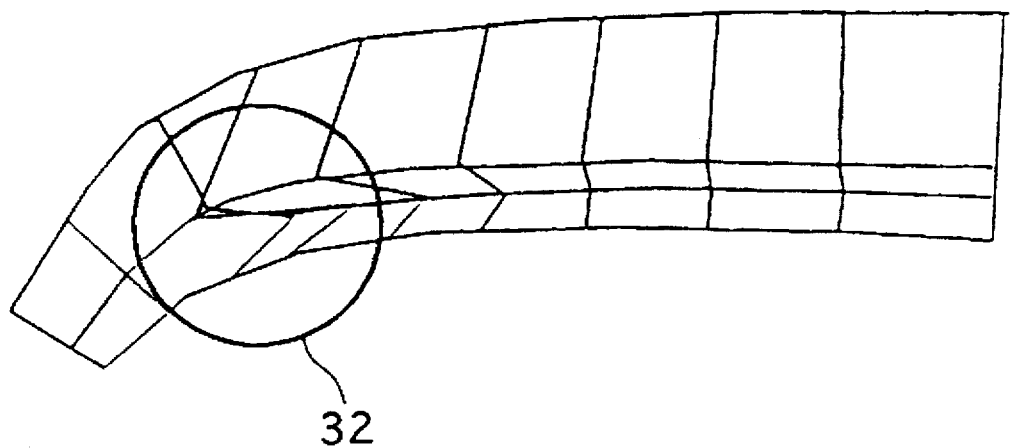
FIG. 18 is a diagram illustrating the distortion of the shapes of elements due to the movement of nodes.
Figure 20A:
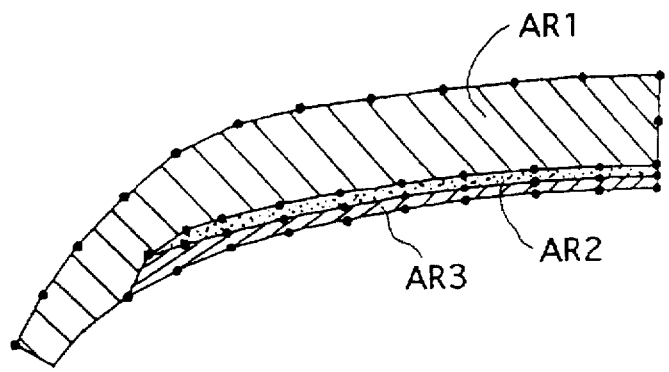
Figure 20B:
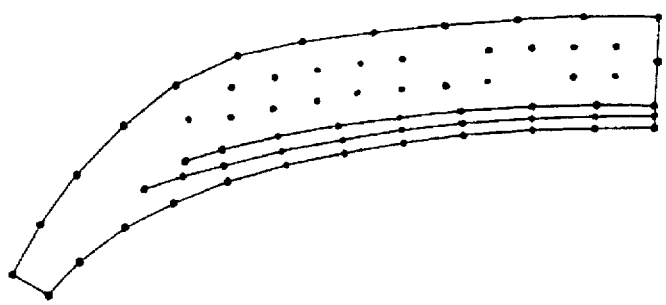
Figure 20C:
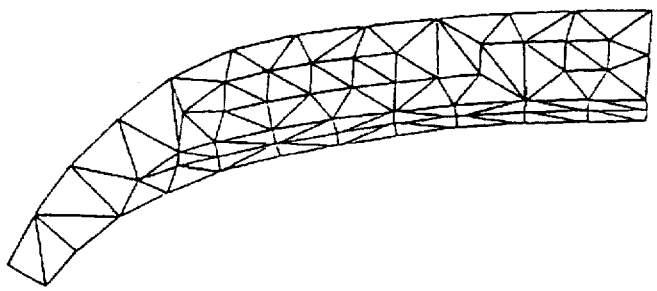
Figure 20D:
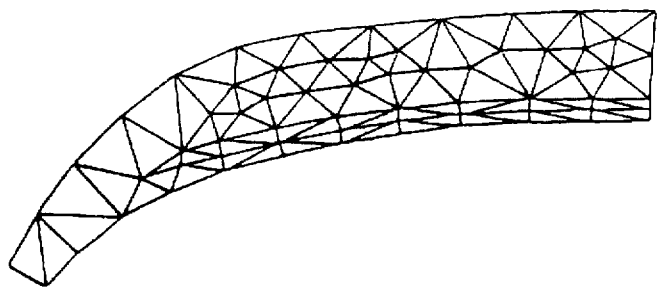

Here, in the case of this embodiment, in a case where modeling by means of the finite element method is carried out, because the nodes constituting each belt layer move due to a change in the width of each belt layer, there is the problem that the shapes of elements are too distorted, as shown by a circle 32 in FIG. 18, making it impossible to continue the calculation. To overcome this problem, at the time of determining a corrected model of the tire in Step 115 in FIG. 2, it suffices to add the routine shown in FIG. 19 for automatically performing the division of elements from the given positions of the nodes. In Step 180 in FIG. 19, data is inputted to define the region including each belt layer. This data includes coordinates of nodes and a parameter of node connectivity mesh coarseness for defining each region. As a result of this data input, in an example in which three regions are defined, it is possible to define regions AR1, AR2, and AR3, as shown in FIG. 20A. In an ensuing Step 182, nodes are generated in each region, as shown in FIG. 20B. In an ensuing Step 184, triangular elements are generated by connecting all the nodes including the generated nodes, as shown in FIG. 20C. In an ensuing Step 186, the smoothing of the nodes in the regions is effected by moving the positions of the nodes in the regions, as shown in FIG. 20D. In an ensuing Step 188, the reduction processing of the band width concerning internal processing, such as renumbering, in the finite element method is effected, and this routine ends.

It should be noted that although, in this embodiment, polynomials are used as the method of representing the configuration of the belt line, it is possible to use the Lagrange interpolation and the circular interpolation used in the first and second embodiments, or spline curves, B-spline curves, Bezier curves, NURBS, or the like.

Tires were actually trial-manufactured in accordance with the above-described sixth embodiment and were tested, and the results of the test are shown in Table 3 below.

TABLE 3

|  | Conventional Tire | Tire of the present invention |
|---|---|---|
| Time required for design and development | 100 | 42 |
| Main strain between belt layers | 100 | 91 |
| Running distance until a failure in drum test | 100 | 120 |
| Total weight of belts | 100 | 101 |

Tire size: TBR10.00R20
Internal pressure: 7.25 kg/cm$^2$
Load: 4050 kgf
Speed: 60 km/h
Drum diameter: 1.7 m It can be appreciated from Table 3 that the durability improves owing to a reduction of the principal strain between belt layers under a load.

Next, a description will be given of a seventh embodiment of the present invention. In this embodiment, the present invention is applied to the determination of the configuration of the tire crown portion. The pressure distribution of a contact area is made uniform and the wear resistance performance is improved without changing the configuration of the area of contact between the tire and the ground. Although the procedure of this embodiment is substantially similar to that of the first embodiment shown in FIG. 2, only the portion of the selection of the objective function, the constraint, and the design variables in Step 102 differs. First, the objective function and the constraint are determined as follows:

Objective function: a standard deviation of a pressure distribution in the contact area Constraint: The contact length in the circumferential direction of the tire at the center of the crown portion and the belt end is within ±5% of the contact length in the initial configuration.

Figure 21:
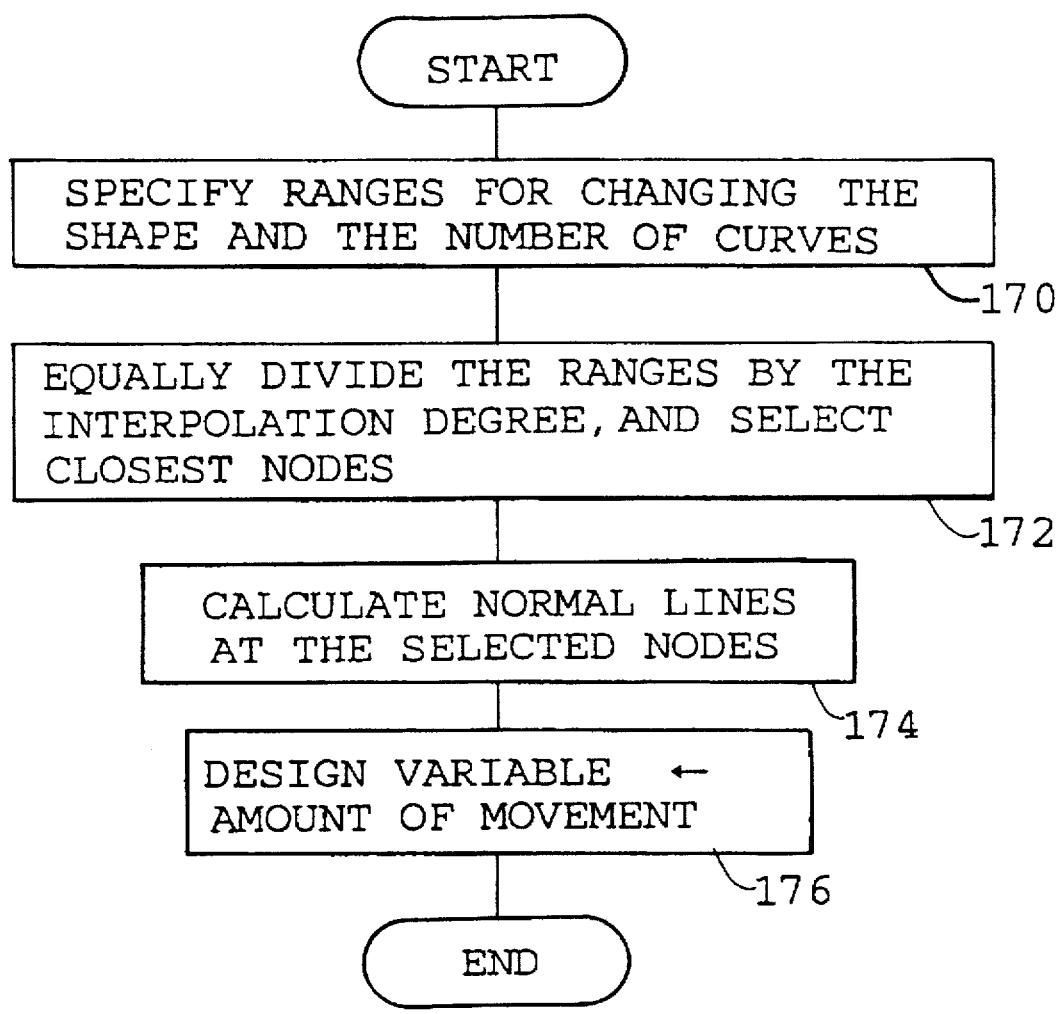
FIG. 21 is a flowchart illustrating a Lagrange interpolation processing routine.
Figure 22:
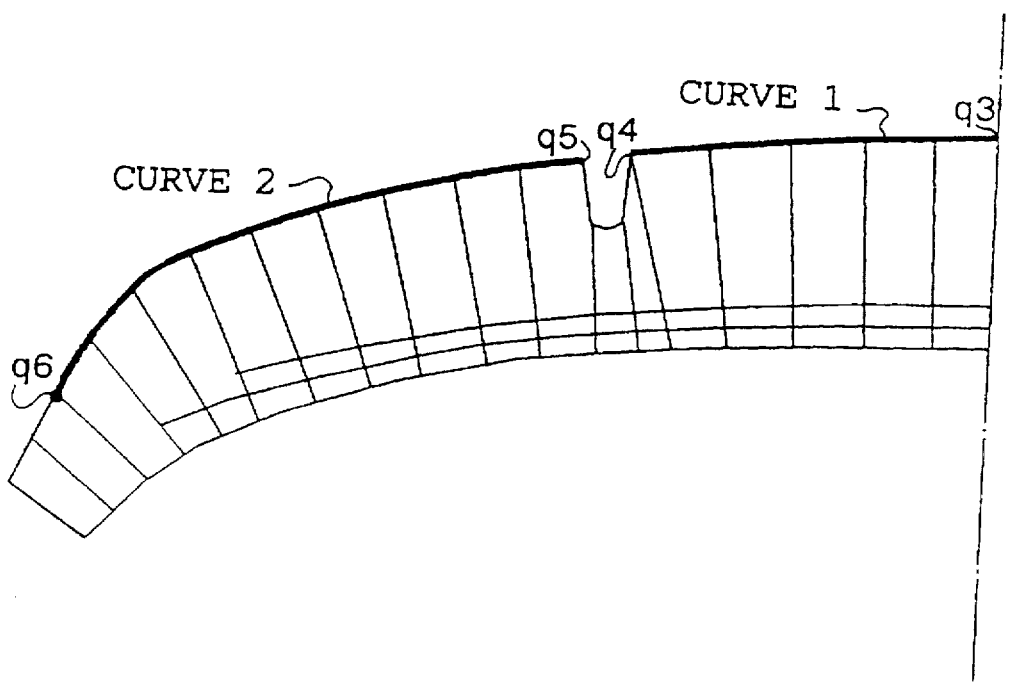
FIG. 22 is a diagram illustrating a crown portion being represented by curves.

Next, the configuration of the crown portion which is a design variable is determined by the Lagrange interpolation routine shown in FIG. 21. In Step 170 of this Lagrange interpolation routine, ranges in which the configuration of the crown portion is changed as well as the number of curves for approximating the ranges are specified. FIG. 22 shows an example in which the configuration of the crown portion is represented by two curves, one ranging from a node q3 at the center of the tire to a node q4 at a groove end and the other ranging from a node q5 at the other groove end to a node q6 in the vicinity of a belt end. However, it goes without saying that, for instance, only one curve ranging from the node q3 to the node q6 may be used, or the region between the node q6 and the node q5 between the node q3 and the node q4 may be further divided to represent the configuration of the crown portion by means of three or more curves.

Figure 23:
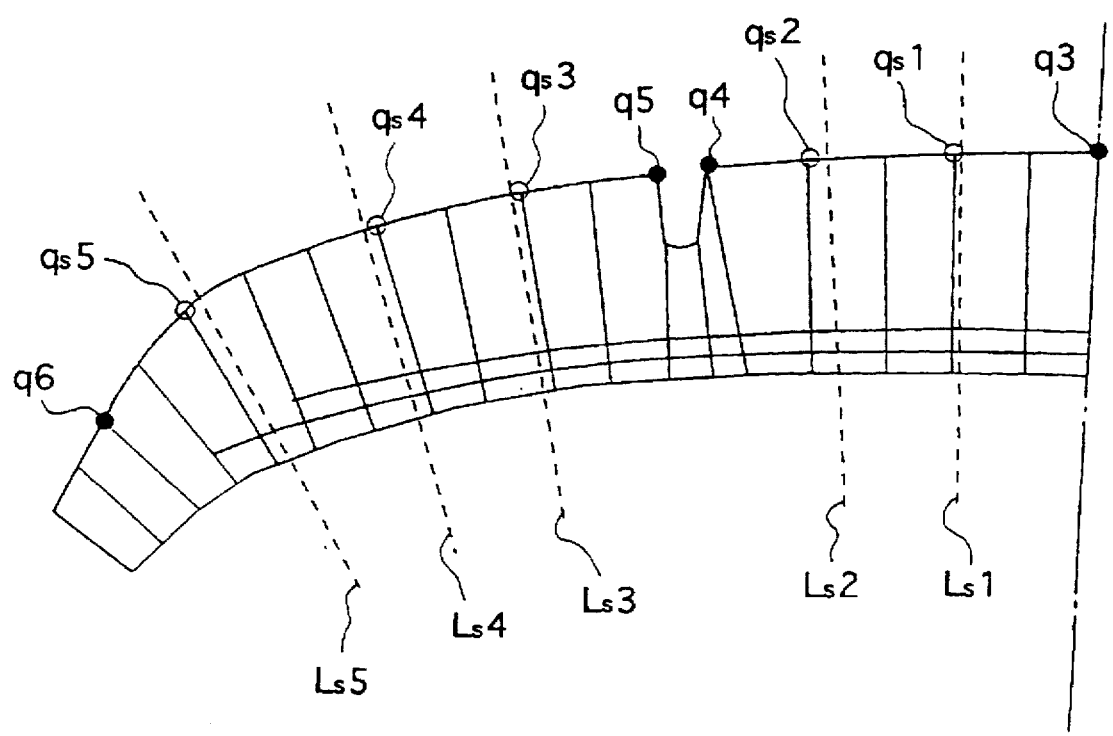
FIG. 23 is a diagram illustrating the crown portion being divided by the number of the degree of the Lagrange interpolation.
Figure 24:
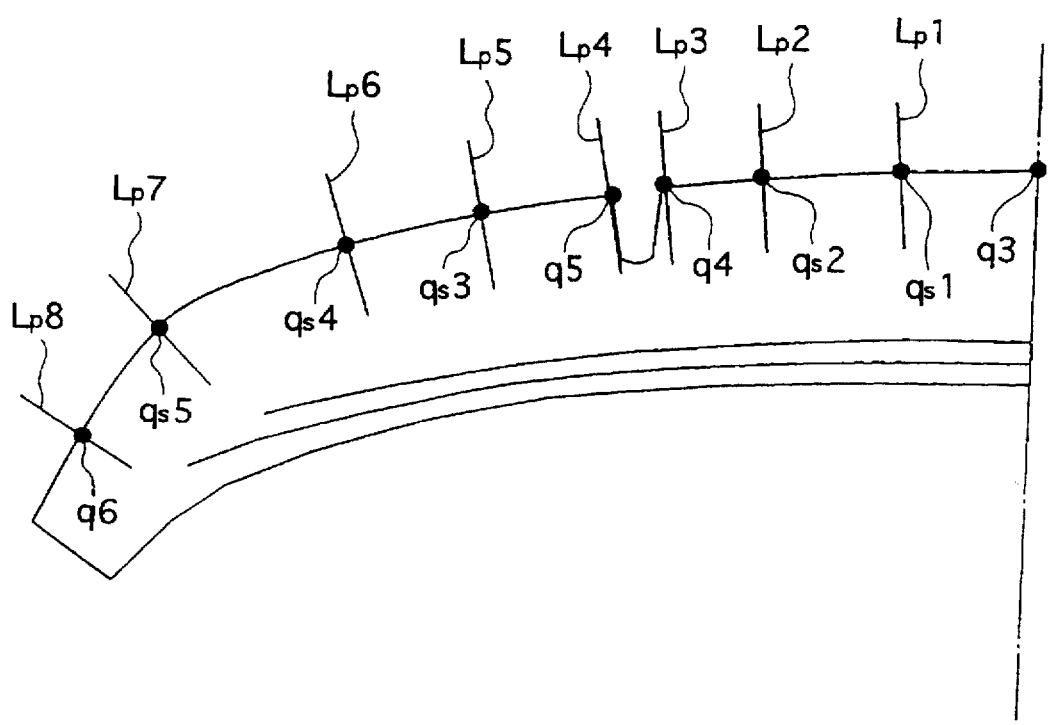
FIG. 24 is a diagram illustrating lines normal to the line of the crown portion.

In an ensuing Step 172, as shown in FIG. 23, the respective ranges are divided equally by the number of the order of Lagrange interpolation inputted in advance, and nodes which are closest to the equally divided points are selected. In the example shown in FIG. 23, the tire is divided equally by dividing lines Ls1, Ls2, Ls3, Ls4, and Ls5, and nodes qs1, qs2, qs3, qs4, and qs5 which are closest to the dividing lines Ls1 to Ls5 are selected. In an ensuing Step 174, lines normal to the crown portion line at the positions of the selected nodes are calculated, and these normal lines are assumed to be lines in which the respective nodes move. In this case, as shown in FIG. 24, normal lines concerning the nodes q3, q4, q5, and q6 representing the ranges of the curves and concerning the nodes qs1, qs2, qs3, qs4, and qs5 selected in Step 172 are calculated to determine lines Lp1 to Lp8. Then, in an ensuing Step 176, amounts of movement of the nodes on these lines from their initial positions are selected as design variables, and this routine ends.

It should be noted that the amounts of movement of the nodes in the crown portion other than the selected nodes are determined by the Lagrange interpolation in the same way as shown in the first embodiment.

Next, a description will be given of an eighth embodiment of the present invention. In this embodiment, the present invention is applied to the determination of the configuration of the tire crown portion in the same way as in the seventh embodiment, but only the design variables differ from those of the seventh embodiment. In addition, although the procedure of this embodiment is substantially similar to that of the first function shown in FIGS. 7A and 7B, only the portion of the selection of the objective function, the constraint, and the design variables in Step 162 differs. First, the objective function and the constraint are determined as follows:

Objective function: a standard deviation of a pressure distribution in the contact area Constraint: The contact length in the circumferential direction of the tire at the center of the crown portion and the belt end is within ±5% of the contact length in the initial configuration.

Figure 25:
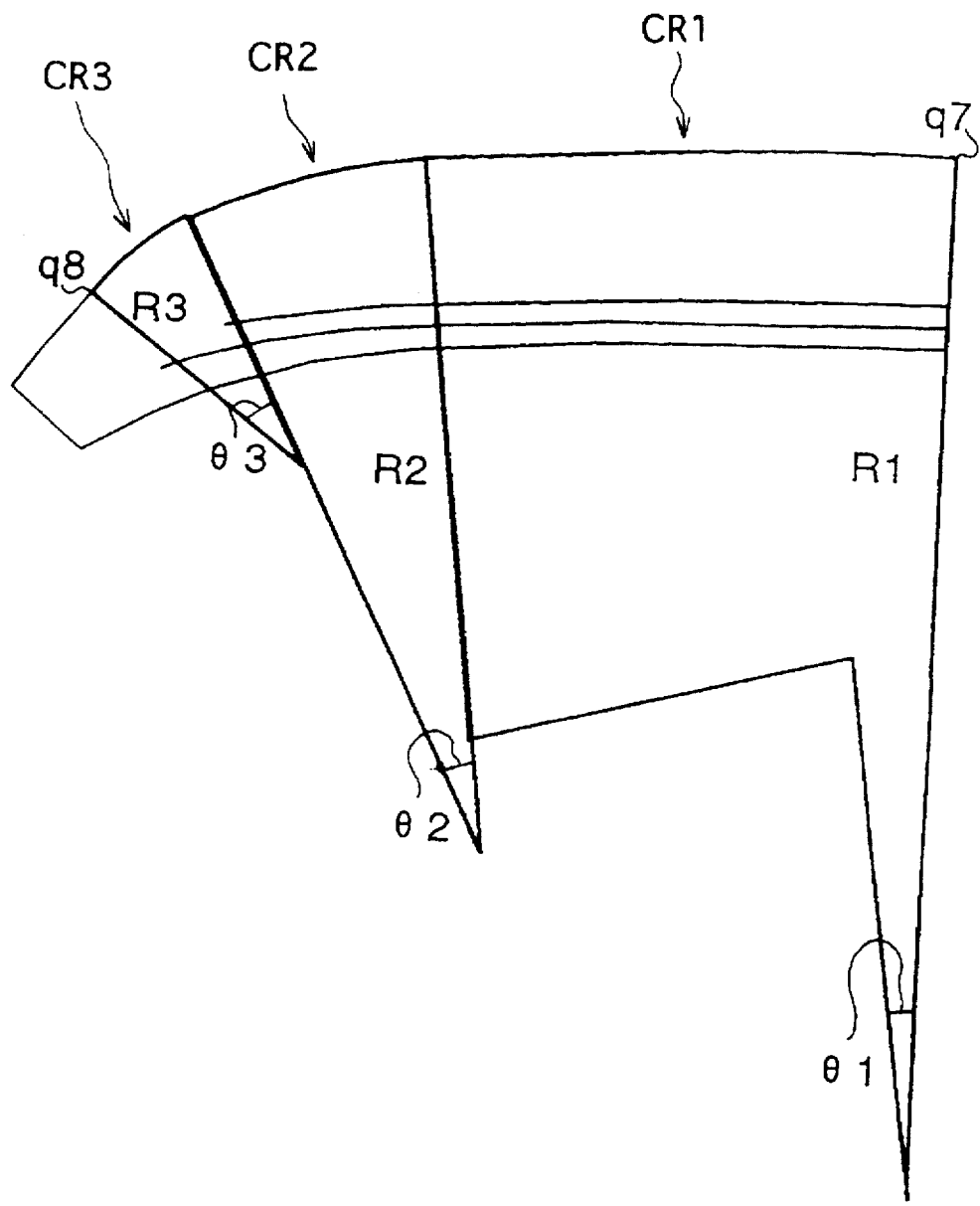
FIG. 25 is a diagram illustrating the configuration of the crown portion being represented by circular arcs.

Next, as for the configuration of the crown portion which is the design variable, the ranges of the crown portion specified in advance are approximated by a plurality of circular arcs. For instance, as shown in FIG. 25, the configuration of the crown portion is represented by three circular arcs with respect to the ranges of an approximatable crown portion from a node q7 at the tire center to a node q8 in the vicinity of the belt end, i.e., in this case, three regions including ranges CR1, CR2, and CR3. The range CR1 can be approximated at a radius of R1 and an angle of $\theta1$; the range CR2 can be approximated at a radius of R2 and an angle of $\theta2$; and the range CR3 can be approximated at a radius of R3 and an angle of $\theta3$.

Figure 26:
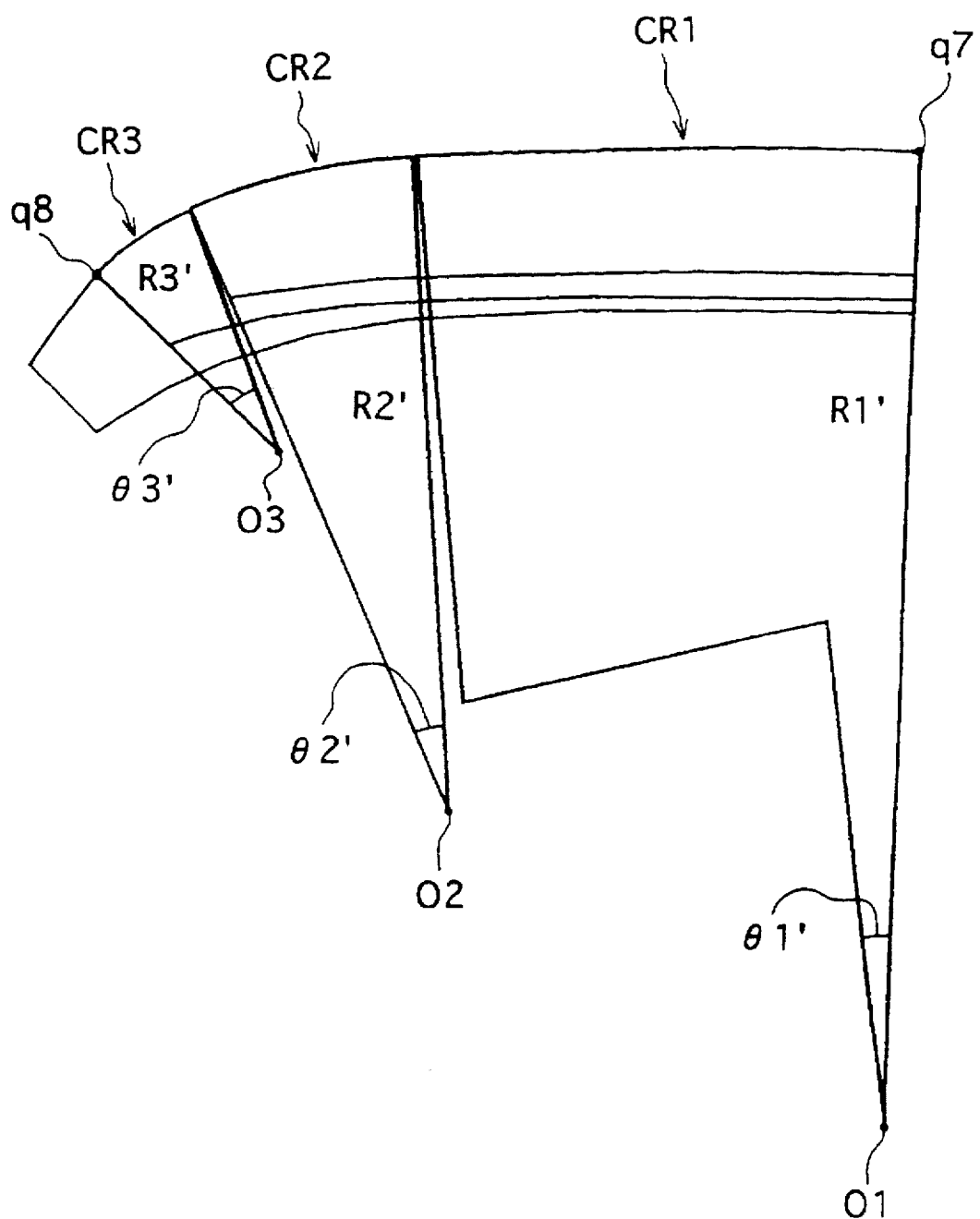
FIG. 26 is a diagram illustrating the configuration of the crown portion being represented by circular arcs due to independent central coordinates.

The above-described example in FIG. 25 shows that the configuration of the crown portion is represented by three circular arcs in the range from the node q7 at the tire center to the node q8 in the vicinity of the belt end. However, it goes without saying that the number of the circular arcs may be 1 or 2, or 4 or more. In addition, the circular arcs need not necessarily be smoothly continuous, and coordinates at the center of each circular arc may be handled as independent variables, as shown in FIG. 26. That is, the range CR1 is approximated at a radius of R1' from a coordinate point O1 (r1, z1) and an angle of $\theta1$'; the range CR2 is approximated at a radius of R2' from a coordinate point O2 (r2, z2) and an angle of $\theta2$'; and the range CR3 is approximated at a radius of R3' from a coordinate point O3 (r3, z3) and an angle of $\theta3$'. Furthermore, a radius Ri and an ascending angle $\theta$i of each circular arc and coordinates ri, zi at the center of each circular arc in the case of the example shown in FIG. 26 are additionally included as design variables.

It should be noted that although, in the seventh and eighth embodiments, the Lagrange interpolation and the circular interpolation are used as methods of representing the configuration of the crown portion, it is possible to use spline curves, B-spline curves, Bezier curves, NURBS, or the like.

Next, a description will be given of a ninth embodiment of the present invention. In this embodiment, the present invention is applied to the determination of the configuration of the pattern surface of a tire. The pressure distribution at a time when the pattern is in contact with the ground is made uniform, and the wear resistance performance is improved. Although the procedure of this embodiment is substantially similar to that of the first embodiment shown in FIG. 2, only the portion of the selection of the objective function, the constraint, and the design variables in Step 102 differs. First, the objective function and the constraint are determined as follows:

Objective function: a standard deviation of a pressure distribution in the contact area Constraint: The total volume of the pattern is within ±5% of the initial volume.

Figure 27:
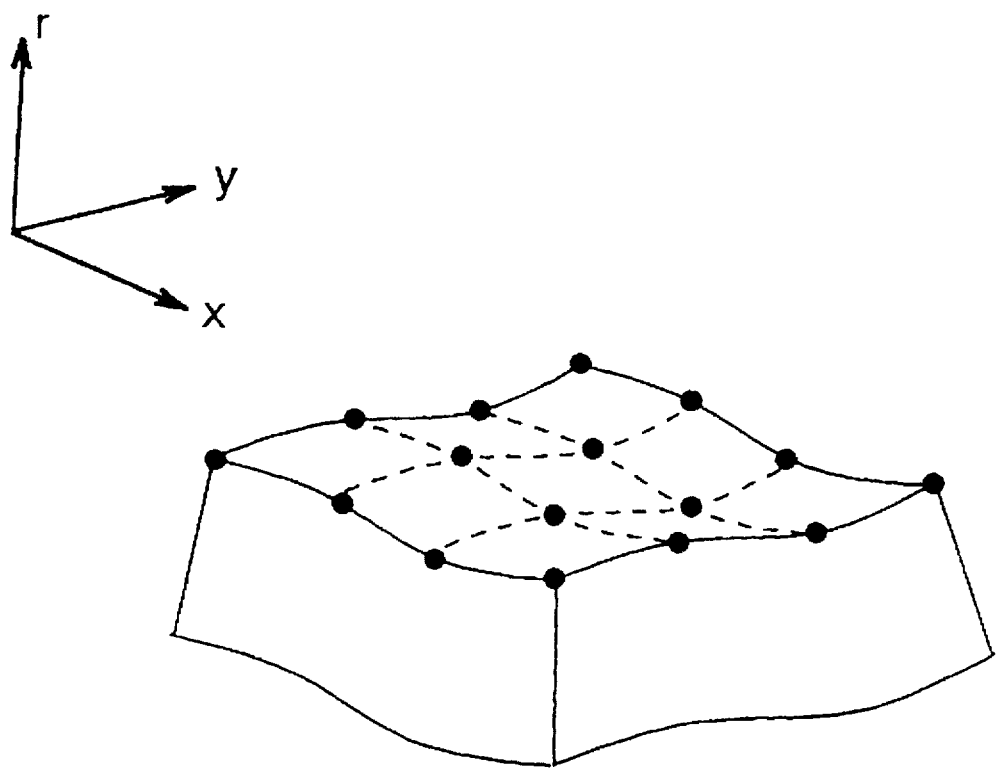
FIG. 27 is a diagram illustrating a pattern surface being divided into the form of a lattice in accordance with the degree of the Lagrange interpolation.
Figure 28:
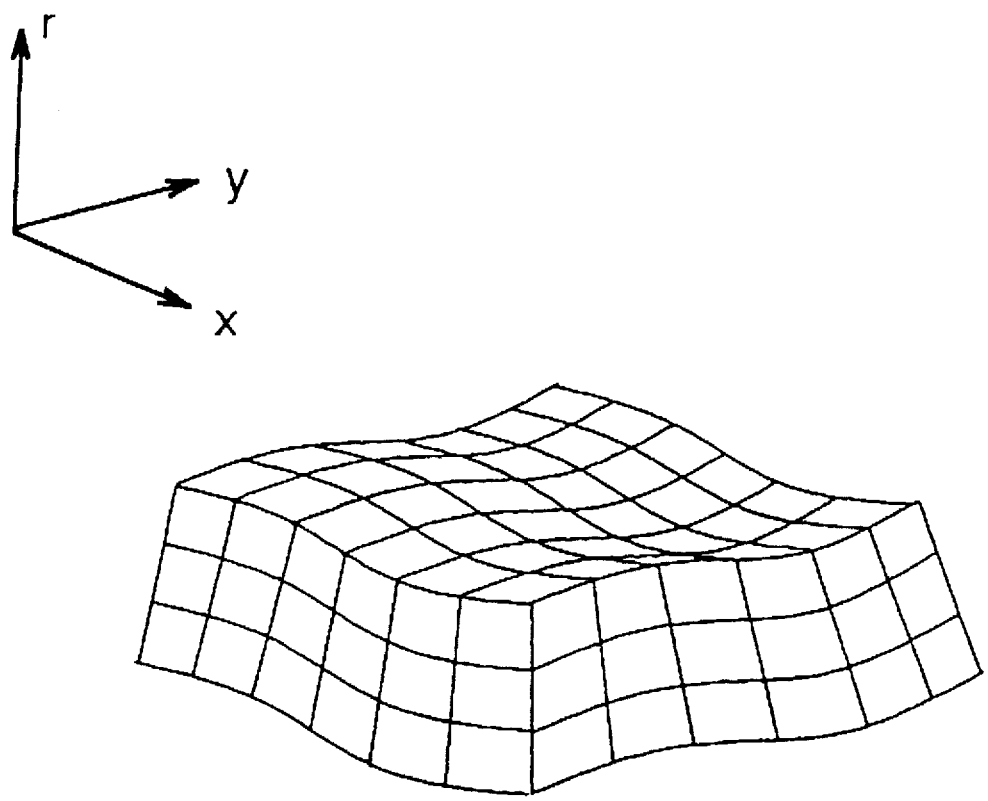
FIG. 28 is a diagram illustrating the subdivision of the pattern surface.

With respect to the configuration of the pattern surface which is the design variable, the pattern surface is divided into the form of a lattice in accordance with the order of Lagrange interpolation inputted in advance, as shown in FIG. 27. The coordinate $r_i$ in the direction of the pattern thickness at each point (16 points in the example of FIG. 27) thus obtained is set as the design variable. In a case where the finite element method is used in the calculation of the objective function, there is a need to further subdivide the pattern surface. For example, in the case of FIG. 28 in which the pattern surface shown in FIG. 27 is subdivided, the coordinates of nodes other than the nodes corresponding to the design variable on the pattern surface may be calculated in accordance with the following formulae:

$$x = \sum_{i=1}^{n} M_i \cdot x_i$$

$$y = \sum_{i=1}^{n} M_i \cdot y_i$$

$$r = \sum_{i=1}^{n} M_i \cdot r_i$$

Here, $$M_i \equiv M_{em} = N_e(\xi) \cdot N_m(\eta)$$

$$N_e(\xi) = \prod_{\substack{j=1 \\ j \neq e}}^{k_1} (\xi - \xi_j) / \prod_{\substack{j=1 \\ j \neq e}}^{k_1} (\xi_e - \xi_j),$$

$$N_m(\eta) = \prod_{\substack{j=1 \\ j \neq m}}^{k_2} (\eta - \eta_j) / \prod_{\substack{j=1 \\ j \neq m}}^{k_2} (\eta_m - \eta_j)$$

where, $n = k_1 \cdot k_2$ $k_1$: order of Lagrange interpolation in the x-direction+1
$k_2$: order of Lagrange interpolation in the y-direction+1

As a result, the determination and correction of the configuration of the pattern surface corresponding to Steps 108 and 115 in FIG. 2 become possible. It should be noted that although the Lagrange interpolation is used as a method of representing the configuration of the pattern surface it is possible to alternatively use such as the Bezier curved surface, B-spline curved surface, or the Coons curved surface which are shown in Mathematical Elements for Computer Graphics mentioned above. Parameters for controlling them may be directly selected as design variables.

The foregoing embodiments need not be carried out independently. For instance, various combinations are possible such as by carrying out the determination of the ply lines in the first embodiment and the determination of the belt structure in the sixth embodiment, or by carrying out the determination of the configuration of the crown portion in the seventh embodiment by using the ply lines determined in the first embodiment.

Tires obtained by combining the seventh and ninth embodiments were actually trial-manufactured, and were mounted on a vehicle as right-hand front wheels. After the vehicle was run 10,000 km on a general road, and the results of investigating the ratio of amounts of wear (shoulder wear) between the tread center and a tread side end are shown in Table 4 below.

TABLE 4

|  | Conventional Tire | Tire of the present invention |
|---|---|---|
| Time required for design and development | 100 | 36 |
| Ratio of amounts of wear (wear at side end/wear at center portion) | 2.65 | 1.50 |
| Standard deviation of pressure distribution | 100 | 41 |

Tire size: 205/60HR15
Internal pressure: 2.0 kg/cm²

It can be appreciated from Table 4 that the shoulder wear resistance improves owing to the fact that the pressure distribution is made uniform.

Next, a description will be given of a 10th embodiment in which the configuration of a carcass line is designed genetically by means of an algorithm so as to render the belt tension in the circumferential direction of the tire when inflated with air a maximum value, i.e., an optimum value, in order to improve steering stability. It should be noted that since the arrangement of this embodiment is substantially similar to that of the above-described embodiments, identical portions will be denoted by the same reference numerals, and a detailed description thereof will be omitted.

Figure 29A:
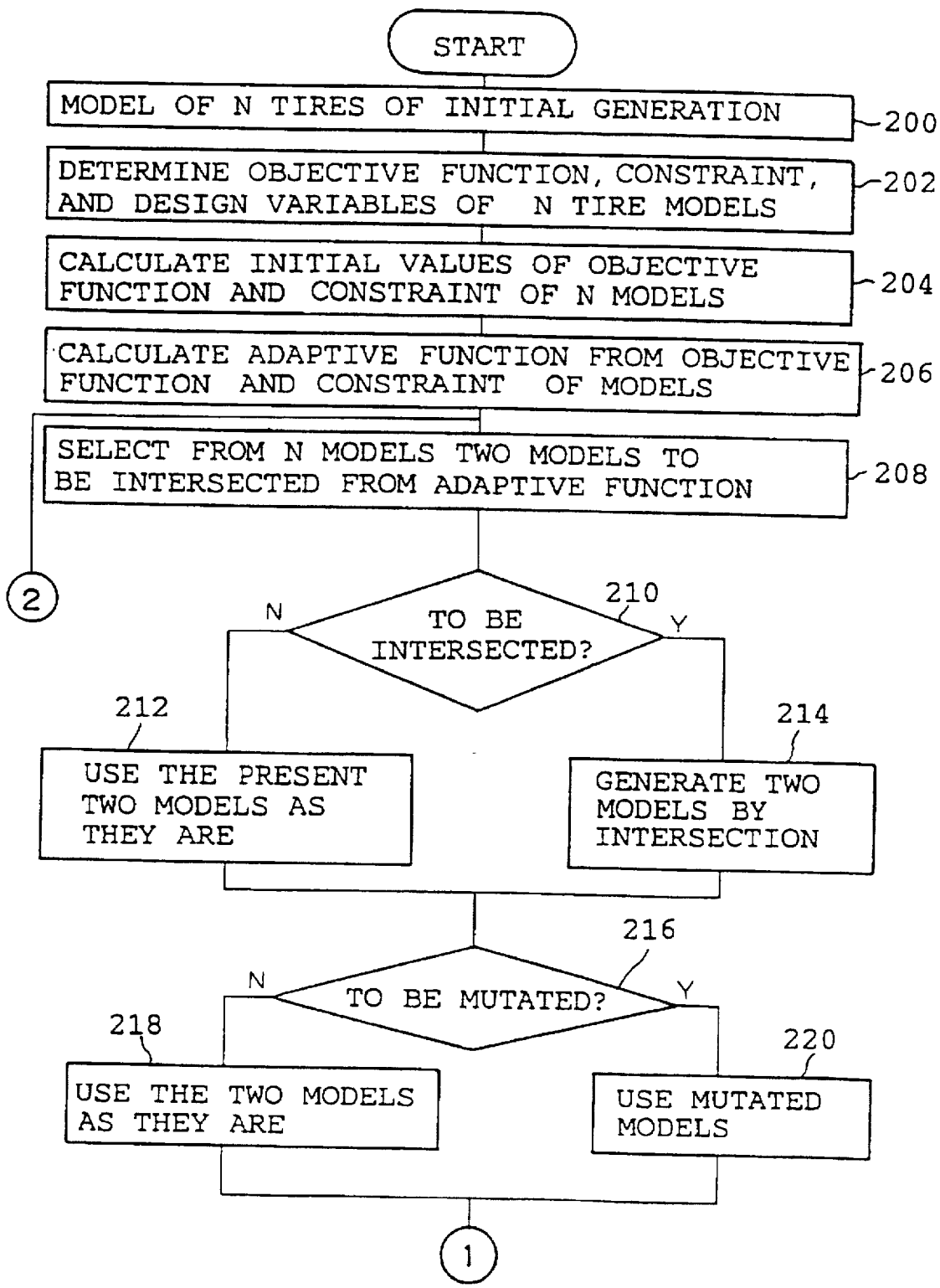
FIGS. 29A and 29B are flowcharts illustrating a processing routine in accordance with a 10th embodiment of the present invention.
Figure 29B:
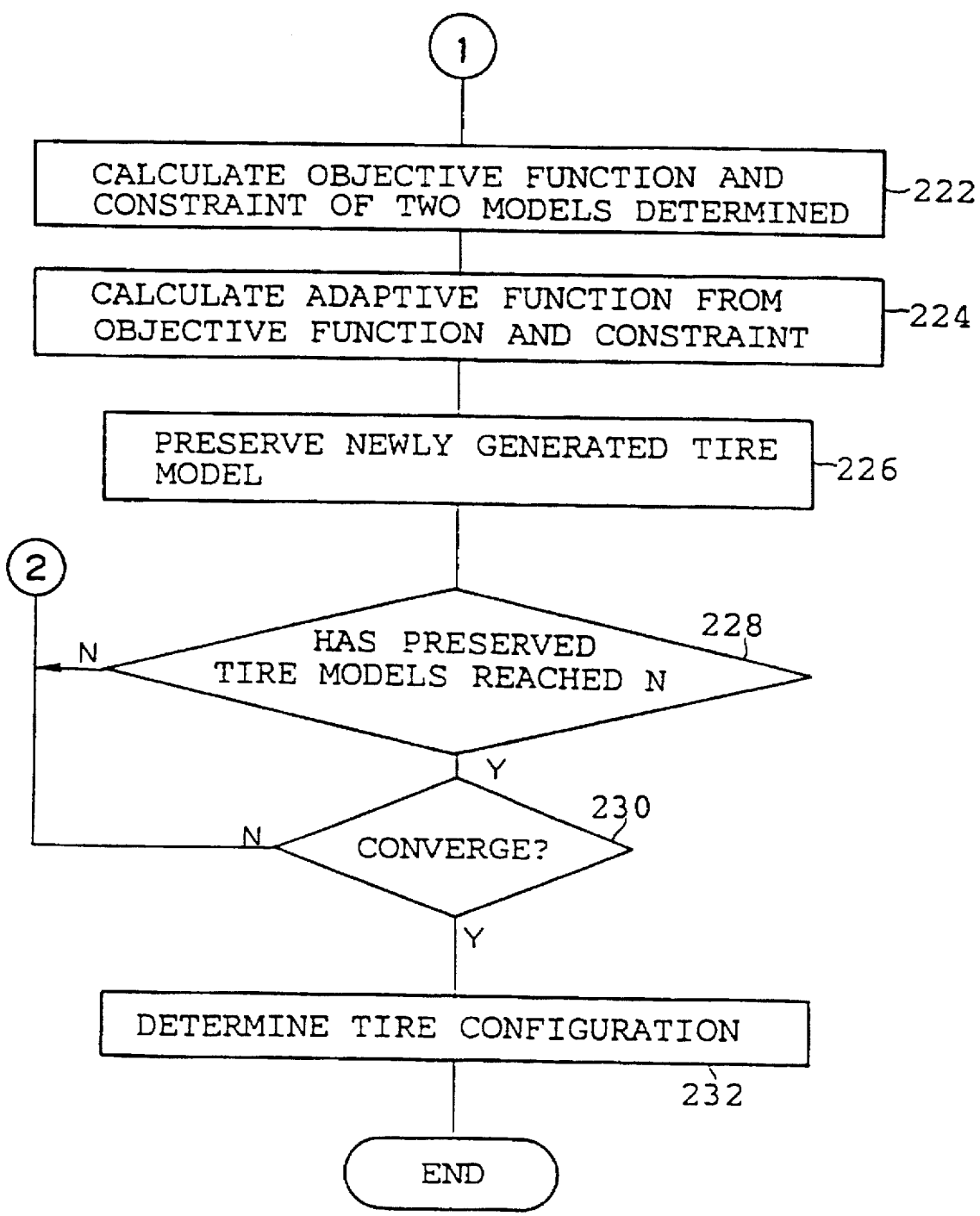

FIGS. 29A and 29B show a program processing routine in accordance with the 10th embodiment. In Step 200, cross-sectional configurations of N tires are subjected to modeling by a technique which is capable of numerically and analytically determining the belt tension in the circumferential direction of the tire when inflated with air such as by the finite element method, and a basic model of the tire including its internal structure is determined. The term modeling referred to herein means the numerical representation of the shape, structure, materials, and pattern of the tire into a format of input data for a computer program prepared according to a numerical and analytical technique. It should be noted that N is inputted in advance by the user. The basic model of the tire used in this embodiment is identical to the one shown in FIG. 4 illustrating the first embodiment. It should be noted that, in the same way as in the first embodiment, the basic model of the tire may be divided into a plurality of elements by a plurality of lines normal to a line representing an outer configuration of the tire or by a plurality of lines normal to a turn-up ply line, or may be divided into arbitrary shapes such as triangles depending on a design objective.

In an ensuing Step 202, an objective function representing a physical amount for evaluating tire performance, a constraint for constraining the cross-sectional shape of the tire, and design variables determining the cross-sectional shapes of N tire models are determined. In this embodiment, the objective function OBJ and the constraint G are defined as follows in order to design the configuration of the carcass line for maximizing the belt tension in the circumferential direction of the tire when inflated with air:

Objective function OBJ: the sum total, in the widthwise direction of the tire, of components of the belt tension acting in the circumferential direction of the tire Constraint G: A periphery value of the carcass line is within ±5% of a set value.

It should be noted that the aforementioned periphery value of the carcass line can be calculated as the sum total of distances between nodes (points of intersection between the carcass line and the respective normal line) in the carcass line which are located in a domain that changes the tire shape.

In addition, the configuration of the carcass line, which is a design variable, is determined by the Lagrange interpolation routine, shown in FIG. 3, for approximating a curve with respect to the N tire models, respectively. Since this Lagrange interpolation routine is identical to that of the first embodiment, a description thereof will be omitted.

By repeating the Lagrange interpolation routine N times, the objective function OBJ, the constraint G, and respective design variables $r_{iJ}$ (J=1, 2, . . . , N) of the N tire models are determined. Subsequently, in Step 204 in FIG. 29, objective functions $OBJ_J$ and constraints $G_J$ are calculated for the respective design variables $r_{iJ}$ of the N tire models.

In an ensuing Step 206, by using the objective functions $OBJ_J$ and constraints $G_J$ of the N tire models determined in Step 204, adaptive functions $F_J$ of the N tire models are calculated in accordance with the following Formulae (4). In this embodiment, the value of the fitness function (degree of adaptation) becomes larger as the belt tension becomes larger so as to maximize the belt tension.

$$\Phi_j = -OBJ_j + \gamma \cdot \max(G_j, O) \quad F_j = -\Phi_j \qquad (4)$$

or $$F_j = 1/\Phi_j$$

or $$F_j = -a\Phi_j + b$$

where, $$a = \frac{\Phi_{avg}(c-1)}{(\Phi_{avg} - \Phi_{min})}$$

$$b = \frac{\Phi_{avg}(c - \Phi_{min})}{(\Phi_{avg} - \Phi_{min})}$$

$$\Phi_{avg} = \frac{\sum_{j=1}^{N} \Phi_j}{N}$$

c: constant

γ: penalty coefficient $\Phi_{min}$: min($\Phi_1, \Phi_2, \ldots, \Phi_N$)

$\Phi_j$: penalty function of a J-th tire model among the N tire models (J=1, 2, 3, ..., N)

It should be noted that c and γ are inputted in advance by the user.

In an ensuing Step 208, two models to be crossed over each other are selected from among the N models. As the method of selection, an adaptation-degree proportional strategy, which is generally known, is used. A probability P1 with which certain individuals 1 among the N tire models are each selected in the selection is expressed by the following formula:

$$P_1 = \frac{F_1}{\sum_{j=1}^{N} F_j}$$

where, $F_1$: fitness function of a certain individual among the N tire models $F_j$: J-th fitness function among the N tire models (J=1, 2, 3, ..., N)

Although, in the above-described embodiment, the adaptation-degree proportional strategy is used as the method of selection, it is possible to alternatively use an expected-value strategy, a rank strategy, an elite preservation strategy, a tournament selection strategy, a GENITOR algorithm, or the like, as shown in "Genetic Algorithms" (edited by Hiroaki Kitano).

In an ensuing Step 210, a determination is made as to whether or not the two selected tire models are to be crossed over each other by a probability T inputted in advance by the user. The term crossover used herein means the exchange of certain elements of two tire models, as will be described later. If NO is the answer in the determination and crossover is not be carried out, in Step 212, the present two tire models are kept intact, and the operation proceeds to Step 216. Meanwhile, if YES in the answer in the determination and crossover is to be carried out, in Step 214, the two tire models are crossed over each other, as will be described later.

Figure 30:
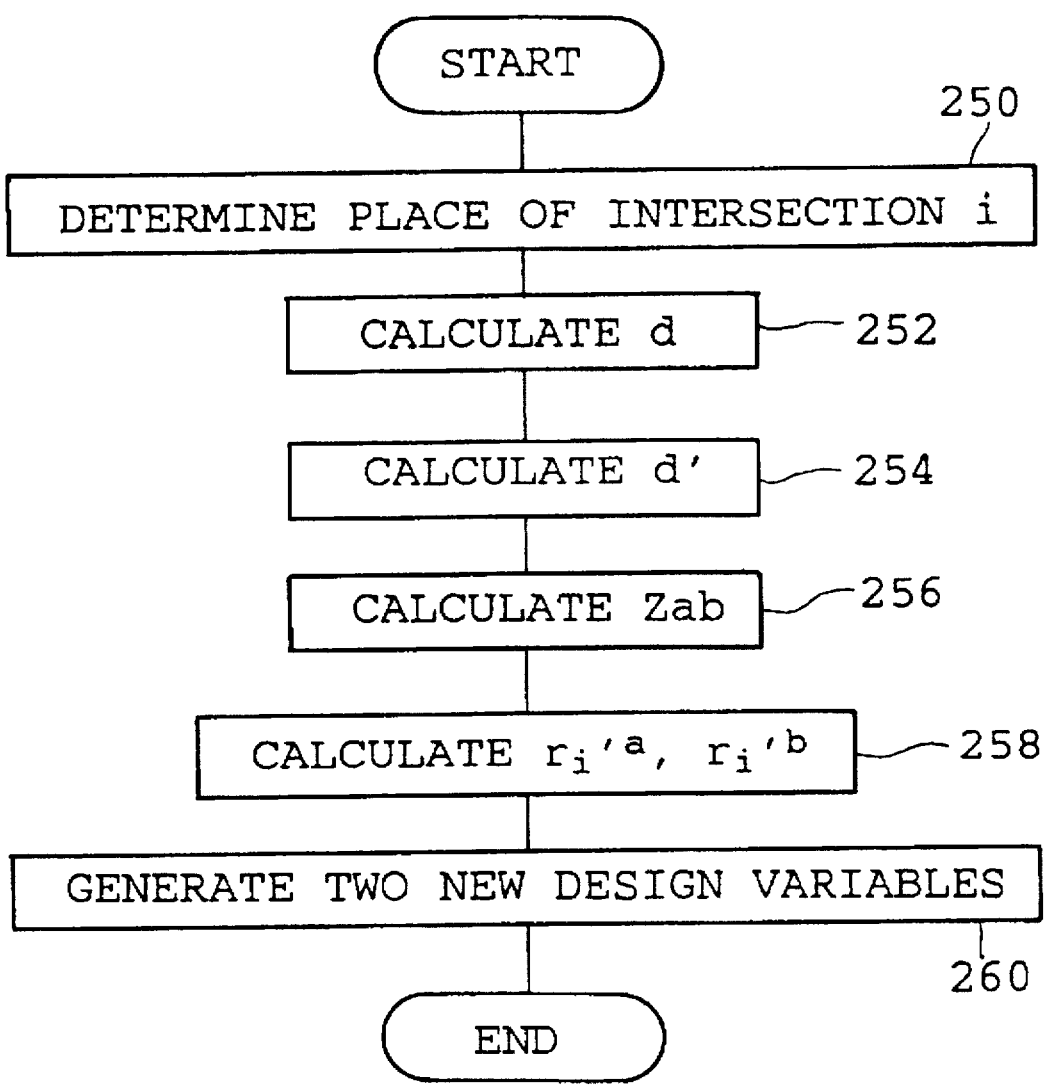
FIG. 30 is a flowchart illustrating an intersection processing routine.

The crossover of the two tire models is carried out in accordance with an intersecting routine shown in FIG. 30. First, the two tire models selected in Step 208 are set as a tire model a and a tire model b, and the design variables of the tire models a and b are expressed by design variable vectors including lists. The design variable vectors of the tire model a are set as $V_r^a = (r_1^2, r_2^a, \ldots, r_i^a, \ldots, r_{n-1}^a)$, while the design variable vectors of the tire model b are set as $Vr^b = (r_1^b, r_2^b, \ldots, r_i^b, \ldots, r_{n-1}^b)$. In Step 250 in FIG. 30, predetermined random numbers are generated, and a point of crossover i concerning the design variable vectors of the tire models a, b is determined in accordance with the random numbers.

In an ensuing Step 252, a distance d is determined in accordance with the following formula with respect to the design variables $r_1^a$, $r_1^b$ of the tire models a, b which are determined to cross over each other:

$$d = |r_i^a - r_i^b|$$

In an ensuing Step 254, a normalized distance d' is determined in accordance with the following formula by using a minimum value $B_L$ and a maximum value $B_U$ which fall in ranges that can be assumed by $r_1^a$, $r_1^b$.

$$d' = \frac{d}{B_U - B_L}$$

Figure 31A:
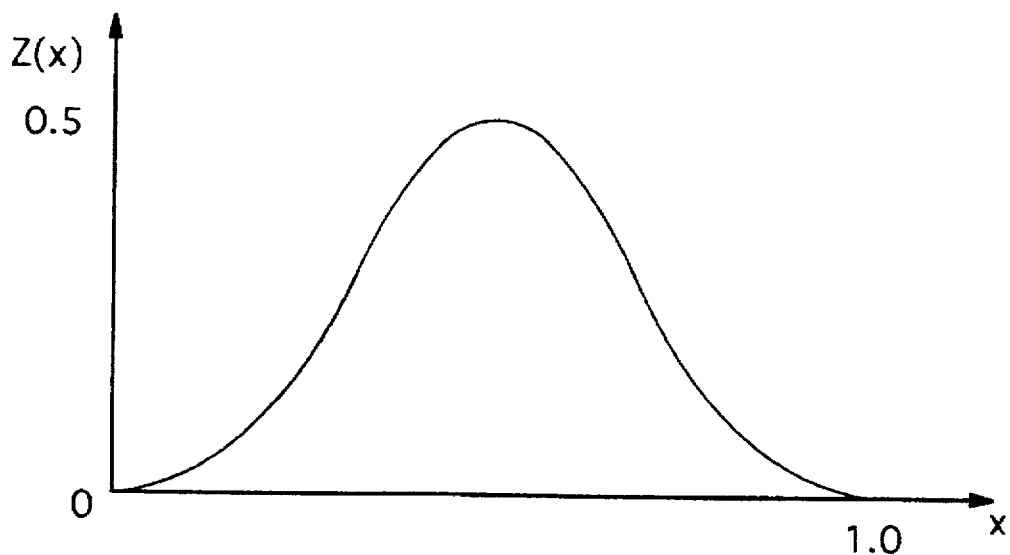
Figure 31B:
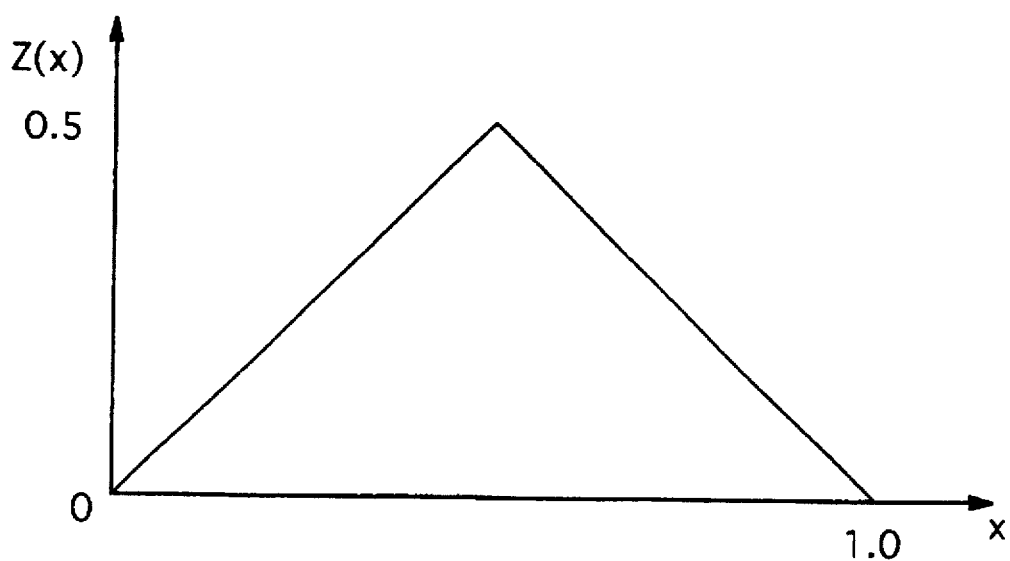

In Step 256, to disperse the values of the normalized distance d' appropriately, a function $Z_{ab}$ is determined in accordance with the following formula by using a chevron-shaped mapping function Z(x) (0≤x≤1, 0≤Z(x)≤0.5) such as the one shown in FIG. 31A or FIG. 31B:

$$Z_{ab} = Z(d')$$

After the function $Z_{ab}$ is thus determined, new design variables $r_i'^a$, $r_i'^b$ are determined in accordance with the following formulae in Step 258.

$$r_i'^a = r_i^a - \frac{\min(|r_i^a - B_L|, |r_i^a - B_U|)}{0.5} \cdot Z_{ab}$$

$$r_i'^b = r_i^b + \frac{\min(|r_i^b - B_L|, |r_i^a - B_U|)}{0.5} \cdot Z_{ab}$$

or $$r_i'^a = r_i^a + \frac{\min(|r_i^a - B_L|, |r_i^a - B_U|)}{0.5} \cdot Z_{ab}$$

$$r_i'^b = r_i^b - \frac{\min(|r_i^b - B_L|, |r_i^a - B_U|)}{0.5} \cdot Z_{ab}$$

After $r_i'^a$ and $r_i'^b$ are thus determined, in Step 260, design variable vectors $Vr'^a$ and $Vr'^b$ which are lists of new design variables are determined as follows:

$$Vr'^a = (r_1^a, r_2^a, \ldots, r_i'^a, r_{i+1}^b, \ldots, r_{n-1}^b)$$

$$Vr'^b = (r_1^b, r_2^b, \ldots, r_i'^b, r_{i+1}^a, \ldots, r_{n-1}^a)$$

It should be noted that the minimum value $B_L$ and the maximum value $B_u$ which fall in ranges that can be assumed by $r_1^a$, $r_1^b$ are inputted in advance by the user. In addition, the mapping functions Z(x) may be trough-shaped functions such as those shown in FIGS. 32A and 32B. Although there is only one point of crossover i in the above-described example, it is possible to alternatively use a multipoint crossover or uniform crossover such as those shown in "Genetic Algorithms" (edited by Hiroaki Kitano).

After two new tire models are generated by such a crossover, in Step 216 in FIG. 29A, a determination is made as to whether or not a mutation is to take place at a probability S inputted in advance by the user. The term mutation referred to herein means changing a portion of the design variable by an infinitesimal degree, and is aimed at enhancing the probability of including a population capable of assuming optimum design variables. If NO is the answer in the determination in Step 216 and a mutation is not to take place, in Step 226, the present two tire models are kept intact, and the operation proceeds to an ensuing Step 222. If YES is the answer in the determination and a mutation is to take place, mutation processing is carried out as follows in an ensuing Step 220.

Figure 33:
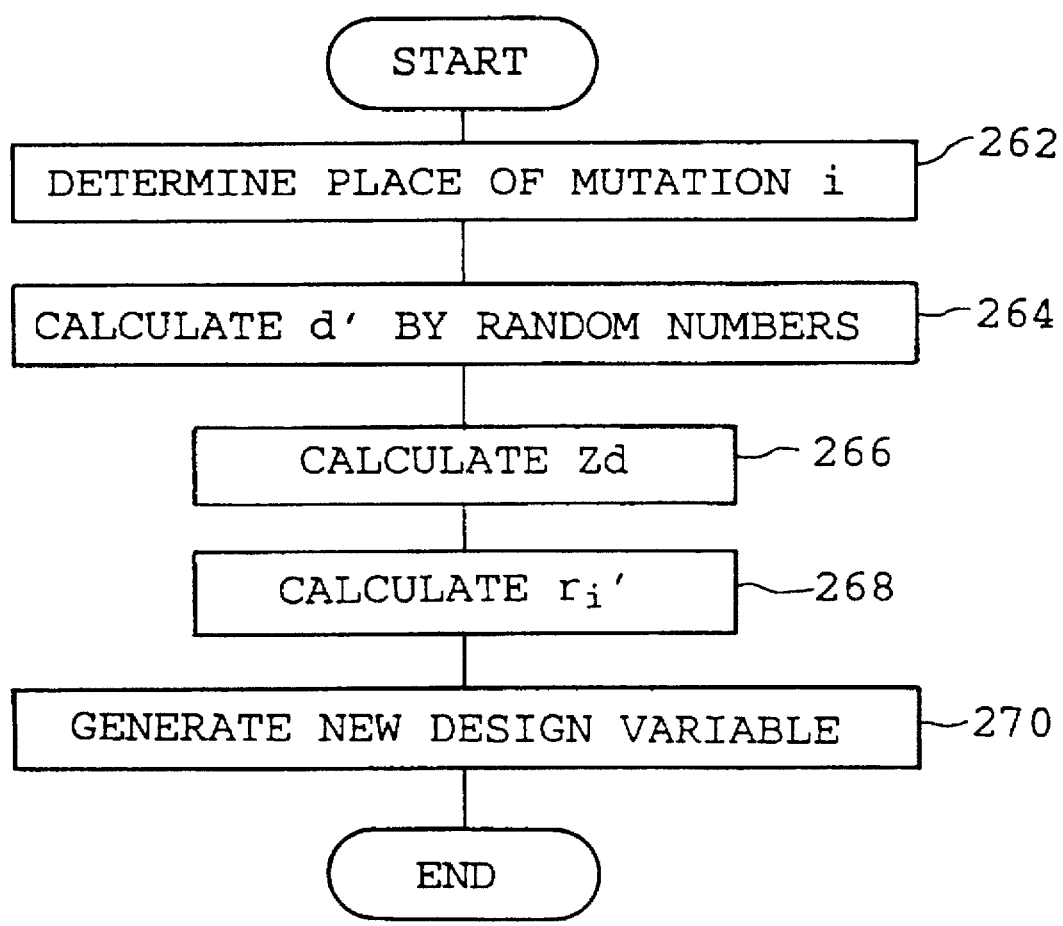
FIG. 33 is a flowchart illustrating a mutation processing routine.

This mutation is carried out by a mutation routine shown in FIG. 33. First, in Step 262, random numbers are generated, and the place of mutation i is determined by the random numbers. In an ensuing Step 264, the distance d' is determined by the random numbers in the following range:

$$0 \leq d' \leq 1$$

Figure 32A:
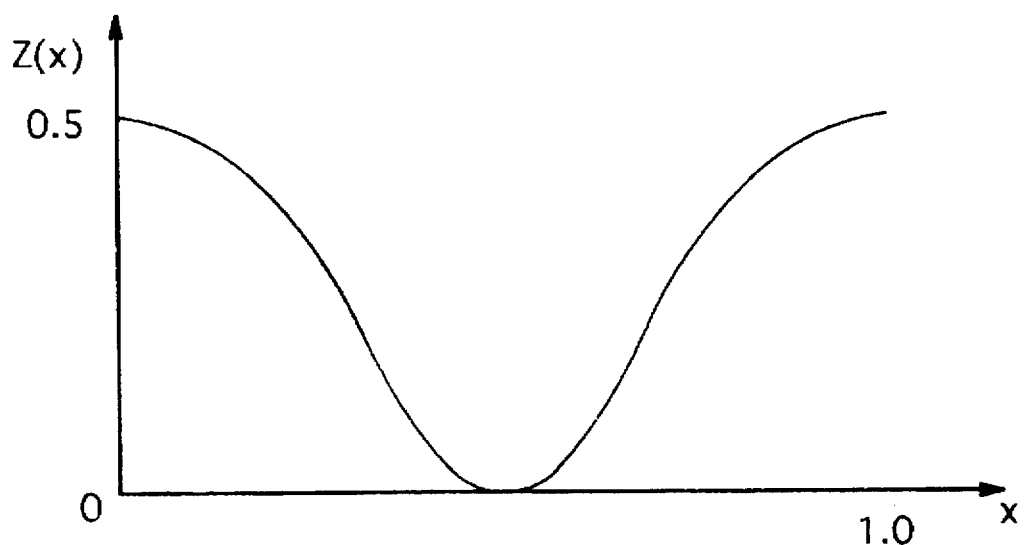
Figure 32B:
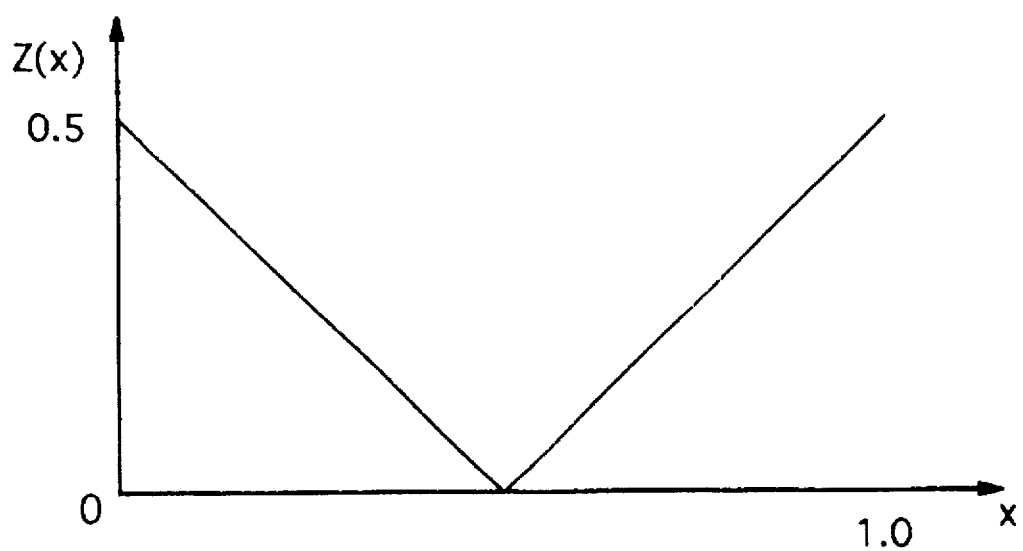

In an ensuing Step 266, the function Zd ($0 \leq x \leq 1$, and $0 \leq Z(x) \leq 0.5$) is determined in accordance with the following formula by using the chevron-shaped mapping function such as the one shown in FIG. 31A or 31B or the trough-shaped function such as the one shown in FIG. 32A or 32B:

$$Zd=Z(d')$$

After the function Zd is thus determined, in Step 268, a new design variable $r_i'$ is determined in accordance with the following formula:

$$r_i' = r_i - \frac{\min(|r_i - B_L|, |r_i - B_U|)}{0.5} \cdot Zd$$

$$r_i' = r_i + \frac{\min(|r_i - B_L|, |r_i - B_U|)}{0.5} \cdot Zd$$

After the design variable $r_i'$ is thus determined, a design variable vector Vr', i.e., a list of new design variables which is determined in Step 270, becomes as follows:

$$Vr'=(r_1, r_2, \ldots, r_i', r_{i+1}, \ldots, r_{n-1})$$

With respect to the two tire models newly Generated in the above-described manner, the value of the objective function and the value of the constraint are calculated in Step 222 in FIG. 29B. In an ensuing Step 224, an fitness function is calculated from the resultant values of the objective function and the constraint by using Formula (4) in the same way as in the preceding embodiments.

In an ensuing Step 226, the aforementioned two tire models are preserved. In an ensuing Step 228, a determination is made as to whether or not the number of tire models preserved in Step 226 has reached N, and if it has not reached N, Steps 208 through 228 are executed repeatedly until it reaches N. Meanwhile, if the number of tire models has reached N, a determination is made with respect to convergence in Step 230. If a convergence has not been attained, the N tire models are updated to the tire models preserved in Step 226, and Steps 208 through 230 are executed repeatedly. Meanwhile, if it is determined in Step 230 that a convergence has been attained, the values of the design variables of a tire model which give a maximum value of the objective function while substantially satisfying the constraint among the N tire models are set as values of the design variables which maximize the objective function while substantially satisfying the constraint. In Step 232, the configuration of the tire is determined by using the values of these design variables.

It should be noted that, as for the determination with respect to convergence in Step 230, it is assumed that a convergence has been attained if any one of the following conditions is met:

1) The number of Generations has reached M.
2) The number of line rows in which the value of the objective function is the largest has accounted for q% of the total.
3) The maximum value of the objective function is not updated in subsequent p generations.

It should be noted that M, q, and P are inputted in advance by the user.

In addition, the above-described embodiment may be applied to the design variables in the second, third, fourth, fifth, sixth, seventh, eighth, and ninth embodiments.

Tires were actually trial-manufactured in accordance with the above-described 10th embodiment and were tested, and the results of the test are shown in Table 5 below.

TABLE 5

|  | Conventional Tire | 10th Embodiment |
| --- | --- | --- |
| Time required for design and development | 100 | 53 |
| Performance  Steering stability | 100 | 108 |
|  Riding comfort | 100 | 99 |

Tire size: 205/60HR15

Internal pressure: 2.0 kg/cm²

Testing method: feeling evaluation by an actual-vehicle running test

Thus, in the 10th embodiment, since the amount of calculation increases as compared to the first embodiment shown in Table 1, the time required for design and development increases slightly. However, there is an advantage in that tires of a better performance can be designed.

Next, a description will be given of an 11th embodiment of the present invention. In this embodiment, the present invention is applied to the belt structure, and is aimed at optimizing mutually incompatible performances. In this embodiment, a belt structure for improving the steering stability without impairing the riding comfort of the occupant in the vehicle is determined.

Although the procedure of this embodiment is substantially similar to that of the program processing routine of the 10th embodiment, the selection of the objective function, the constraint, and the design variables, as well as the method of crossover and the method of mutation differ. In this embodiment, lateral stiffness, i.e., a physical amount for improving the steering stability, are used as the objective function. A condition that a vertical spring constant, i.e., a physical amount for governing the riding comfort, is fixed is used as the constraint. A belt structure is determined such that the lateral stiffness become maximum under the condition of the vertical spring constants being fixed.

Figure 34A:
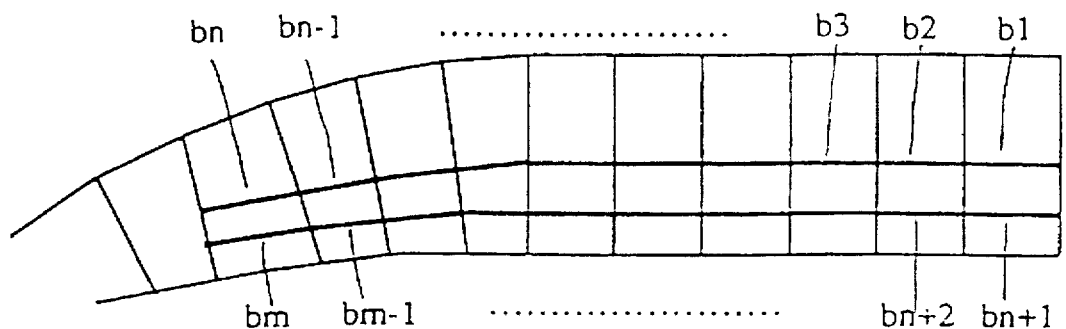

In addition, when a basic model of the tire such as the one shown in FIG. 34A is fabricated, places $b_1, b_2, \ldots, b_i, \ldots$ ..., $b_m$ where the belt is capable of being present are set as design variables. Further, it is assumed that if $b_i=1$, the belt is present at that place, and if $b_i=0$, the belt is not present at that place.

Figure 34B:
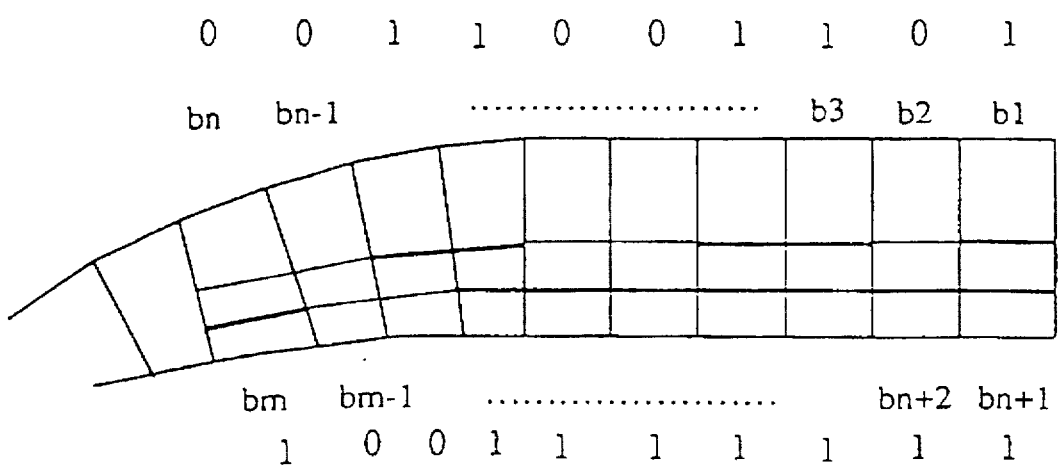

For instance, if the belt is present as indicated by bold lines in FIG. 34B, the design variables become 1011001100 in the order of $b_1, b_2, \ldots, b_n$, and become 1111111001 in the order of $b_{n+1}, b_{n+2}, \ldots, b_m$.

Figure 35:
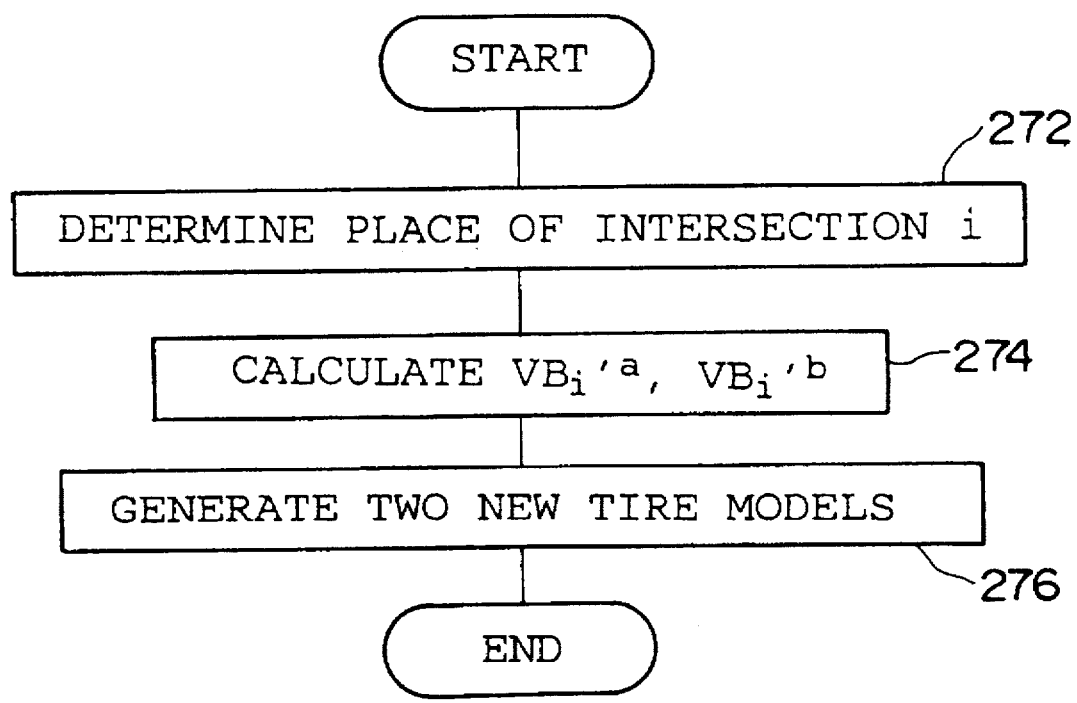
FIG. 35 is a flowchart illustrating an intersection processing routine.

Next, the crossover is carried out on the basis of the processing routine shown in FIG. 35. First, it is assumed that a-th and b-th tire models among the N tire models are to cross over each other. The lists of the design variables of the respective tire models are set as design variable vectors:

$$VB^a = (b_1^a, b_2^a, \ldots, b_i^a, b_{i+1}^a, \ldots, b_m^a)$$

$$VB^b = (b_1^b, b_2^b, \ldots, b_i^b, b_{i+1}^b, \ldots, b_m^b)$$

In Step 272, random numbers are generated, and the point of crossover i is determined in accordance with the random numbers generated. In an ensuing Step 274, the lists of design variables which are design variable vectors are altered as follows, to determine design variable vectors $VB^{a'}$ and $VB^{b'}$ as lists of new design variables.

$$VB^{a'} = (b_1^a, b_2^a, \ldots, b_{i-1}^a, b_i^b, b_{i+1}^b, \ldots, b_m^b)$$

$$VB^{b'} = (b_1^b, b_2^b, \ldots, b_{i-1}^b, b_i^a, b_{i+1}^a, \ldots, b_m^a)$$

In an ensuing Step 276, two new tire models are generated in accordance with the design variable vectors $VB^{a'}$ and $VB^{b'}$ obtained.

Although there is only one point of crossover i in this example, it is possible to alternatively use a multipoint crossover or uniform crossover such as those shown in "Genetic Algorithms" (edited by Hiroaki Kitano).

Figure 36:
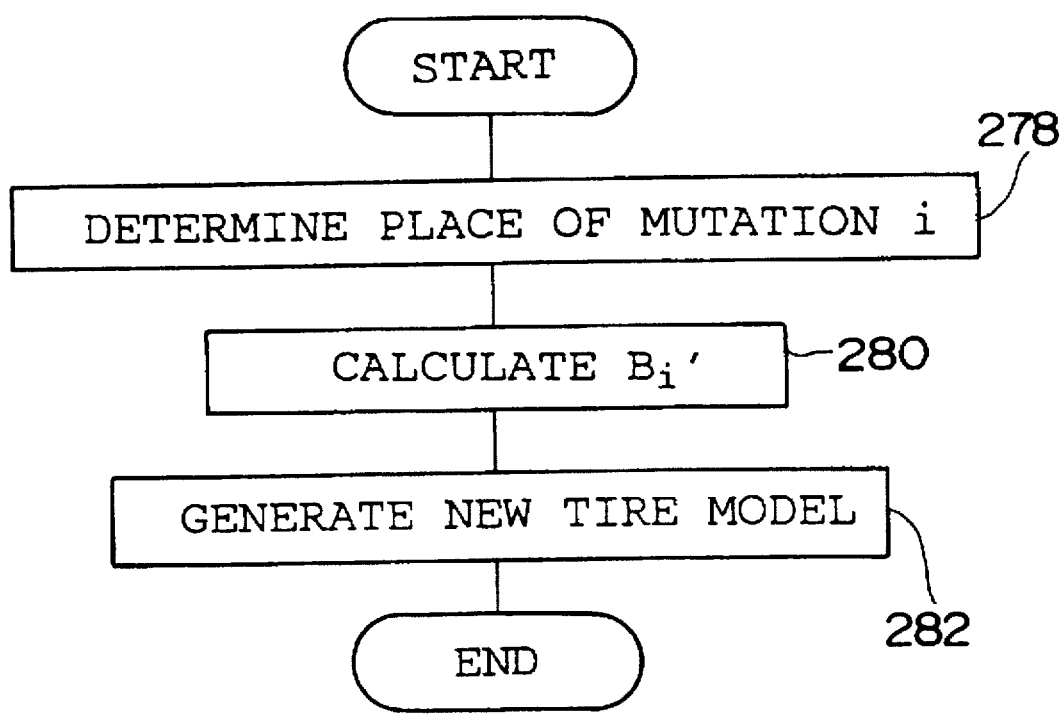
FIG. 36 is a flowchart illustrating a mutation processing routine.

Next, the mutation is carried out on the basis of the processing routine shown in FIG. 36. It is assumed that the list of design variables of the basic model of the tire are the design variable vectors:

$$VB = (b_1, b_2, \ldots, b_{i-1}, b_i, b_{i+1}, \ldots, b_m)$$

In Step 278, random numbers are Generated, and the place of mutation i is determined in accordance with the random numbers. In an ensuing Step 280, a design variable $b_i$ at the place of mutation i is changed as shown below, so as to generate a design variable vector VB' as a list of new design variables.

If $b_i=0$, then $b_i'=1$, and

If $b_i=1$, then $b_i'=0$.

$VB' = (b_1, b_2, \ldots, b_{i-1}, b_i', b_{i+1}, \ldots, b_m)$

In an ensuing Step 282, a new tire model is generated from the design variable vector VB' thus determined.

It should be noted that although, in the above-described embodiment, the belt structure is adopted as the design variable, other reinforcing material may be determined as the design variable. In addition, this embodiment is applicable to a case where a decision is made as to whether or not a reinforcing material is to be inserted in the bead portion.

Tires were actually trial-manufactured in accordance with the above-described 11th embodiment and were tested, and the results of the test are shown in Table 6 below.

TABLE 6

|  |  | Conventional Tire | 11th Embodiment |
|---|---|---|---|
| Time required for design and development |  | 100 | 65 |
| Performance | Steering stability | 100 | 105 |
|  | Riding comfort | 100 | 100 |

Tire size: 205/60HR15

Internal pressure: 2.0 kg/cm²

Testing method: feeling evaluation by an actual-vehicle running test

Thus, in the 11th embodiment, since a design variable which gives an optimum value of the objective function satisfying the constraint is determined, and the tire is designed from this design variable, there is an advantage in that tires in a best mode can be designed.

Figure 37:
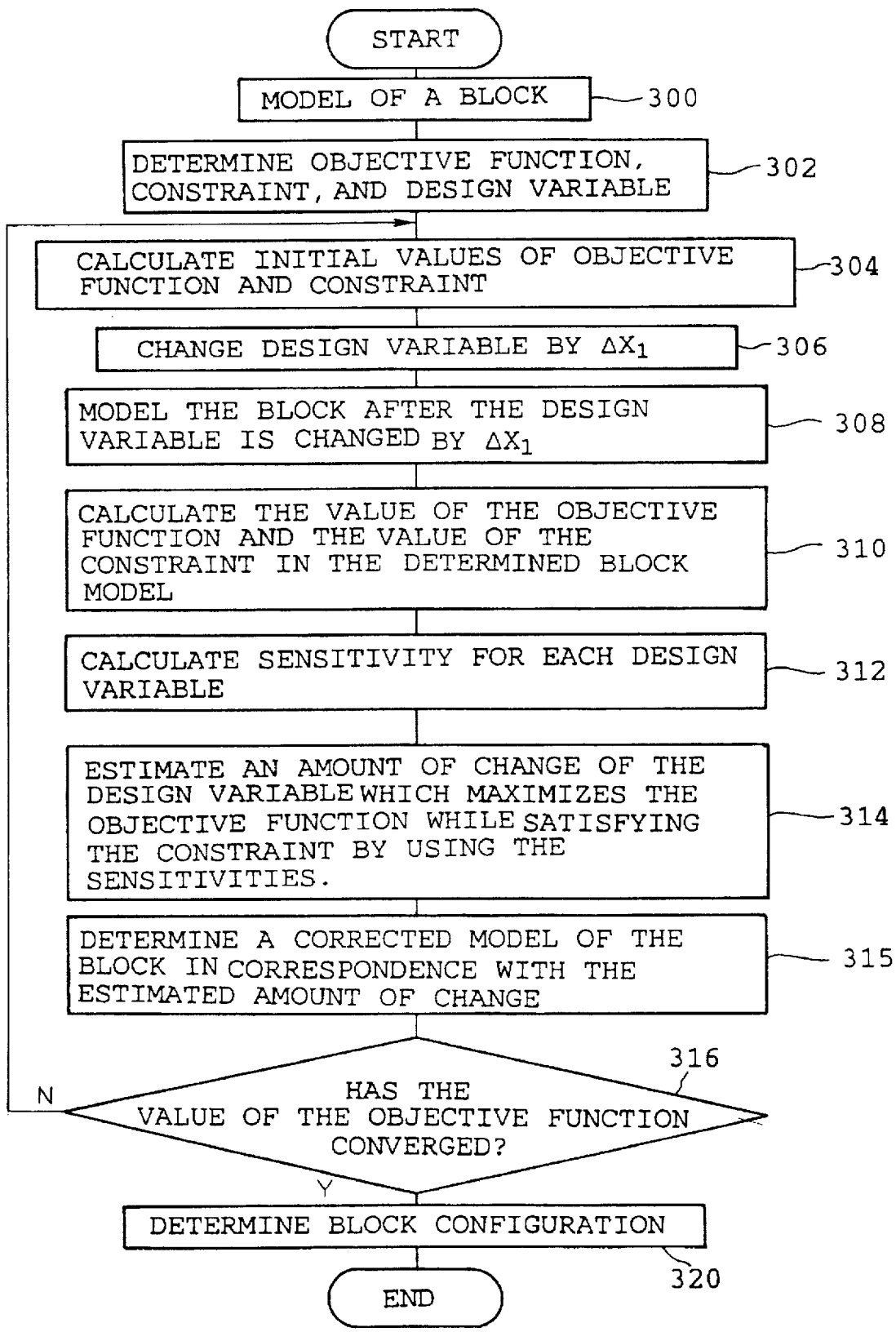
FIG. 37 is a flowchart illustrating a processing routine in accordance with a 12th embodiment of the present invention.
Figure 38A:
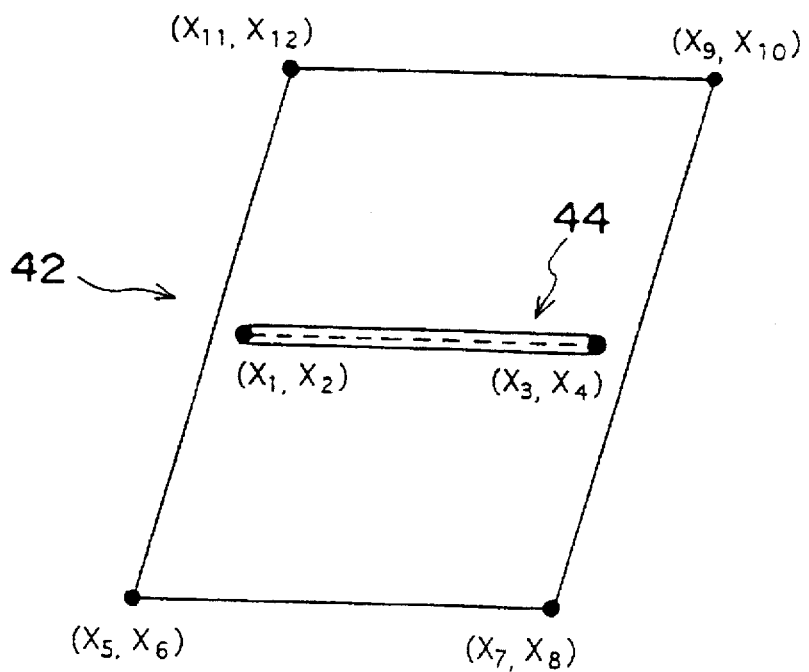
Figure 38B:
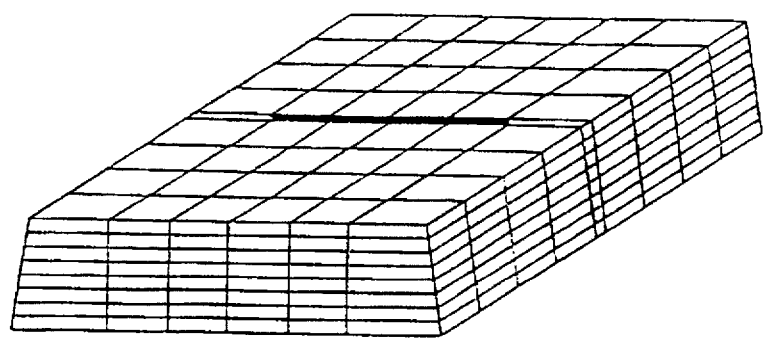

Next, a description will be given of an 12th embodiment of the present invention. In this embodiment, the present invention is applied to the determination of the configuration of blocks of the tire having blocks. This embodiment is aimed at reducing the difference in rigidity among blocks having different sizes and arranged in the circumferential direction of the tire, and at improving the irregular wear by a pattern which makes uniform the block rigidity in various directions in one block. FIG. 37 shows a program processing routine in accordance with this embodiment. In Step 300, as shown in FIG. 38A, the configuration of a block 42 is defined by the coordinates of nodes of the block 42, the coordinates of nodes of a sipe 44, the angle of a block groove, the depth of the groove, the number of sipes, the sipe width, the angle at which the sipe is embedded, and the sipe depth, and is subjected to modeling so as to allow analysis by the finite element method and the analytical method. FIG. 38B shows a modeling example of a finite element model.

In an ensuing Step 302, the following are determined: an objective function representing a physical amount for evaluating the performance of the block; a constraint for constraining the sipe length, the sipe length×the sipe depth, the number of sipes and the like; and design variables concerning the coordinates of the nodes of the block, the coordinates of the nodes of the sipe, the groove angle at each side of the block, the groove depth at each side of the block, the sipe width, the angle at which the sipe is embedded, and the sipe depth.

In this embodiment, the objective function, the constraint and the design variables are determined as follows so as to design a pattern in which the block rigidity in various directions in one block is made uniform:

Objective function OBJ: The block rigidity in various directions is made uniform.

Constraint G: The amount of change in the sipe length is within ±5% of the sipe length in an initial model.

The coordinates of the node of the sipe are within a figure enclosed by the coordinates of the nodes of the block.

The distance between the coordinates of a node of the sipe and a straight line representing an outer portion of the block is 2 mm or more.

Design variable: Coordinates of the nodes of the sipe (coordinates of the nodes of the block are fixed)

In an ensuing Step 304, an initial value $OBJ_0$ of the objective function OBJ at an initial value $X_0$ of a design variable Xi and an initial value $G_0$ of the constraint G are calculated. In an ensuing Step 306, the design variable $X_i$ is changed by $\Delta X_i$ each so as to change the basic model of the block. In Step 308, a block which includes changes in the design variable carried out in Step 306 is subjected to modeling.

In Step 310, with respect to the corrected model of the block determined in Step 308, the value $OBJ_i$ of the objective function and the value Gi of the constraint after the design variable is changed by $\Delta X_i$ are calculated. In Step 312, a sensitivity $dOBJ/dX_i$ of the objective function, which is a ratio of an amount of change of the objective function to an amount of unit change of the design variable, as well as a sensitivity $dG/dX_i$ of the constraint, which is a ratio of an amount of change of the constraint to an amount of unit change of the design variable, are calculated for each design variable in accordance with the following formulae:

$$\frac{dOBJ}{dr_i} = \frac{OBJ_i - OBJ_0}{\Delta X_i}$$

$$\frac{dG}{dr_i} = \frac{G_i - G_0}{dX_i}$$

By means of these sensitivities, it is possible to estimate to what extent the value of the objective function and the value of the constraint change when the design variable is changed by $\Delta X_i$. It should be noted that these sensitivities are sometimes determined analytically depending on the technique used in modeling the block and the nature of the design variable, in which case the calculation of Step 312 becomes unnecessary.

In an ensuing Step 314, an amount of change of the design variable which maximizes the objective function while satisfying the constraint is estimated by means of mathematical programing by using the initial value $OBJ_0$ of the objective function, the initial value $G_0$ of the constraint, the initial value $X_0$ of the design variable, and the sensitivities. In Step 315, by using this estimated value of the design variable, a corrected model of the block is determined in a method similar to that of Step 308, and a value of the objective function is calculated. In Step 316, a determination is made as to whether or not the value of the objective function has converged by comparing a threshold value inputted in advance with the difference between the value OBJ of the objective function calculated in Step 315 and the initial value $OBJ_0$ of the objective function calculated in Step 304. If the value of the objective function has not converged, Steps 304 through 316 are executed repeatedly by setting as the initial value the value of the design variable determined in Step 314. If it is determined that the value of the objective function has converged, the value of the design variable at this juncture is set as the value of the design variable which maximizes the objective function while satisfying the constraint, and the shape of the block is determined in Step 320 by using this value of the design variable.

Tires were actually trial-manufactured in accordance with the above-described 12th embodiment and were tested, and the results of the test are shown in Table 7 below.

TABLE 7

|  | Conventional Tire | 12th Embodiment |
|---|---|---|
| Time required for design and development | 100 | 20 |
| Uniformity in block rigidity | 100 | 40 |
| H & T height | 100 | 80 |

Tire size: 205/60HR15
Internal pressure: 2.0 kg/cm$^2$
Testing method: 5000 km running on a test course It should be noted that the uniformity (BK) in block rigidity is obtained by actually measuring block rigidity Ki (i=1 to 6) for each 30° of the block and by using the following formula:

$$BK = \frac{\sqrt{\sum_{i=1}^{6}(Ki - \overline{K})^2}}{\overline{K}}$$

$$\overline{K} = \frac{1}{6}\sum_{i=1}^{6} Ki$$

Figure 41:
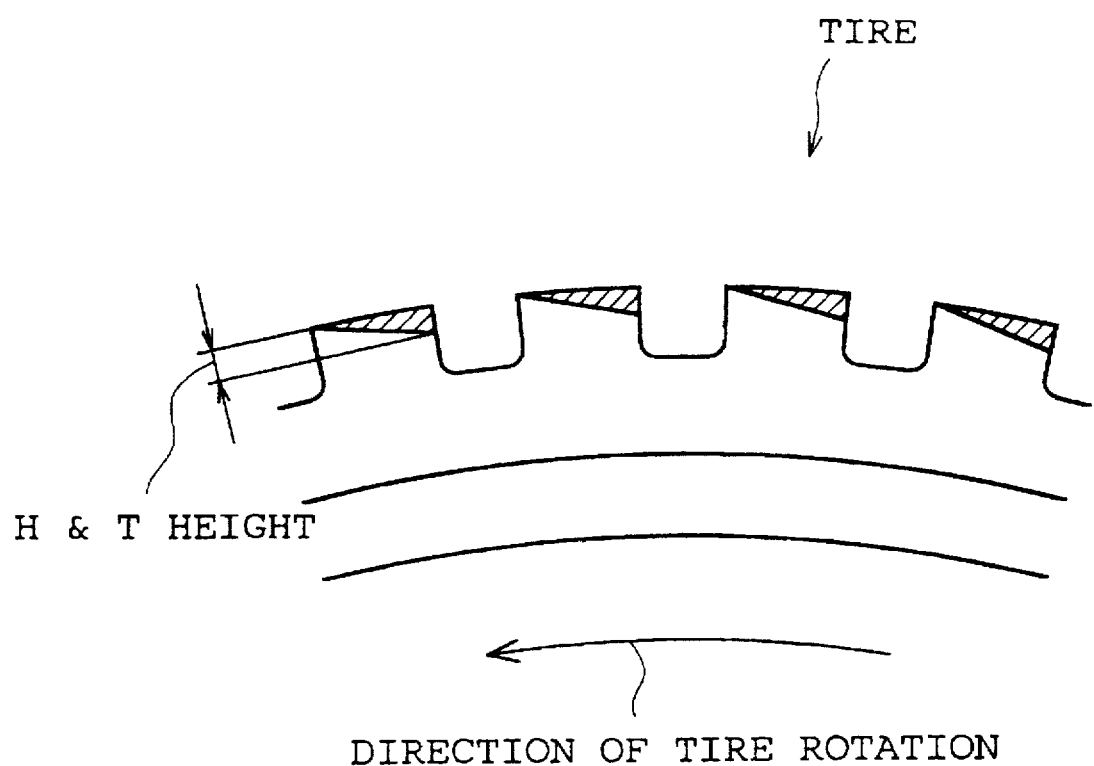
FIG. 41 is a diagram illustrating heel-and-toe wear.

The H & T height (heel-and-toe height) is a phenomenon in which the blocks connected in the circumferential direction of the tire are worn in the form of saw tooth in the circumferential direction. This H & T height is shown in FIG. 41.

Next, a description will be given of a 13th embodiment. This embodiment is a combination of the first and 10th embodiments. It should be noted that since the arrangement of this embodiment is substantially similar to those of the aforementioned embodiments, identical portions will be denoted by the same reference numerals, and a detailed description will be omitted.

In the 10th embodiment, in Step 118, the objective function and the constraint are calculated on the basis of a draft design obtained through a crossover and/or a mutation. In this case, this may not lapse into a local optimal solution as described in Goldberg, D. E., "Genetic Algorithms in Search, Optimization and Machine Learning," Addison-Wesley (1989), and yet there is a problem in that it is difficult to obtain a true optimal solution. Accordingly, as the arithmetic processing in Step 222 in the 10th embodiment, if the methods of the first embodiment and the 10th embodiment are combined by using the processing in Steps 104 to 116 in the first embodiment, the aforementioned problem can be overcome.

Figure 39A:
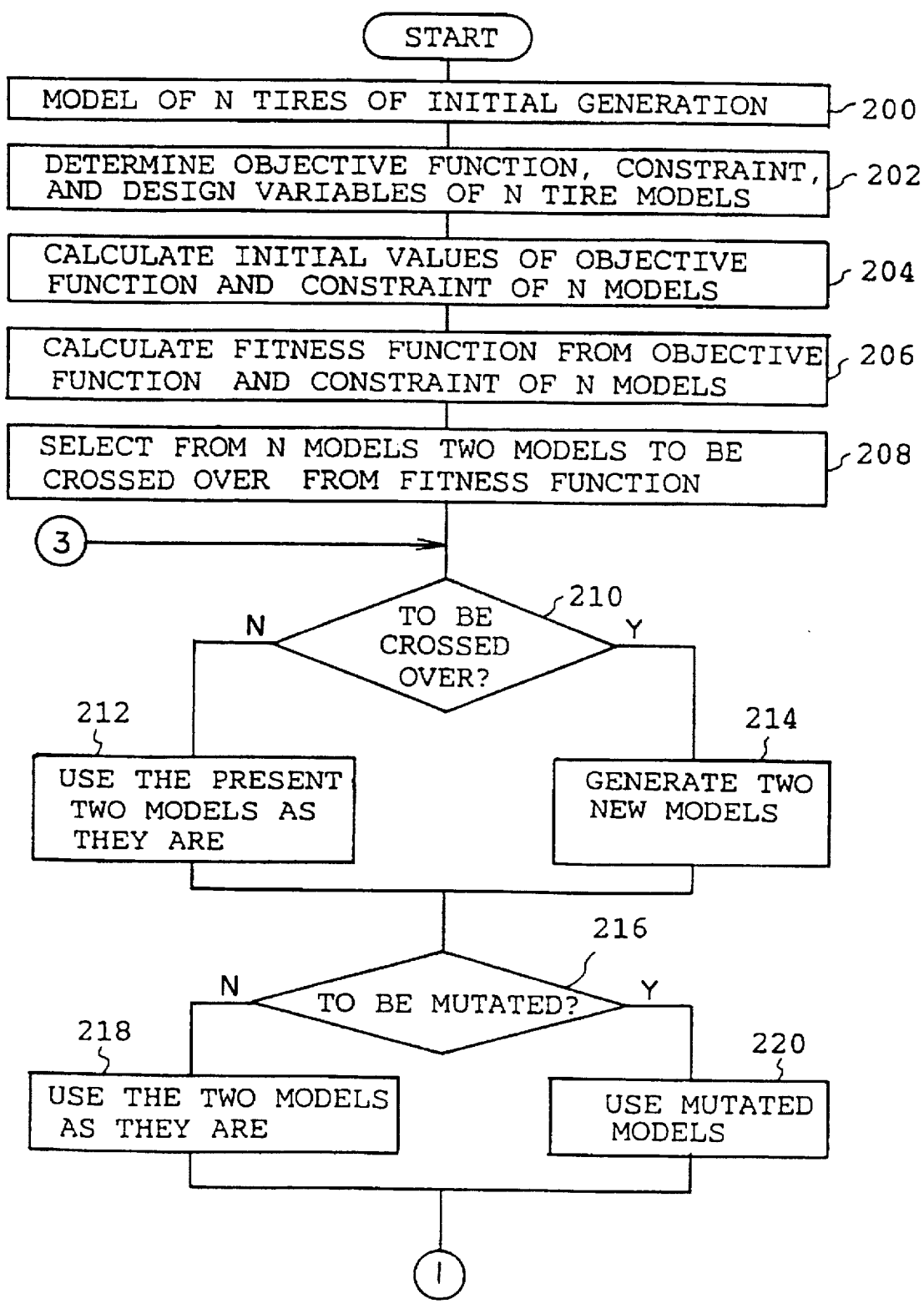
FIGS. 39A–39C are flowcharts illustrating a processing routine in accordance with a 13th embodiment of the present invention.
Figure 39B:
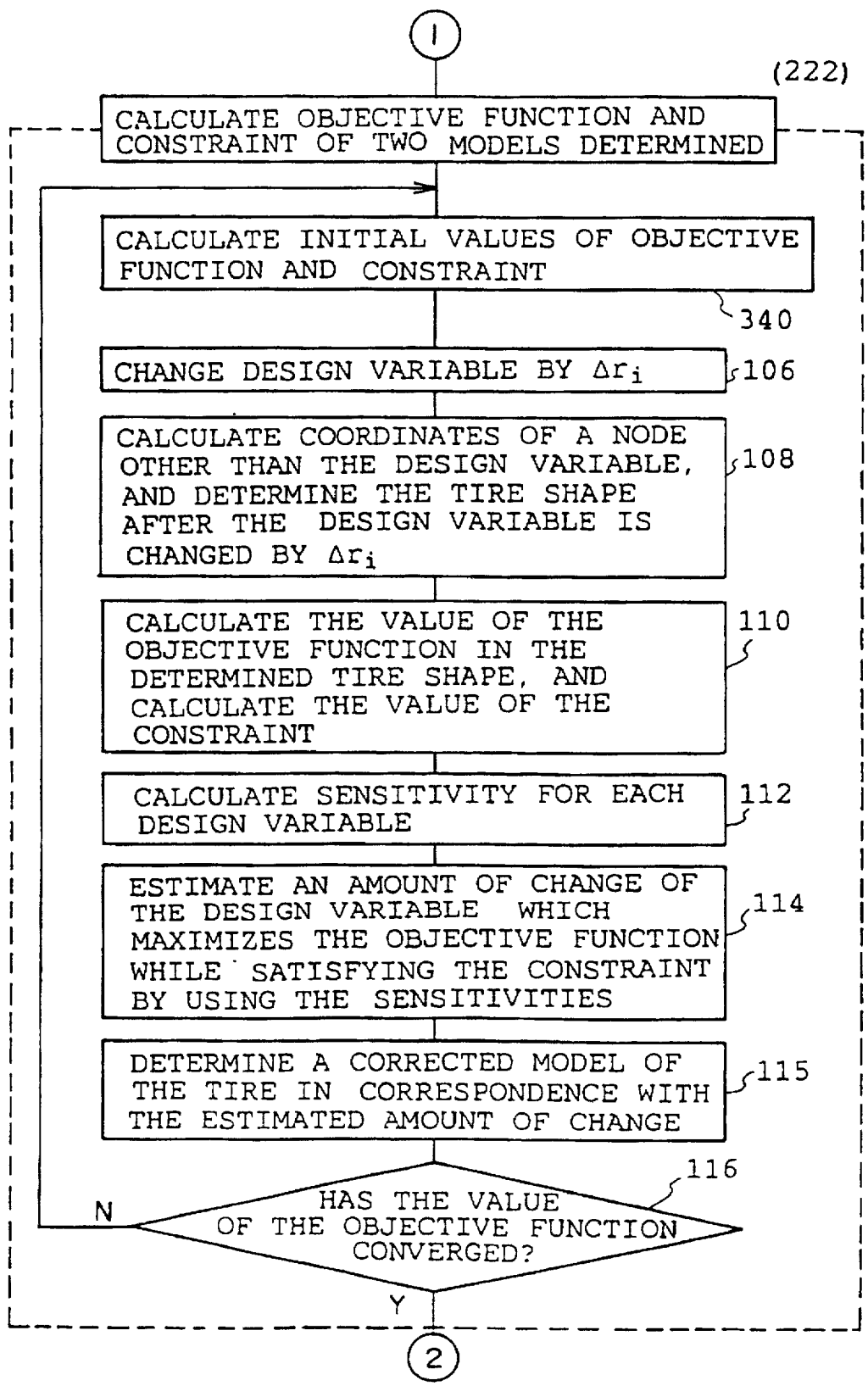
Figure 39C:
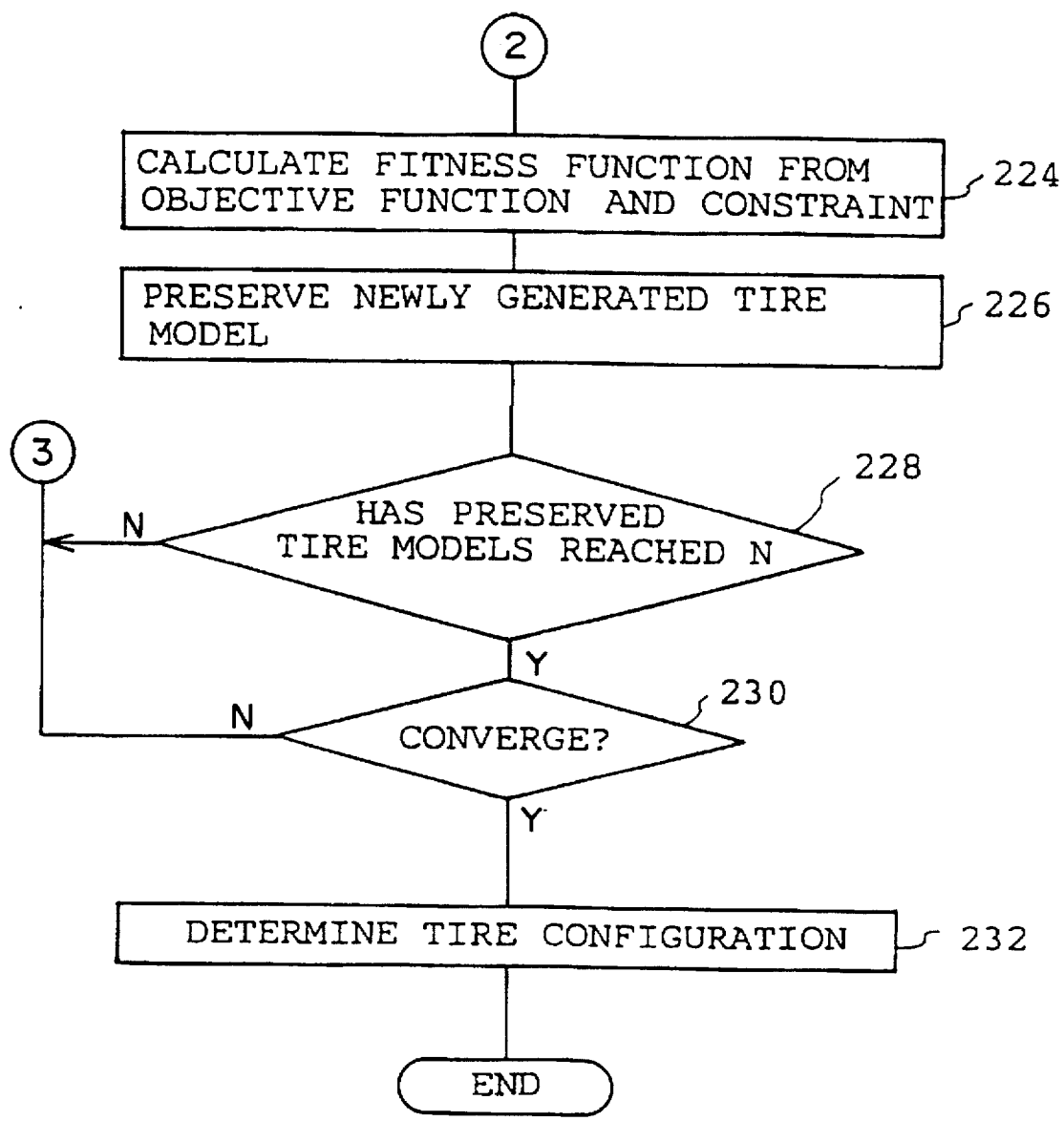

FIGS. 39A–39C show a program processing routine in accordance with this embodiment. Since Steps 200 to 220 are identical to those of the 10th embodiment, a description will be omitted.

In Step 340, the objective function and the constraint are calculated by using as an initial draft design the two draft design obtained as described above. The subsequent Steps 106 to 116 are executed repeated until the value of the objective function converges in the same way as in the processing of the first embodiment. If it is determined that the value of the objective function has converged, in an ensuing Step 224, an fitness function is calculated from the resultant values of the objective function and the constraint. Then in an ensuing Step 226, the aforementioned two tire models are preserved. Steps 208 through 228 are executed repeatedly until the number of tire models preserved in Step 226 reaches N. If it has reached N, a determination is made with respect to convergence in Step 230 in the same way as described above. If a convergence has been attained, the values of the design variables of a tire model which give a maximum value of the objective function while substantially satisfying the constraint among the N tire models are set as values of the design variables which maximize the objective function while substantially satisfying the constraint. In Step 232, the configuration of the tire is determined by using the values of these design variables.

Ad the method for obtaining a true optimal solution without lapsing into a local optimal solution, apart from the technique described herein, it is possible to combine the method of the 10th embodiment with a method called simulated annealing which is described in the aforementioned reference.

Next, a description will be given of a 14th embodiment. In this embodiment, the process leading to an optimal tire configuration is processed speedily. It should be noted that since the arrangement of this embodiment is substantially similar to those of the aforementioned embodiments, identical portions will be denoted by the same reference numerals, and a detailed description will be omitted.

Figure 40A:
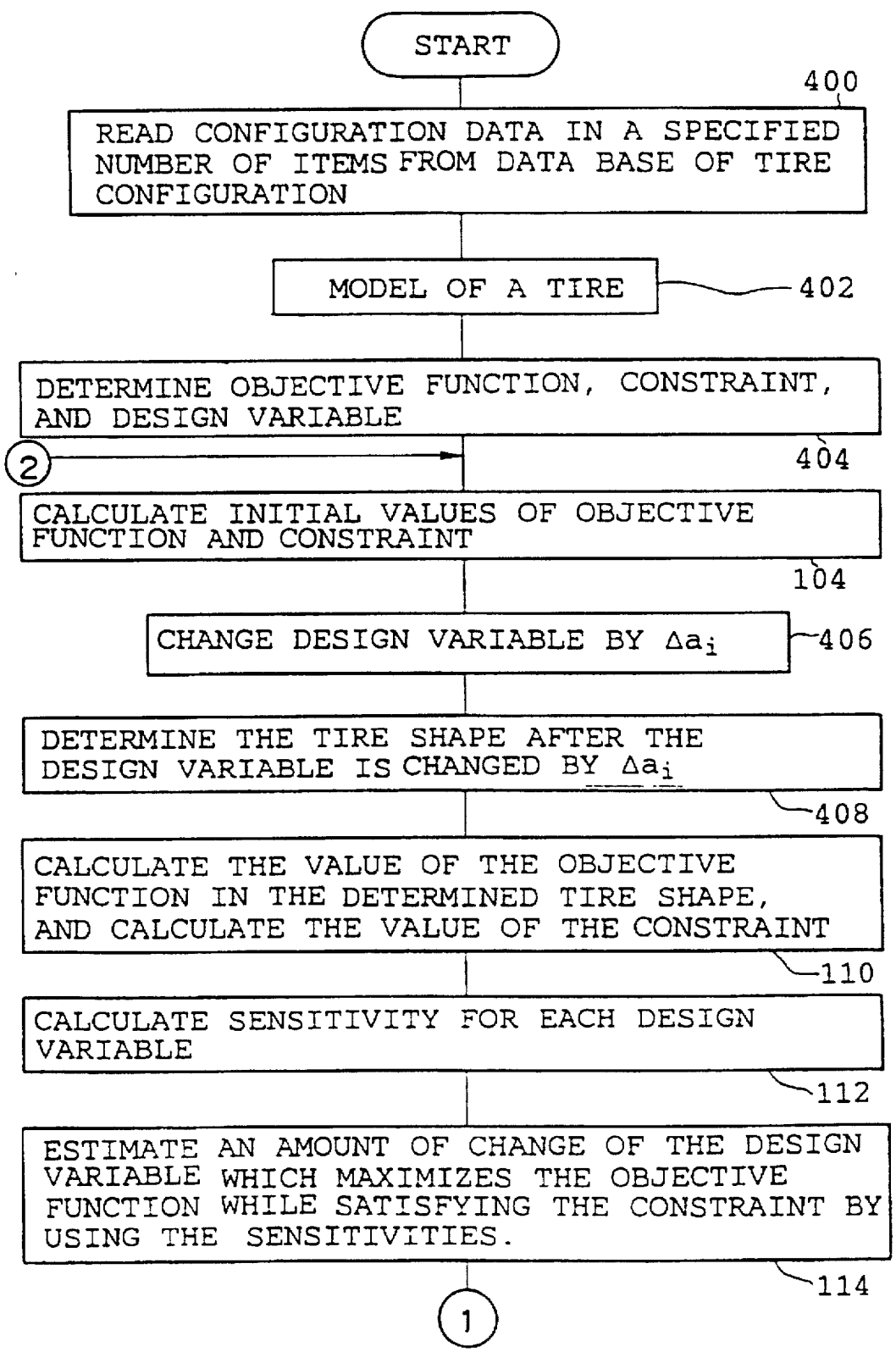
FIGS. 40A and 40B flowcharts illustrating a processing routine in accordance with a 14th embodiment of the present invention.
Figure 40B:
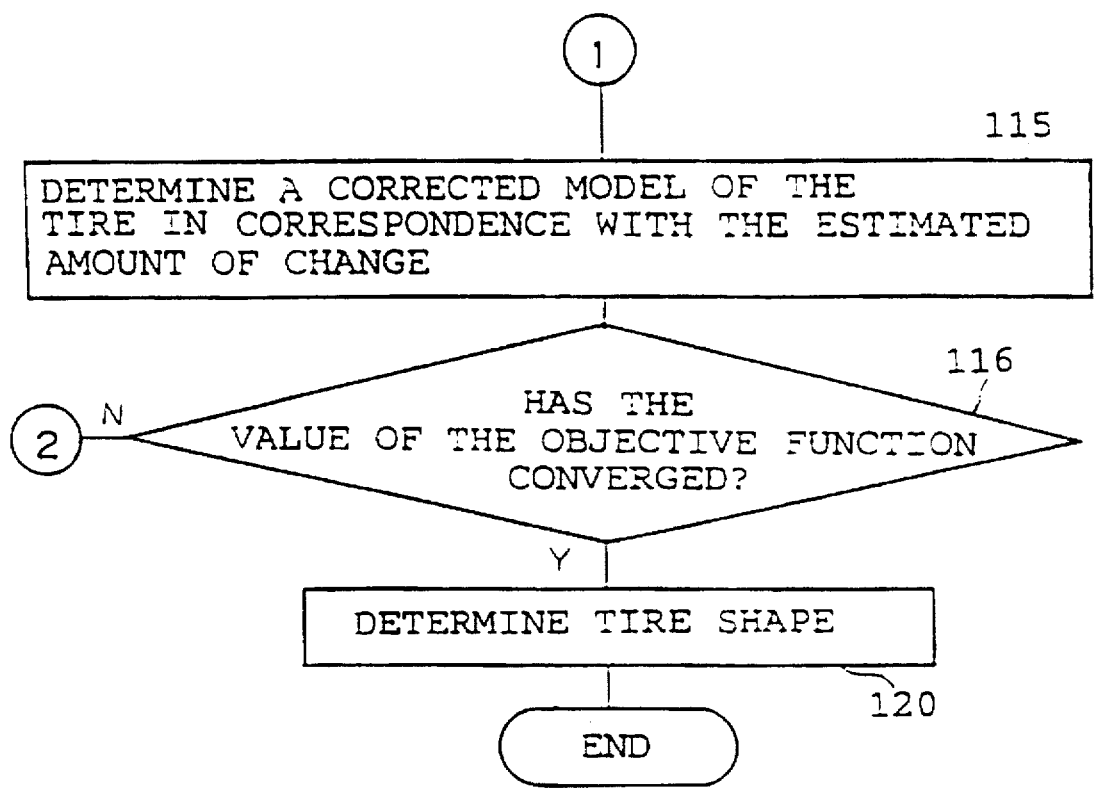

FIGS. 40A and 40B show a program processing routine in accordance with this embodiment. In Step 400, configuration data in a predetermined number M specified in advance are read from the data base concerning tire configurations. In the tire-configuration data base, the carcass line of the tire is represented by the Lagrange interpolation in Formula (2), the method using circular arcs shown in FIG. 10, spline curves, Bezier curves, NURBS (non-uniform rational B-splines), or the like.

In an ensuing Step 402, a carcass line F(x) of the tire is represented by the following Formula (5):

$$F(x) = \sum_{i=1}^{M} a_i f_i(x) \quad (5)$$

where $a_i$ (i=1 to M) is a constant, and $f_i(x)$ is read from the tire-configuration data base.

Next, as shown in FIG. 4, a plurality of normal lines $NL_1$, $NL_2$, $NL_3$, ... are drawn with respect to the carcass line, and nodes are distributed on these lines by taking into consideration the thickness corresponding to the tire member. Then, the cross-sectional configuration of the tire is divided into a plurality of elements by making use of the nodes.

In an ensuing Step 404, an objective function representing a physical amount for evaluating tire performance, a constraint for constraining the cross-sectional shape of the tire, and a design variable determining the cross-sectional shape of the tire are determined.

In addition, the configuration of the carcass line which is the design variable is determined by the constant $a_i$ of Formula (5). In an ensuing Step 406, the design variable $a_i$ is changed by $\Delta a_i$ each to change the basic model of the tire. In an ensuing Step 408, the carcass line of the tire after the design variable $a_i$ is changed by $\Delta a_i$ is obtained from Formula (5), and a corrected model of the tire is determined in accordance with the procedure of Step 402. Step 110 and and subsequent steps are similar to those described above, a description thereof will be omitted.

If the tires are designed in accordance with the above-described 14th embodiment, it is possible to optimize the configuration by combining the configuration data base of actual tires and the configuration inputted newly by the designer. Hence, it is possible to obtain an optimal solution with less calculating time as compared with the first embodiment. However, since optimal solutions are dependent on the configuration data base which is read initially, there is a tendency that the advantage is slightly lessened in comparison with the first embodiment. Table 8 below shows the results of trial manufacture and test of tires designed with the procedure of the 14th embodiment on the basis of the same objective function and constraint as those of the first embodiment.

TABLE 8

|  |  | Conventional Tire | 1st Embodiment | 3rd Embodiment |
|---|---|---|---|---|
| Time required for design and development | | 100 | 100 | 30 |
| Performance | Steering stability | 100 | 106 | 105 |
|  | Riding comfort | 100 | 98 | 98 |

Tire size: 205/60HR15

Internal pressure: 2.0 kg/cm$^2$

Testing method: feeling evaluation by an actual-vehicle running test

We claim:

1. A computer implemented method of designing a pneumatic tire, comprising the steps of:
   (a) defining a basic model of a tire representing a cross-sectional shape of the tire including an internal structure, an objective function representing a physical amount for evaluating tire performance, a design variable for determining at least one of the cross-sectional shape of the tire and a tire structure, and a constraint other than the design variable for constraining at least one of the cross-sectional shape of the tire, the tire structure, the physical amount for evaluating tire performance, and a tire size;
   (b) varying a value of the design variable while taking the constraint into consideration and carrying out an optimization computation until an optimum value of the objective function is obtained; and
   (c) designing the tire on the basis of the design variable which gives the optimum value of the objective function.

2. A method of designing a pneumatic tire according to claim 1, wherein step (b) comprises: estimating an amount of change of the design variable which gives the optimum value of the objective function while taking the constraint into consideration on the basis of a sensitivity of the objective function, which is a ratio of an amount of change of the objective function to an amount of unit change of the design variable, and a sensitivity of the constraint, which is a ratio of an amount of change of the constraint to an amount of unit change of the design variable; calculating a value of the objective function when the design variable is changed by an amount corresponding to the estimated amount and a value of the constraint when the design variable is changed by the amount corresponding to the estimated amount; and determining the value of the design variable which gives the optimum value of the objective function on the basis of the estimated value and the calculated values while taking the constraint into consideration.

3. A method of designing a pneumatic tire according to claim 1, wherein step (a) comprises: determining a group subject to selection, consisting of a plurality of basic models of the tire each representing a cross-sectional shape of the tire including an internal structure thereof; and determining, with respect to the basic models of the tire of the group subject to selection, the objective function representing the physical amount for evaluating tire performance, the design variable for determining the cross-sectional shape of the tire or the tire structure, the constraint for constraining at least one of the cross-sectional shape of the tire, the tire structure, the physical amount for evaluating performance, and the tire size, and an fitness function which can be evaluated from the objective function and the constraint; and step (b) comprises: selecting two basic models of the tire from the group subject to selection on the basis of the fitness function; effecting at least one of generating a new basic model of the tire by allowing design variables of the basic models of the tire to cross over each other at a predetermined probability and of generating a new basic model of the tire by changing a portion of the design variable of at least one of the basic models of the tire; determining the objective function, the constraint, and the fitness function of the basic model of the tire with the design variable changed; preserving said basic model of the, tire and the basic model of the tire with the design variable not changed, an aforementioned process of step (b) being repeated until the basic models of the tire preserved reaches a predetermined number; determining whether a new group consisting of the predetermined number of the preserved basic models of the tire satisfies a predetermined convergence criterion; if the convergence criterion is not satisfied, repeating a foregoing process of step (b) until the group subject to selection satisfies a predetermined convergence criterion by setting the new group as the group subject to selection; and if the predetermined convergence criterion is satisfied, determining the value of the design variable which gives the optimum value of the objective function among the predetermined number of the preserved basic models of the tire while taking the constraint into consideration.

4. A method of designing a pneumatic tire according to claim 3, wherein, in step (b), with respect to the basic model of the tire with the design variable changed, the amount of change of the design variable which gives the optimum value of the objective function is estimated while taking the constraint into consideration on the basis of the sensitivity of the objective function, which is the ratio of the amount of change of the objective function to the amount of unit change of the design variable, and on the basis of the sensitivity of the constraint, which is the ratio of the amount of change of the constraint to the amount of unit change of the design variable, the value of the objective function when the design variable is changed by the amount corresponding to the estimated amount and the value of the constraint when the design variable is changed by the amount corresponding to the estimated amount are calculated, the fitness function is determined from the value of the objective function and the value of the constraint, said basic model of the tire and the basic model of the tire with the design variable not changed are preserved, and an aforementioned process of step (b) is repeated until the preserved basic models of the tire reaches the predetermined number.

5. A method of designing a pneumatic tire according to claim 1, wherein the design variable includes at least one of:
- a function representing the shape of at least one line selected from a carcass line, a turn-up ply line, a line representing an outer configuration of the tire, a line representing a tire crown portion, and a reinforcing-material line;
- a variable representing at least one gauge distribution of a tire rubber member selected from a gauge distribution of a bead filler, a Gauge distribution of a rubber chafer, a gauge distribution of side rubber, a gauge distribution of tread rubber, a Gauge distribution of tread base rubber, a gauge distribution of inner-surface reinforcing rubber, a gauge distribution of inter-belt rubber, and a gauge distribution of belt end rubber;
- a variable representing at least one structure of a belt portion selected from an angle of each belt layer, a width thereof, a cord type thereof, an a placing density thereof; and
- a variable representing at least one configuration of a pattern selected from a configuration of a block, a position of a sipe, a number of sipes, and a length of the sipe.

6. A method of designing a pneumatic tire according to claim 1, wherein a plurality of lines are set as the design variable by representing the shape of at least one line selected from a carcass line, a turn-up ply line, a line representing an outer configuration of the tire, a line representing a tire crown portion, and a reinforcing-material line, and wherein, in order to prevent the plurality of lines from intersecting with each other when the design variable is varied in step (b), a mapping function of a function representing shapes of the lines and a constraint for preventing the lines from intersecting with each other are determined, and the value of the design variable which gives the optimum value of the objective function while satisfying the constraint is determined by executing step (b) in a space mapped by the mapping function.

7. A method of designing a pneumatic tire according to claim 1, wherein the objective function comprises a sum total, in a widthwise direction of the tire, of components of belt tension acting in a circumferential direction of the tire.

8. A method of designing a pneumatic tire according to claim 1, wherein the constraint is that a periphery value of a carcass line is within a predetermined range which is set with the periphery value of the carcass line of a basic model of the tire as a reference.

9. A method of designing a pneumatic tire according to claim 1, wherein the objective function is a lateral stiffness for improving steering stability.

10. A method of designing a pneumatic tire according to claim 1, wherein the constraint is that a vertical first order natural frequency for governing riding comfort is fixed.

11. A method of designing a pneumatic tire according to claim 1, wherein, if a plurality of lines are set as design variables, in order to prevent the plurality of lines from intersecting with each other when the design variables are varied in step (b), mapping functions of functions representing the shapes of the lines and a constraint for preventing the lines from intersecting with each other are determined, and values of the design variables which give the optimum value of the objective function while satisfying the constraint are determined by executing step (b) in a space mapped by each of the mapping functions.

12. A computer implemented method of designing a pneumatic tire, comprising the steps of:
(a) setting a basic model of the tire representing a cross-sectional configuration of the tire including an internal structure;
(b) selecting an objective function among at least one of a plurality physical amounts for evaluating tire performance;
(c) determining a range of a design variable from at least one of a portion of the cross-sectional configuration of the tire and a tire structure, the range of the design variable providing for changes in an optimization computation;

(d) selecting a constraint other than the design variable for constraining at least one of the cross-sectional configuration of the tire, the tire structure, the at least one of a plurality of physical amount for evaluating tire performance and a tire size;

(e) varying the value of the design variable while taking the constraint into consideration and carrying out the optimization computation until an optimum value of the objective function is obtained; and (f) designing the tire based on the design variable that provides the optimum value of the objective function.

13. A computer implemented method of designing a pneumatic tire, comprising the steps of:

(a) setting a basic model of the tire representing a cross-sectional configuration of the tire including an internal structure;

(b) selecting an objective function among at least one of a plurality of physical amounts for evaluating tire performance;

(c) inputting a range of a design variable from at least one of a portion of the cross-sectional configuration of the tire and a tire structure, the range of the design variable providing for changes in an optimization computation;

(d) selecting a constraint other than the design variable for constraining at least one of the cross-sectional configuration of the tire, the tire structure, the at least one of a plurality of physical amounts for evaluating tire performance and a tire size;

(e) varying the value of the design variable while taking the constraint into consideration and carrying out the optimization computation until an optimum value of the objective function is obtained; and (f) designing the tire based on the design variable that provides the optimum value of the objective function.

* * * * *